(12) United States Patent
Ooishi

(10) Patent No.: US 6,333,878 B2
(45) Date of Patent: Dec. 25, 2001

(54) SEMICONDUCTOR MEMORY DEVICE HAVING PROGRAM CIRCUIT

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/765,427

(22) Filed: Jan. 22, 2001

Related U.S. Application Data

(62) Division of application No. 09/376,060, filed on Aug. 17, 1999, now Pat. No. 6,205,064.

(30) Foreign Application Priority Data

Mar. 12, 1999 (JP) ................................................... 11-066893

(51) Int. Cl.[7] ....................................................... G11C 7/00
(52) U.S. Cl. .......................................... 365/200; 365/225.7
(58) Field of Search ................................. 365/200, 225.7, 365/189.05

(56) References Cited

U.S. PATENT DOCUMENTS

| 5,206,583 | * | 4/1993 | Dawson et al. ....................... 365/158 |
| 5,631,862 | | 5/1997 | Cutter et al. . |
| 5,708,612 | | 1/1998 | Abe . |
| 5,732,031 | * | 3/1998 | Morgan ............................... 365/200 |
| 5,748,543 | | 5/1998 | Lee et al. . |
| 5,841,961 | | 11/1998 | Kozaru et al. . |
| 5,848,003 | | 12/1998 | Nishikawa . |
| 6,104,648 | | 8/2000 | Ooishi . |

* cited by examiner

Primary Examiner—Vu A. Le
(74) Attorney, Agent, or Firm—McDermott, Will & Emery

(57) ABSTRACT

A memory core part includes a program part and a voltage supply part. The program part includes a program structure part, a latch part and an address compare part. The program structure part includes an electric fuse blown with a program voltage. The voltage supply part supplies the program voltage to the program part every repair address. The latch part holds the program state in the program structure part on the basis of a transfer signal. The address compare part outputs a spare determination result on the basis of an input address and the latched program state.

13 Claims, 46 Drawing Sheets

SEMICONDUCTOR MEMORY DEVICE HAVING PROGRAM CIRCUIT

This application is a Divisional of application Ser. No. 09/376,060 filed Aug. 17, 1999 now U.S. Pat. No. 6,205,064.

BACKGROUND OF THE INVENTION

1. Field of the Invention

The present invention relates to a semiconductor memory device, and more particularly, it relates to a semiconductor memory device including a spare memory cell repairing a faulty memory cell.

2. Description of the Prior Art

In general, there is a semiconductor memory device having a spare memory cell for repairing a faulty memory cell (hereinafter the term "spare" stands for "redundancy"). Such a conventional semiconductor memory device requires an internal circuit having a programming element for previously programming a faulty address (repair address) indicating a faulty memory cell position. This internal circuit detects that the programmed repair address is input in actual use, thereby using the spare memory cell in place of the faulty memory cell.

The conventional internal circuit uses a fuse blown with a laser beam as the programming element. The fuse serving as the programming element is laser-blown in accordance with the repair address, thereby programming the repair address.

However, a high-priced laser cutter is required for laser blowing with a heavy process burden for the laser blowing, while the blowing accuracy is dispersed. Further, the employment of the laser beam restricts the arrangement of components and wires. When employing the laser blowing, further, the program state may be fixed to restrict the repair efficiency.

SUMMARY OF THE INVENTION

Accordingly, an object of the present invention is to provide a semiconductor memory device which can efficiently perform repair employing a spare with no laser blowing.

According to an aspect of the present invention, a semiconductor memory device comprises a memory cell array including a plurality of memory cells arranged in the form of a matrix and a plurality of spare memory cells for repairing faulty memory cells, and a plurality of address program circuits. Each of the plurality of address program circuits can program a repair address for repairing the faulty memory cell by a program voltage. The semiconductor memory device further comprises a pad externally receiving the program voltage and a voltage supply circuit selectively supplying the program voltage to each of the plurality of address program circuits.

Preferably, the voltage supply circuit of the semiconductor memory device includes a plurality of supply switches provided in correspondence to the respective ones of the plurality of address program circuits, each of the plurality of supply switches supplies the program voltage to the corresponding address program circuit in response to a control signal, and each of the plurality of address program circuits includes a program structure circuit including an electric fuse blown by the program voltage and a comparator circuit comparing match/mismatch of an input address and the repair address on the basis of the input address and the program state of the electric fuse for determining whether or not to perform repair.

Accordingly, a principal advantage of the present invention resides in that the semiconductor memory device comprises the plurality of address program circuits capable of performing programming with the program voltage and the voltage supply circuit selectively supplying the program voltage thereto, for enabling reliable programming while suppressing influence on a peripheral circuit.

Particularly when applying the program voltage every repair program, programming can be efficiently performed while suppressing influence on the peripheral circuit. Programming can be performed by blowing the electric fuse, whereby working steps are simplified and no laser cutter or the like is required.

Particularly when comprising a latch holding the program state, program information can be held with a simple circuit structure.

In particular, the address program circuit programs an address signal and a bank address signal. When having a plurality of banks, therefore, the banks can share the address program circuit.

In particular, a mode for checking the program state is provided in a program mode. Thus, programming can be reliably performed.

In particular, a chip enable signal is input as a trigger for reading the program state. Thus, high-speed spare determination and high-speed repair are enabled.

In particular, the program state is dividedly read a plurality of times. Thus, the electric fuse can be prevented from application of unnecessary stress.

In particular, a failure detection circuit is provided for detecting a failure of the electric fuse. Thus, initial failure of the electric fuse or the program state can be confirmed.

In particular, a fixing circuit is provided for arbitrarily setting the program state held in the latch. Thus, the spare memory cell can be tested independently of the program state.

Particularly when comprising a comparator circuit comparing a reference current with a current flowing through the electric fuse, the program state can be detected in high accuracy.

Particularly by employing a transfer circuit, the number of wires between the program structure circuit and the latch holding the program state can be reduced.

In particular, the semiconductor memory device collectively sends spare information. Thus, the number of wires connecting the address program circuit and a redundancy control circuit can be reduced.

In particular, the address program circuits include that capable of programming a row direction repair address and that capable of programming a column direction repair address, and read timings for the program state vary with the row direction and the column direction. Thus, a high-speed repair operation can be performed while reducing current consumption.

In particular, the address program circuit performs spare determination in parallel with an address setup operation. Thus, a high-speed repair operation is enabled.

According to another aspect of the present invention, a semiconductor memory device comprises a memory cell array including a plurality of memory cells arranged in the form of a matrix and a spare memory cell for repairing a faulty memory cell, and a plurality of address program circuits. Each of the plurality of address program circuits includes an electric fuse and can program a repair address for repairing the faulty memory cell by blowing the electric fuse with a program voltage, each of the plurality of memory cells includes a memory cell transistor having a pair of source/drain regions formed in a first impurity region and a gate electrode formed on a channel region between the pair of source/drain regions with an insulator film therebetween and a memory cell capacitor electrically connected with one of the pair of source/drain regions, and the electric fuse includes a pair of third impurity regions formed in the second impurity region, having the same conductivity type as the second impurity region and corresponding to the pair of source/drain regions of the memory cell transistor and a programming element, electrically connected to one of the pair of third impurity regions, corresponding to the memory cell capacitor.

Accordingly, another advantage of the present invention resides in that the semiconductor memory device comprises the electric fuse having a memory cell structure and programmed by the program voltage, whereby the electric fuse can be readily formed between wires or the like.

In particular, portions corresponding to the memory cell capacitors are connected to form a decoupling capacitor. Thus, a programming element having a large capacity can be formed in a small area.

According to still another aspect of the present invention, a semiconductor memory device comprises a memory cell array including a plurality of memory cells arranged in the form of a matrix and a plurality of spare memory cell columns each for repairing a faulty memory cell column including a faulty memory cell, a plurality of pairs of data lines for transferring data of the memory cell array, a plurality of pairs of spare data lines for transferring data of the plurality of spare memory cell columns, a data bus for transferring data between an external device and the memory cell array and a plurality of address program circuits. Each of the plurality of address program circuits can program a repair column address for repairing the faulty memory cell column by a program voltage. The semiconductor memory device further comprises a switching circuit switching electrical connection between each of the plurality of pairs of data lines and the data bus so that a pair of data lines for transferring data of the faulty memory cell column are disconnected from the data bus in response to the program states of the plurality of address program circuits and a selection circuit selectively connecting each of the plurality of pairs of spare data lines to the data bus in response to the connection between the plurality of pairs of data lines and the data bus.

Accordingly, still another advantage of the present invention resides in that the semiconductor memory device switches the connection between the data lines and a global data line on the basis of spare determination for connecting the spare data lines to the data bus by the number of lost data lines, whereby repair in the spare direction can be efficiently performed.

In particular, the semiconductor memory device comprises the address program circuit capable of performing programming with the program voltage. Thus, programming for spare repair can be reliably performed while suppressing influence on a peripheral circuit.

In particular, the semiconductor memory device switches the data lines by turning on/off the electric fuse (transistor). Thus, also when the semiconductor memory device has a plurality of banks, connection of the data lines can be properly changed on the basis of spare determination.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A semiconductor memory device according to a first embodiment of the present invention is described with reference to FIGS. 1 to 3. In the following description, it is assumed that signals headed with "/" are those obtained by inverting signals not headed with "/".

Figure 1:
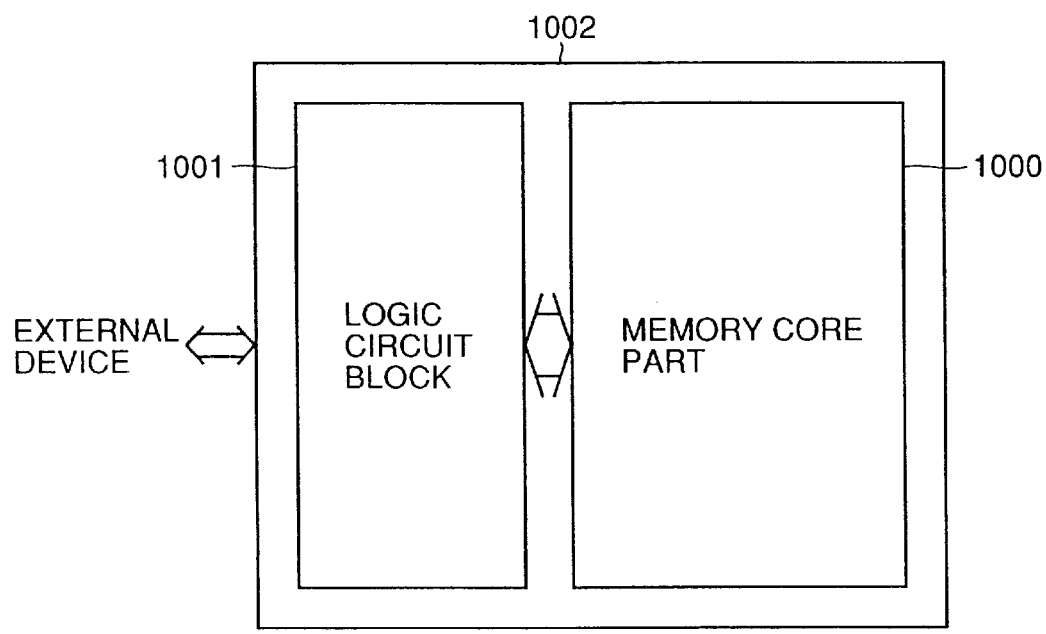
FIG. 1 is a diagram for illustrating a semiconductor memory device according to a first embodiment of the present invention.

Referring to FIG. 1, a memory core part 1000 and a logic circuit block 1001 are formed on a chip 1002. As described later, the memory core part 1000 sends/receives signals through the logic circuit block 1001 and nodes 2a to 2o.

Figure 2:
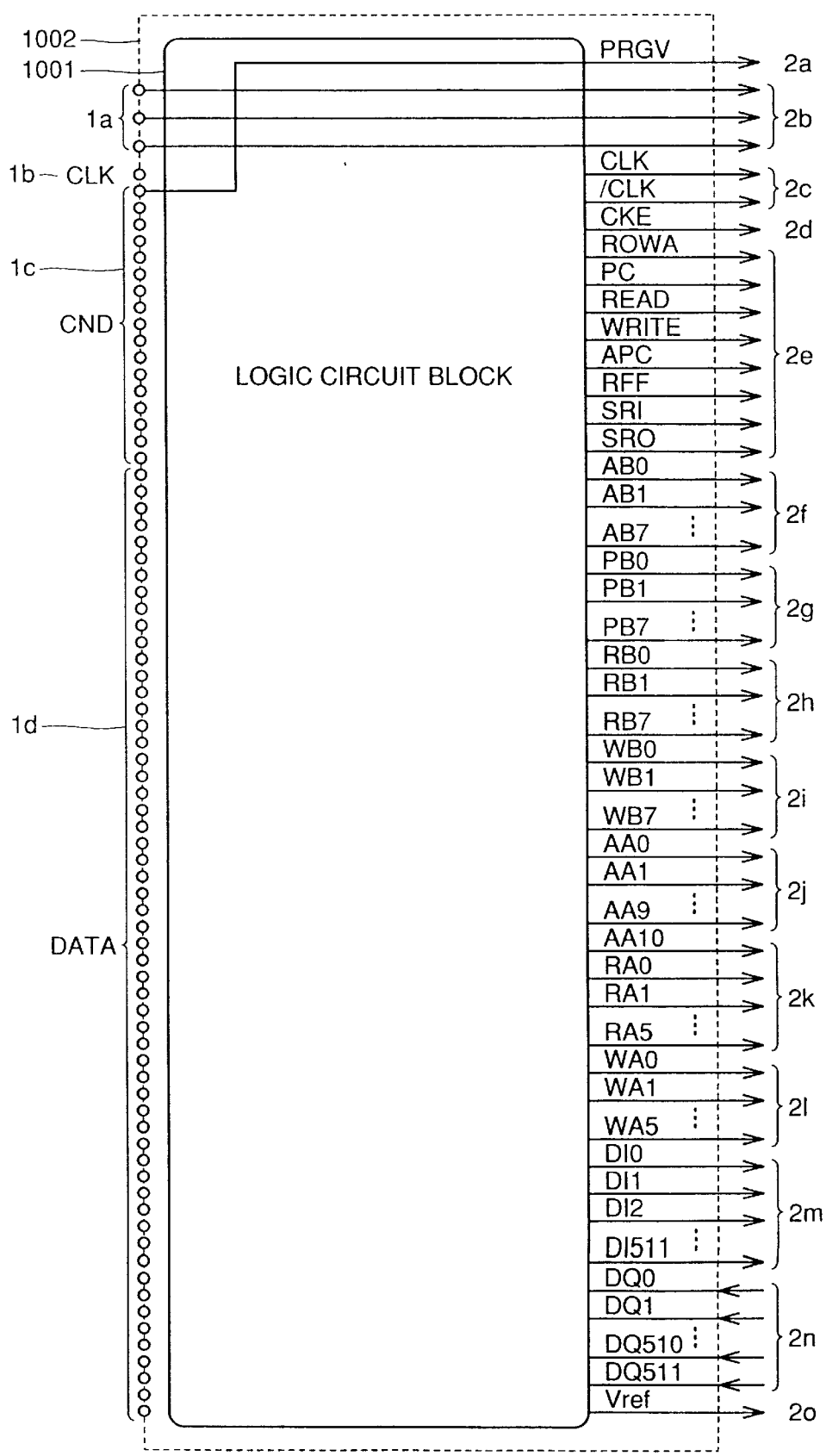
FIG. 2 is a diagram for illustrating the structure of a logic circuit block 1001 shown in FIG. 1.
Figure 3:
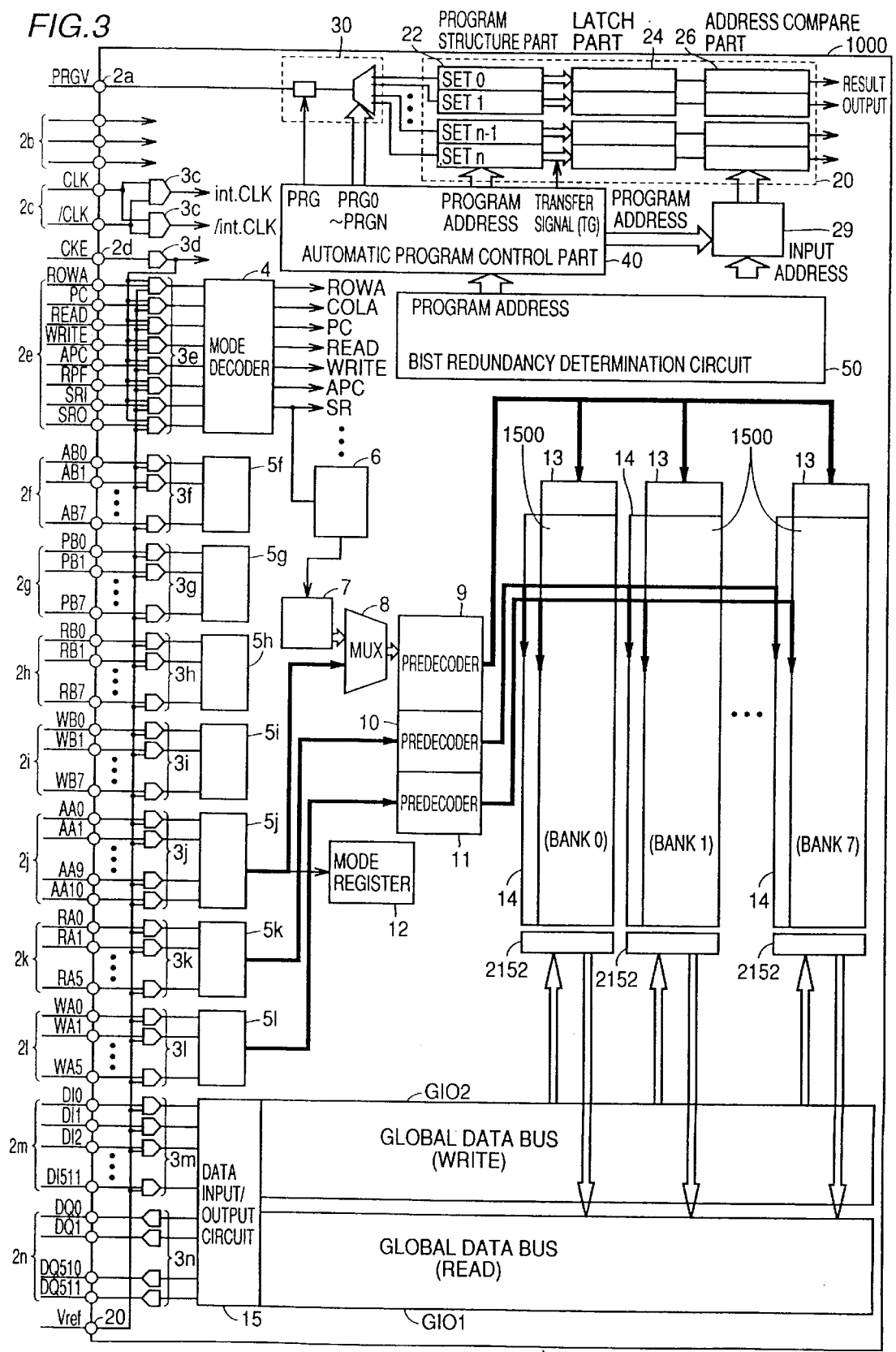
FIG. 3 is a diagram for illustrating the structure of a memory core part 1000 shown in FIG. 1.

Referring to FIGS. 2 and 3, the logic circuit block 1001 includes external terminals 1a, 1b, 1c and 1d. The external terminal 1a receives a built-in self test signal BIST, a built-in self repair signal BISR and a built-in self program signal BISP. The external terminal 1b receives a clock signal CLK. The external terminal 1c receives a command signal CMD. The external terminal 1d inputs/outputs data DATA. The logic circuit block 1001 performs logical processing on the input signals, and outputs corresponding signals to the nodes 2a to 2m. The logic circuit block 1001 further receives data output from the memory core part 1000 from the node 2n and outputs the corresponding data DATA to the external terminal 1d.

The memory core part 1000 includes the nodes 2a to 2o. The node 2a is supplied with a signal PRGV from the logic circuit block 1001 on the basis of the command signal CMD received in the external terminal 1c. The node 2b is supplied with the signals BIST, BISR and BISP input from the external terminal 1a. The node 2c is supplied 1001 with the clock signals CLK and /CLK from the logic circuit block 1001. The node 2d is supplied with a clock enable signal CKE from the logic circuit block 1001.

The node 2e is supplied with internal control signals (signals ROWA, PC, READ, WRITE, APC, REF, SRI and SRO) from the logic circuit block 1001. The signal ROW indicates that a row system is accessed, and the signal PC instructs a precharge operation for instructing termination of a circuit operation of the row system. The signal READ instructs a read operation to a column-system circuit, and the signal WRITE instructs a write operation to the column-system circuit. The signal APC instructs an auto precharge operation. When the auto precharge operation is specified, the precharge operation is automatically started upon termination of a burst cycle. The signals SRI and SRO are related to a self refresh mode.

The node 2f is supplied with bank address signals AB0, AB1, . . . , AB7 from the logic circuit block 1001. The bank address signals specify banks accessed when the row and column systems are accessed respectively. The node 2g is supplied with bank precharge signals PB0, PB1, . . . , PB7 from the logic circuit block 1001.

The node 2h is supplied with bank read signals RB0, RB1, . . . , RB7 from the logic circuit block 1001. The node 2i is supplied with bank write signals WB0, WB1, . . . , WB7 from the logic circuit block 1001. The node 2j is supplied with row address signals AA0, AA1, . . . , AA10 from the logic circuit block 1001. The node 2k is supplied with read address signals RA0, RA1, . . . , RA5 from the logic circuit block 1001. The node 2l is supplied with write address signals WA0, WA1, . . . , WA5 from the logic circuit block 1001. The node 2m is supplied with write data DI0, DI1, DI2, . . . , DI511 from the logic circuit block 1001. From the node 2n, read data DQ0, DQ1, . . . , DQ510 and DQ511 are output from the memory core part 1000. The node 2o is supplied with a reference potential Vref from the logic circuit block 1001.

The memory core part 1000 further includes buffers 3c to 3o, a mode decoder 4, an act bank latch 5f, a precharge bank latch 5g, a read bank latch 5h, a write bank latch 5i, a row address latch 5j, a read address latch 5k and a write address latch 5l. The buffers operate receiving the reference potential Vref.

The buffer 3c receives the clock signals CLK and /CLK and outputs internal clock signals Int.CLK and /Int.CLK. The buffer 3d receives the clock enable signal CKE. The buffer 3e operates in response to the signal CKE. The mode decoder 4 receives the control signals (the signals ROWA, PC, READ, WRITE, APC, REF, SRI and SRO) from the node 2e through the buffer 3e, and outputs the signals ROWA, COLA, PC, READ, WRITE, APC and SR.

The act bank latch 5f latches the bank address signals AB0 to AB7 received in the node 2f through the buffer 3f. The precharge bank latch 5g latches the bank precharge signals PB0 to PB7 received in the node 2g through the buffer 3g. The read bank latch 5h receives the bank read signals RB0 to RB7 received in the node 2h through the buffer 3h. The write bank latch 5i latches the bank write signals WB0 to WB7 received in the node 2i through the buffer 3i. The row address latch 5j latches the row address signals AA0 to AA10 received in the node 2j through the buffer 3j. The read address latch 5k latches the read address signals RA0 to RA5 received in the node 2k through the buffer 3k. The write address latch 5l latches the write address signals WA0 to WA5 received in the node 2l through the buffer 3l.

The memory core part 1000 further includes a self refresh timer 6, a refresh address counter 7, a multiplexer 8, predecoders 9, 10 and 11 and a mode register 12.

The self refresh timer 6 receives the signal SR output from the mode decoder 4 and starts its operation. The refresh address counter 7 generates an address for performing a refresh operation in accordance with an instruction from the self refresh timer 6. The multiplexer 8 selects and outputs an output from the row address latch 5j in a normal operation, while selecting and outputting an output from the refresh address counter 7 in a self refresh operation. The predecoder 9 predecodes a row address received from the multiplexer 8. The predecoder 10 predecodes a column address received from the read address latch 5k. The predecoder 11 predecodes a column address received from the write address latch 5l. The mode register 12 holds information (data for a burst length or the like) for a prescribed operation mode in response to the output of the row address latch 5j.

The memory core part 1000 further includes banks 0, 1, ..., 7, a write global data bus GIO2, a read global data bus GIO1 and a data input/output circuit 15.

Each bank can independently perform a read/write operation. Each of the banks 0 to 7 includes a memory cell array 1500, a row decoder 13 for selecting a row (word line) of the corresponding bank in response to an output of the predecoder 9, a column decoder 14 for selecting a column (pair of bit lines) of the corresponding bank in response to outputs of the predecoders 10 and 11, and an I/O port 2152.

Figure 45:
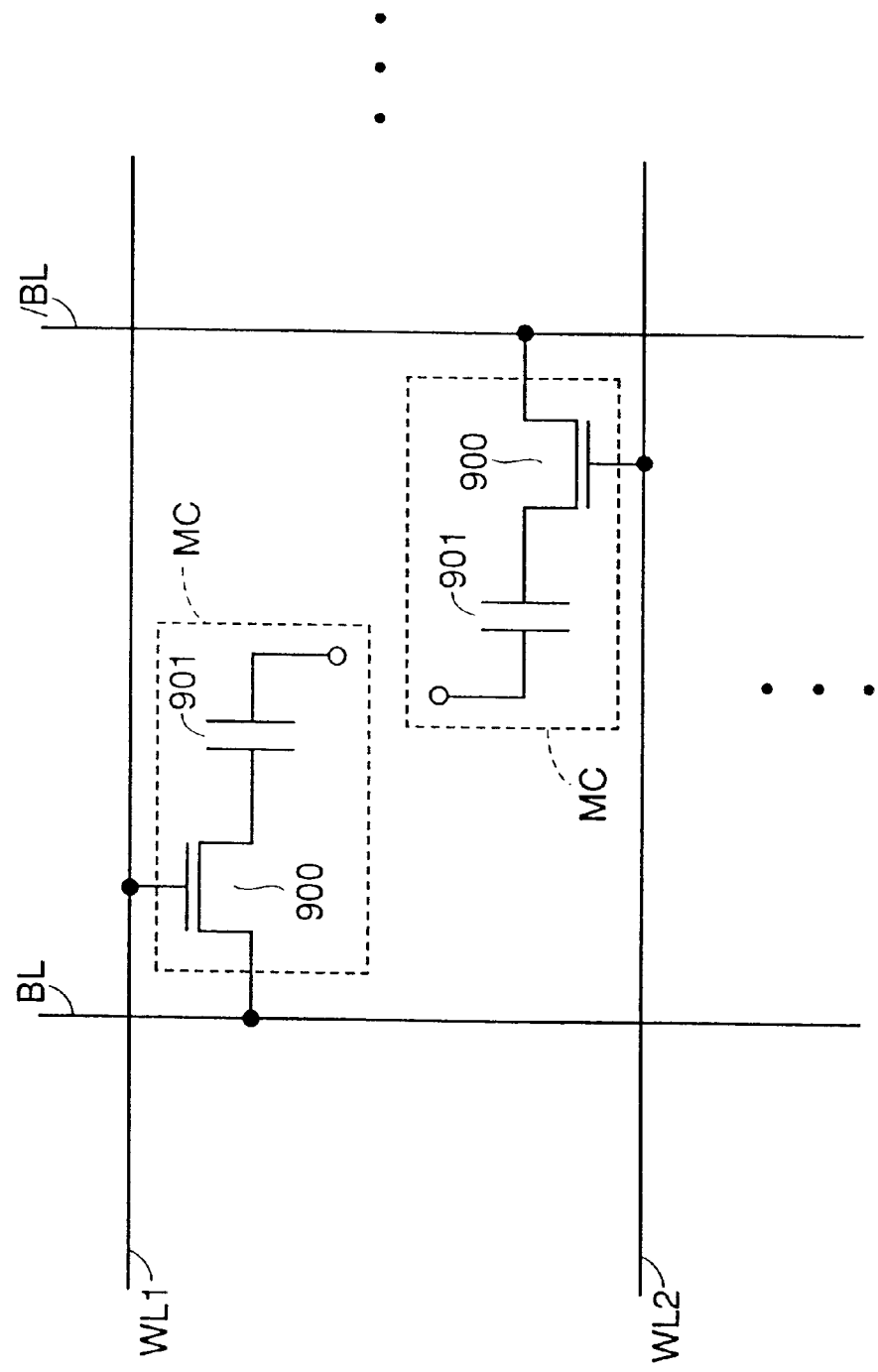
FIG. 45 illustrates the structure of a memory cell array.

The memory cell array 1500 includes a plurality of memory cells arranged in the form of a matrix, a plurality of word lines and a plurality of bit lines. The structure of the memory cell array 1500 is described with reference to FIG. 45. FIG. 45 shows word lines WL1 and WL2, bit lines BL and /BL and memory cells MC. The memory cells MC are formed by memory cell transistors 900 and memory cell capacitors 901. The memory cell transistors 900 have gate electrodes connected with the corresponding word lines (WL1 and WL2 in FIG. 45), first conducting terminals connected with the corresponding bit lines (BL and /BL in FIG. 45) and second conducting terminals connected with first terminals of the memory cell capacitors 901. Second terminals of the memory cell capacitors 901 receive a prescribed voltage.

Referring again to FIG. 3, the I/O port 2152 supplies data read from a selected memory cell to the global data bus GIO1 in the read operation, while supplying data transmitted through the global data bus GIO2 to the corresponding bank in the write operation.

The data input/output circuit 15 receives the write data DI0 to DDI511 from the node 2m through the buffer 3m, performs serial-parallel conversion and outputs the results to the global data bus GIO2. The data input/output circuit 15 further outputs the read data output to the global data bus GIO1 to the node 2n through the buffer 3n.

The memory core part 1000 further includes a program part 20, a voltage supply part 30, an automatic program control part 40 and a BIST/redundancy determination circuit 50. The memory core part 1000 automatically tests the memory cell array in response to the signal BIST. After termination of the test in response to the signal BIST, the BIST/redundancy determination circuit 50 automatically generates a repair address (program address) corresponding to a faulty memory cell in accordance with the signal BISR. The automatic program control circuit 40 outputs the program address and a transfer signal TG described later in accordance with the signal BISP.

The program part 20 includes a plurality of program structure parts 22, a plurality of latch parts 24 and a plurality of address compare parts 26. The plurality of program structure parts 22, the plurality of latch parts 24 and the plurality of address compare parts 26 are split into a plurality of program blocks. For example, a set (program block) of program structure part 22, latch part 24 and address compare part 26 corresponds to a single program address.

The automatic program control part 40 outputs the program address and the transfer signal TG to each program block. The program structure part 22 includes an electric fuse (not shown) blown (programmed) in accordance with the program address. The program state in the program structure part 22, i.e., program information is transferred to the latch part 24 in response to the transfer signal TG output from the automatic program control part 40.

The multiplexer 29 selectively outputs the program address output from the automatic program control part 40 or the address received through the logic circuit block 1001 to the address compare part 26. The address compare part 26 compares the input address output from the multiplexer 29 with the program information latched in the latch part 24 and outputs a spare determination result. The spare determination result indicates whether or not to repair the faulty memory cell with a spare memory cell. When accessing the memory cell array 1500, the faulty memory cell is repaired with the spare on the basis of the spare determination result.

The voltage supply part 30 is connected with the node 2a. The voltage supply part 30 selectively supplies a high voltage (program voltage) to each of the plurality of program blocks on the basis of the signal PRG and signals PRG0 to PRGN output from the automatic program control part 40. The signal PRG transmits the program voltage to the program part 20. The signals PRG0 to PRGN correspond to the respective ones of the program blocks.

The voltage supply part 30 is now described with reference to FIG. 4.

Figure 4:
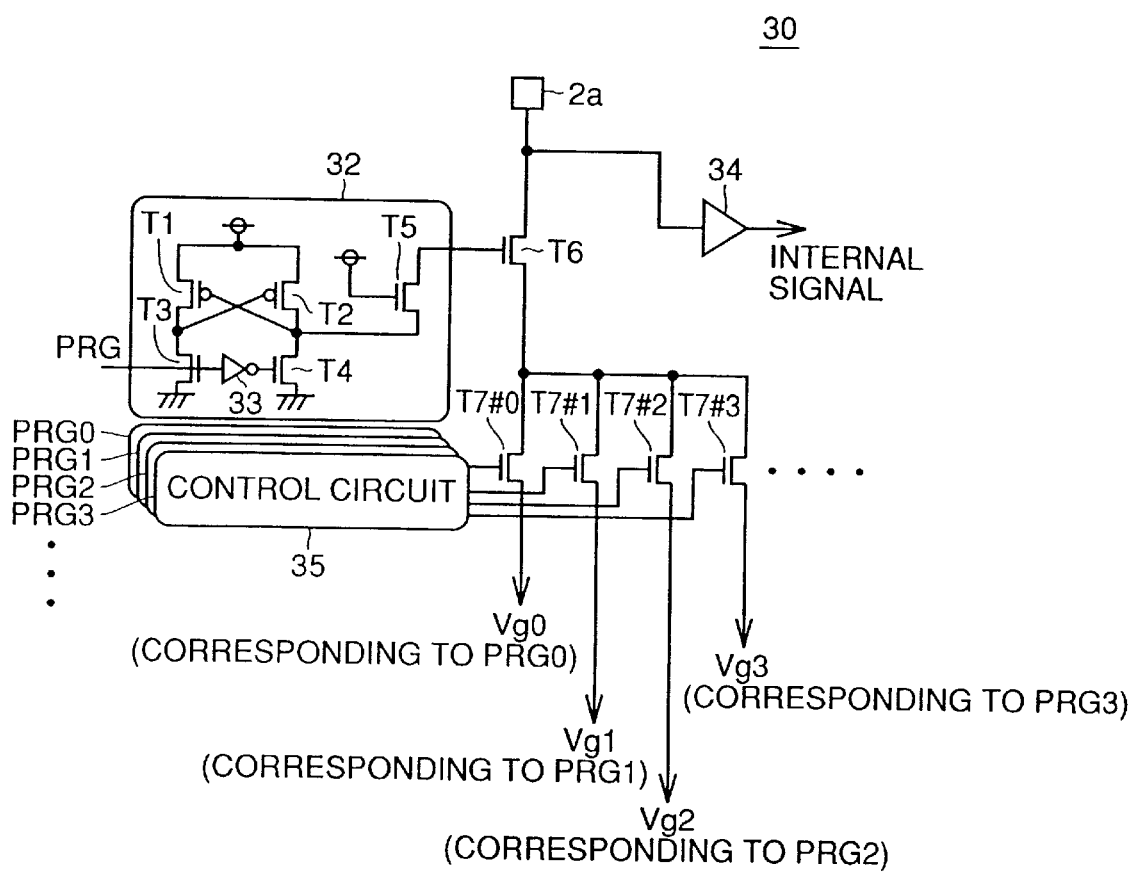
FIG. 4 is a diagram for illustrating the structure of a voltage supply part 30.

Referring to FIG. 4, the voltage supply part 30 includes a self boost circuit 32, control circuits 35 corresponding to the program blocks and transistors T6 and T7#0, T7#1, T7#2, T7#3, .... The self boost circuit 32 includes transistors T1 to T5 and an invertor 33. The transistors T1 and T2 are PMOS transistors, and the transistors T3 to T5 are NMOS transistors.

The transistor T1 has a first conducting terminal connected with a power supply voltage and a second conducting terminal connected with a first terminal of the transistor T3 and a gate electrode of the transistor T2. The transistor T3 has a second conducting terminal connected with a ground potential and a gate electrode receiving the signal PRG. The invertor 33 inverts the signal PRG. The transistor T2 has a first conducting terminal connected with the power supply voltage and a second conducting terminal connected with first conducting terminals of the transistors T4 and T5 and a gate electrode of the transistor T1. The transistor T4 has a second conducting terminal connected with the ground potential and a gate electrode receiving an output of the invertor 33. A gate electrode of the transistor T5 receives the power supply potential. When the signal PRG is at a high level, a second conducting terminal of the transistor T5 goes high. When the signal PRG is at a low level, the second conducting terminal of the transistor T5 goes low.

The transistor T6 has a first conducting terminal connected with the node 2a and a second conducting terminal connected with first conducting terminals of the transistors T7#0, T7#1, T7#2, T7#3, The control circuits 35 output signals for turning on the corresponding transistors T7#0, T7#1, T7#2, T7#3, . . . by the corresponding signals PRG0, PRG1, PRG2, PRG3, . . . respectively. Each of the transistors T7#1, T7#2, T7#3, . . . is selectively turned on on the basis of the output of the corresponding control circuit 35. The output of the control circuit 35 is stepped up to a voltage higher than the power supply potential so that each of the transistors T7#0, T7#1, T7#2, T7#3, . . . can transmit a high voltage.

Thus, second conducting terminals of the transistors T7#0, T7#1, T7#2, T7#3, . . . selectively output high voltage signals Vg0, Vg1, Vg2, Vg3, . . . . These signals are employed for blowing (programming) electric fuses, as described later.

The high voltage signals may be generated in the chip. When the signals are applied from outside the chip, the number of pins of the chip can be reduced by sharing pads for receiving other normally used signals and those receiving the signals for applying the high voltages In this case, an internal signal is output through a buffer 34 in relation to the signal received in the node 2a. A dedicated pin can be provided.

Figure 5:
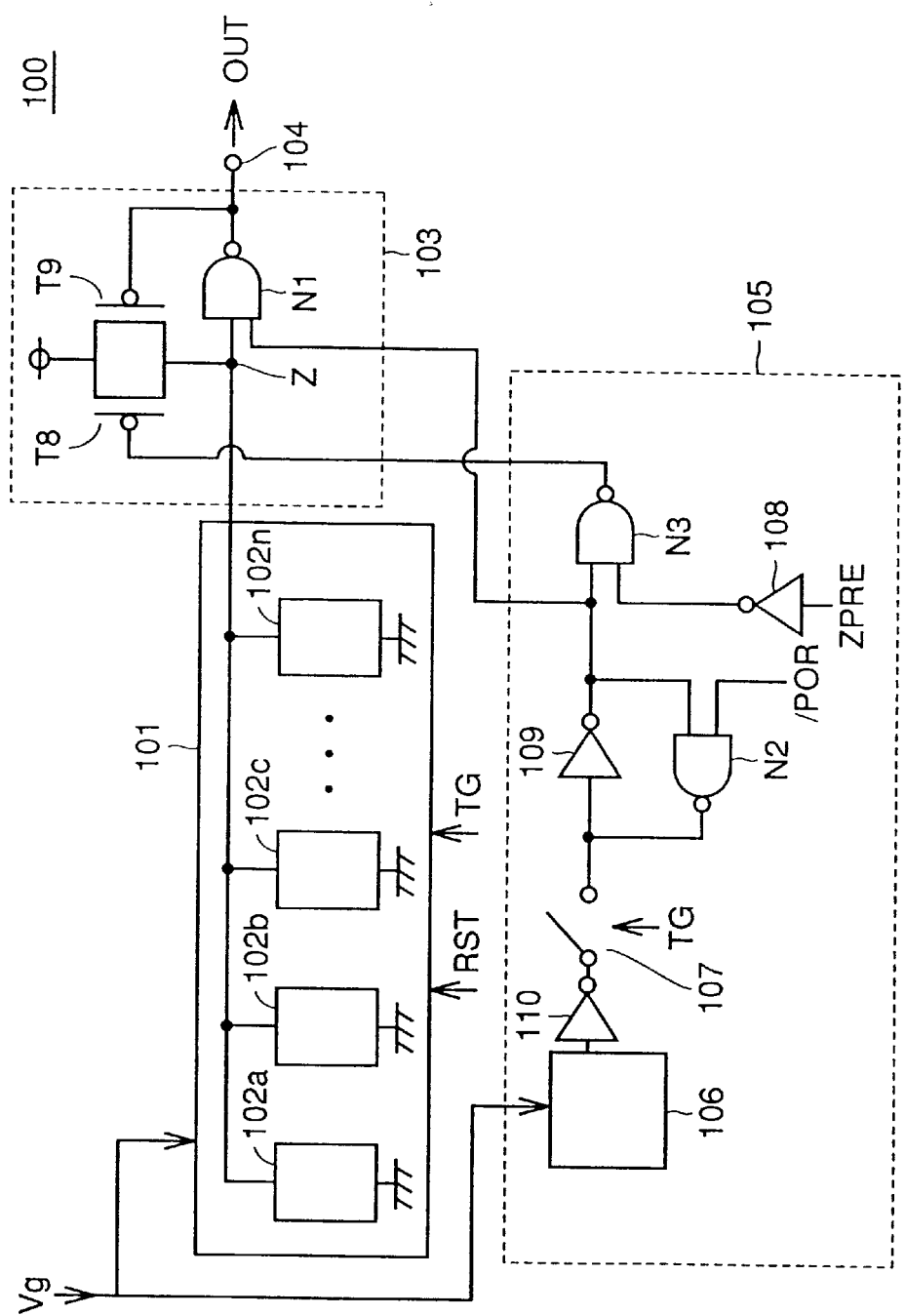
FIGS. 5 and 6 are diagrams for illustrating the structure of a program part 20.
Figure 6:
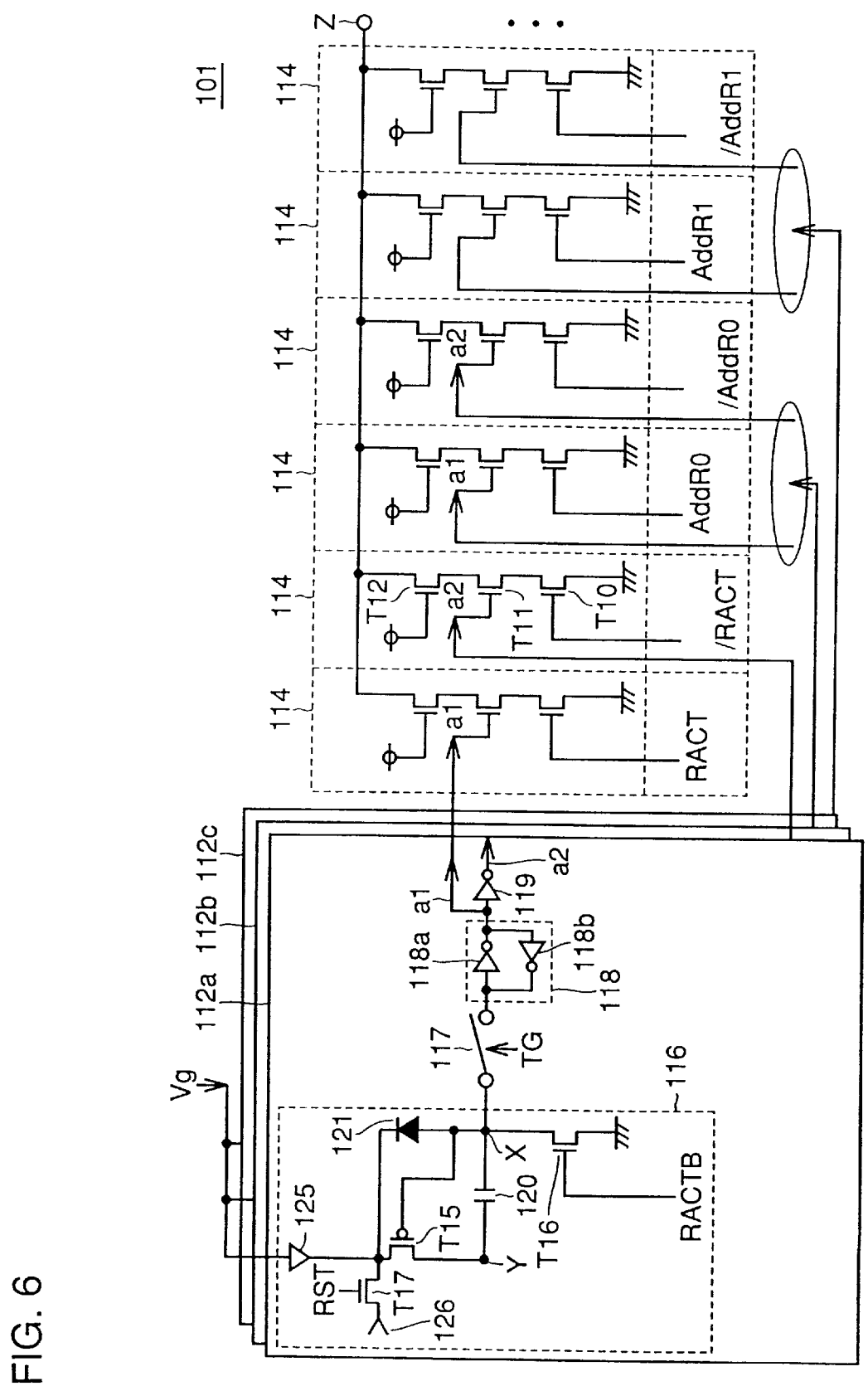

The structure of the program part 20 is now described with reference to FIGS. 5 and 6. FIGS. 5 and 6 show a circuit structure corresponding to a single program block.

A circuit (referred to as a program block 100) shown in FIG. 5 has a program unit 101 including program circuits 102a, 102b, 102c, . . . , 102n. The program circuits 102a, . . . are hereinafter generically referred to as program circuits 102. Each program circuit 102 includes an electric fuse serving as a programming element. The electric fuse is blown by a program voltage Vg on the basis of a program address signal forming the program address. The following description is made with reference to a row direction address (row address). The description is also applicable to a column direction address.

The program circuit 102 further includes a comparator circuit comparing the input address with the program address signal. The potential of a common node Z changes in response to the result of the comparison in the comparator circuit. The potential of the common node Z is output from a node 104 as a spare determination result OUT. A holding circuit 103 is arranged between the common node Z and the output node 104.

The holding circuit 103 is used for rendering the potential of the common node Z constant. The holding circuit 103 includes transistors T8 and T9 and a NAND circuit N1. The transistors T8 and T9 are PMOS transistors. The transistors T8 and T9 are connected between the power supply potential and the common node Z. The NAND circuit N1 is connected between the common node Z and the output node 104.

The program block 100 further includes a program recognition circuit 105 for recognizing whether or not programming has been performed. The program recognition circuit 105 includes a program structure circuit 106, a switch 107, NAND circuits N2 and N3 and invertors 110, 109 and 108.

The program structure circuit 106 receives the same high voltage Vg as the program unit 101. The program structure circuit 106 includes the electric fuse.

The program structure circuit 106 outputs a high-level signal when the electric fuse is blown, while otherwise outputting a low-level signal. The invertor 110 is arranged between the switch 107 and the program structure circuit 106. The switch 107 is switched in response to the transfer signal TG. The invertor 107 and the NAND circuit N2 form a latch circuit. A first input terminal of the NAND circuit N2 receives a power on reset signal /POR and an output of the invertor 109. An input node of the invertor 109 is connected with the switch 107 and an output node of the NAND circuit N2. Upon power supply, the power on reset signal /POR resets the latch circuit (the invertor 107 and the NAND circuit N2).

The invertor 108 inverts a precharge signal ZPRE and outputs the inverted signal. The NAND circuit N3 receives the outputs of the invertors 109 and 108. A gate electrode of the transistor T8 receives the output of the NAND circuit N3. The NAND circuit N1 has a first input node receiving the output of the invertor 109 and a second input node connected with the common node Z. When the electric fuse is not blown in the program structure circuit 106 (the program unit is unprogrammed), the common node Z is not precharged.

An exemplary structure of the program unit 101 is now described with reference to FIG. 6. Referring to FIG. 6, the program unit 101 is formed by program/latch circuits 112a, 112b, 112c, . . . and a plurality of comparator circuits 114. The program/latch circuits 112a, 112b, 112c, . . . are hereinafter generically referred to as program/latch circuits 112. The program circuit 102 includes the program/latch circuits 112 and the comparator circuits 114.

The following description is made with reference to the program/latch circuit 112a (the remaining program/latch circuits 112 have similar structures). The program/latch circuit 112a includes a program structure circuit 116, a switch 117 and latches 118 and 119. The program structure circuit 116 corresponds to the program structure part 22 in FIG. 3. The latch 118 formed by invertors 118a and 118b corresponds to the latch part 24 in FIG. 3. Each comparator circuit 114 corresponds to the address compare part 26 in FIG. 3.

The program structure circuit 116 includes a voltage node 125 receiving the high voltage signal Vg from the voltage supply part 30, transistors T15, T16 and T17, an electric fuse 120 and a diode 121. The voltage of the node 125 is referred to as the program voltage Vg. The transistor T15 is connected between the node 125 and a node Y. The electric fuse 120 is connected between the node Y and a node X. The transistor T16 is connected between the node X and the ground potential.

A gate electrode of the transistor T16 receives a row direction bank address signal RACTB forming the program address. In other words, the program/latch circuit 112a recognizes the corresponding bank. Thus, a plurality of banks can share the program block. The remaining program/latch circuits 112 receive row address signals forming the program address. As described above, the automatic program control part 40 outputs the program address (generically referred to as a program address AddB).

The diode 121 is connected between the nodes 125 and X. A gate electrode of the transistor T15 is connected with the node X. The transistor T17 is connected between the nodes 126 and 125. A gate electrode of the transistor T17 receives a reset signal RST. The program structure circuit 106 has a structure similar to that of the program structure circuit 116.

Stress is electrically supplied to the electric fuse 120 thereby breaking a dielectric. The electric fuse 120 is formed by a gate oxide film, an ON film, a $TaO_2$ film, a PST film, a capacitor dielectric film or the like. While a capacitor is employed as the electric fuse 120 in this embodiment, the present invention is not restricted to this so far as the electric fuse 120 is a programming element blown by application of a high voltage but a gate-source/drain edge or a gate-to-wire film holding a gate side wall may be blown, for example.

When blowing the electric fuse 120, a high voltage is applied to the node Y to turn on the transistor T16. When blowing the electric fuse 120, the current quantity of the node X changes. The transistor T15 adjusts the amount of voltage supply on the basis of the state of the node X.

The reset signal RST is used for stopping application of the high voltage to the transistor T17. Thus, no stress is electrically applied to the film of the electric fuse 120 except prescribed timings (except timings for programming and reading the program information, for example). Thus, reliability of the film improves.

The switch 117 connects the node X with the latch 118 in response to the transfer signal TG. Thus, the program information is transferred to the latch 118. The latch 118 outputs a signal a1. The invertor 119 inverts the signal of the latch 118 and outputs a signal a2.

Each of the comparator circuits 114 includes serial transistors (transistors T12, T11 and T10) serially connected between the common node Z and the ground potential. A gate electrode of the transistor T12 is connected with the power supply potential.

Gate electrodes of the transistors T10 receive row direction bank address signals RACT and /RACT, row address signals AddR0, /AddR0, AddR1, /AddR1 and the like. As described above, the multiplexer 29 outputs these addresses (hereinafter generically referred to as input addresses AddR).

A gate electrode of each transistor T11 receives the signal a1 or a2 output from the corresponding program/latch circuit 112. Each comparator circuit 114 changes the potential of the common node Z in response to the output (the signal a1 or a2) of the corresponding program/latch circuit 112 and the input address AddR.

Figure 7:
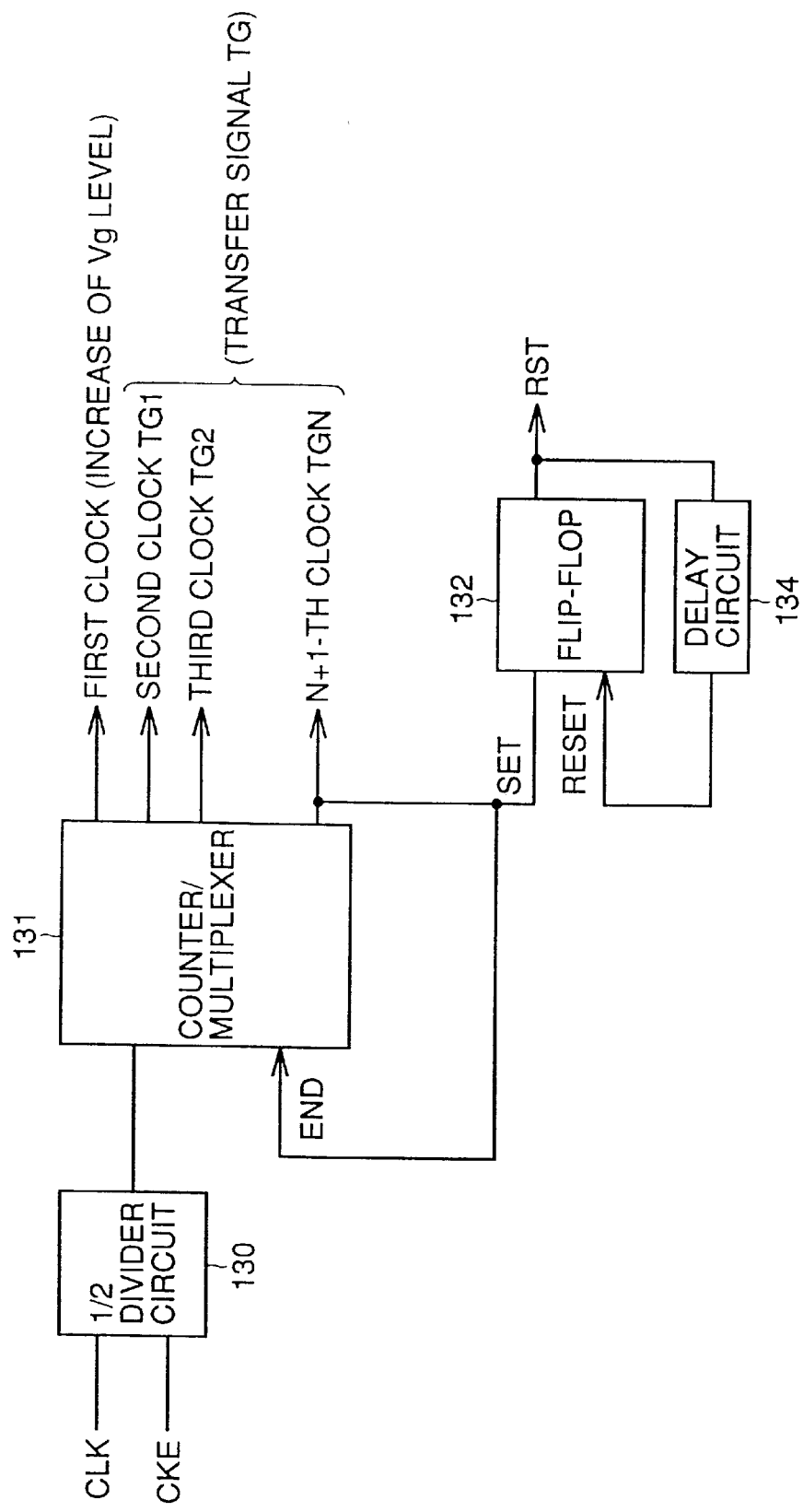
FIG. 7 is a block diagram for illustrating a transfer signal TG and a reset signal RST.

Generation of the transfer signal TG and the reset signal RST is now described with reference to FIG. 7. The automatic program control part 40 includes the structure shown in FIG. 7. The circuit shown in FIG. 7 includes a ½ divider circuit 130, a counter/multiplexer 131, a flip-flop 132 and a delay circuit 134. The ½ divider circuit 130 divides the clock signal CLK received after the clock enable signal CKE is input. The counter/multiplexer 131 counts an output of the ½ divider circuit 130 and sequentially outputs clock signals. The first clock signal output from the counter/multiplexer 131 decides the timing for increasing the voltage level of the high voltage signal Vg (reading the blow state of the electric fuse). Each of a second clock TG1, a third clock TG2, . . . , an (N+1)-th clock TGN is used as the transfer signal TG. When generating the clock signal TGN, the counter/multiplexer 131 stops its operation. The flip-flop 132 is set in response to the clock signal TGN. The flip-flop 132 outputs the reset signal RST. The delay circuit 134 delays and outputs the reset signal RST. The flip-flop 132 is reset in response to the output of the delay circuit 134.

A precharge signal /ZPRE is described with reference to FIGS. 8 and 9.

Figure 8:
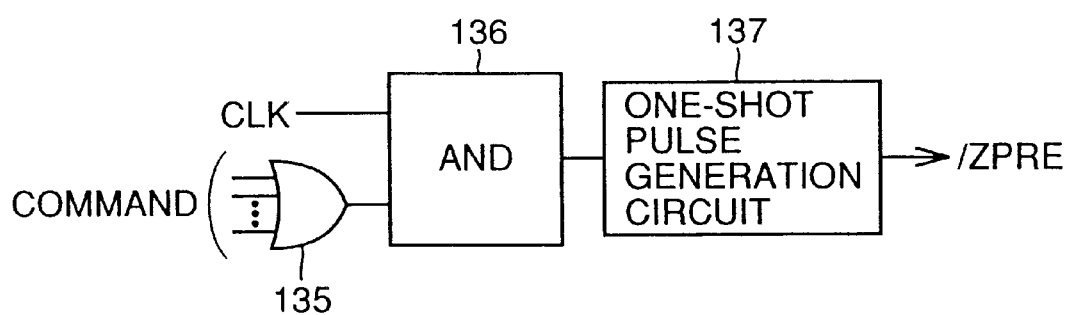
FIG. 8 is a diagram for illustrating a circuit generating a precharge signal /ZPRE.

A circuit shown in FIG. 8 includes an OR circuit 135, an AND circuit 136 and a one-shot pulse generation circuit 137. A control circuit related to row access or column access includes the circuit shown in FIG. 8. The OR circuit 135 receives a command related to column access or row access. The AND circuit 136 receives the clock signal CLK and an output of the OR circuit 135. The one-shot pulse generation circuit 137 receives an output of the AND circuit 136 and outputs a one-shot pulse signal (the precharge signal /ZPRE).

Figure 9:
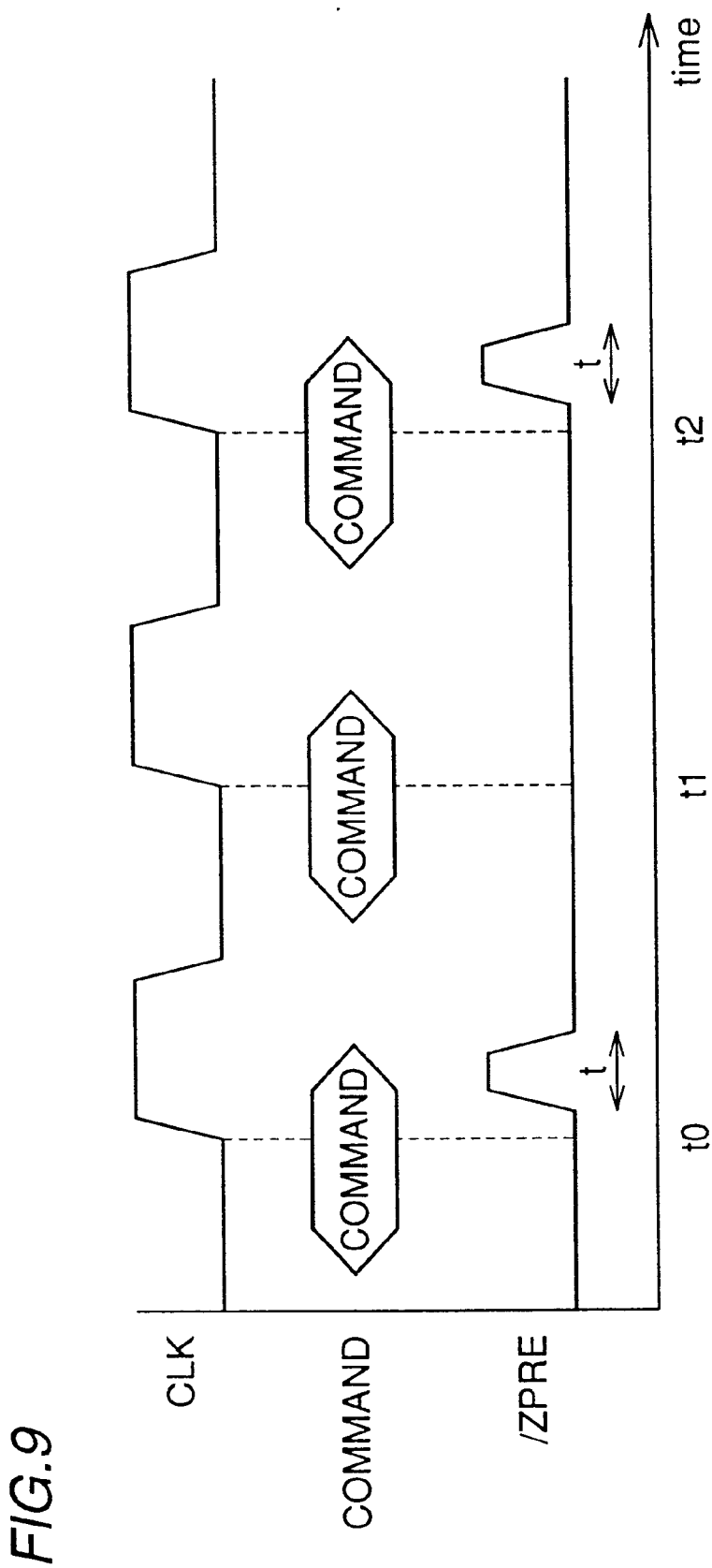
FIG. 9 is a timing chart for illustrating operations of the circuit shown in FIG. 8.

Referring to FIG. 9, the clock signal CLK rises at times t0, t1 and t2, and commands are fetched at the times t0, t1 and t2. The precharge signal /ZPRE rises to a high level after lapses of small periods from the times t0 and t2. A period t when the precharge signal /ZPRE is at a high level (or the precharge signal ZPRE is at a low level) defines the determination time for redundancy (spare) determination.

Operations of the program part according to the first embodiment of the present invention are now described with reference to timing charts shown in FIGS. 10 to 12.

Figure 10:
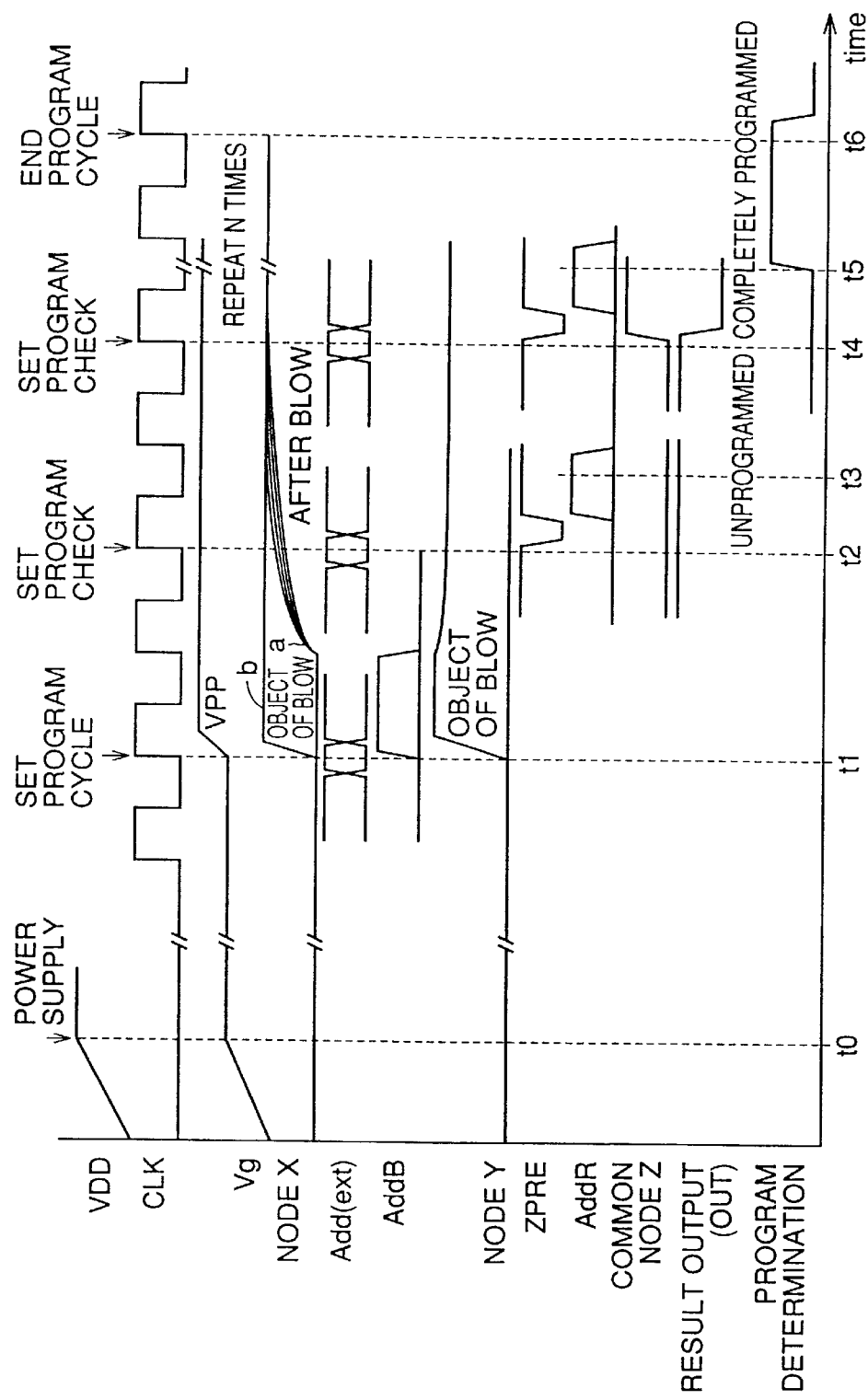
FIG. 10 is a timing chart for illustrating operations in programming in the program part 20.

FIG. 10 is a timing chart for illustrating operations in programming in the program part 20. Referring to FIG. 10, power is supplied at a time t0. A program cycle is set at a time t1. The signal PRG and the signals PRG0 to PRGn supply the high voltage signals to a selected program block (a single program address). The program voltage Vg increases. The program address AddB serving as the repair address is supplied.

A high voltage VPP is applied to the node Y. For an already blown one, the potential of the node X rises to a high level immediately after the time t1 (b in FIG. 10). For that to be blown, the voltage of the node X gradually goes high (a in FIG. 10).

A program check cycle is set N times at prescribed internals (times t2, t4, . . . ). The precharge signal ZPRE is set low and the common node Z is set high every time. The transfer signal TG is activated to transfer the program information (the state of the node X) to the latch 118.

Through the multiplexer 29, the program address AddB is supplied to the comparator circuit 114 as the input address AddR. When the electric fuse 120 is blown (completely programmed state), the common node Z is precharged and thereafter maintains a high level, and the spare determination result OUT maintains a low level. When the electric fuse 120 is not blown (unprogrammed state), no precharging is performed and the spare determination result OUT is at a high level. Program determination is made at a time t5, to end the program cycle if the program is completed.

Figure 11:
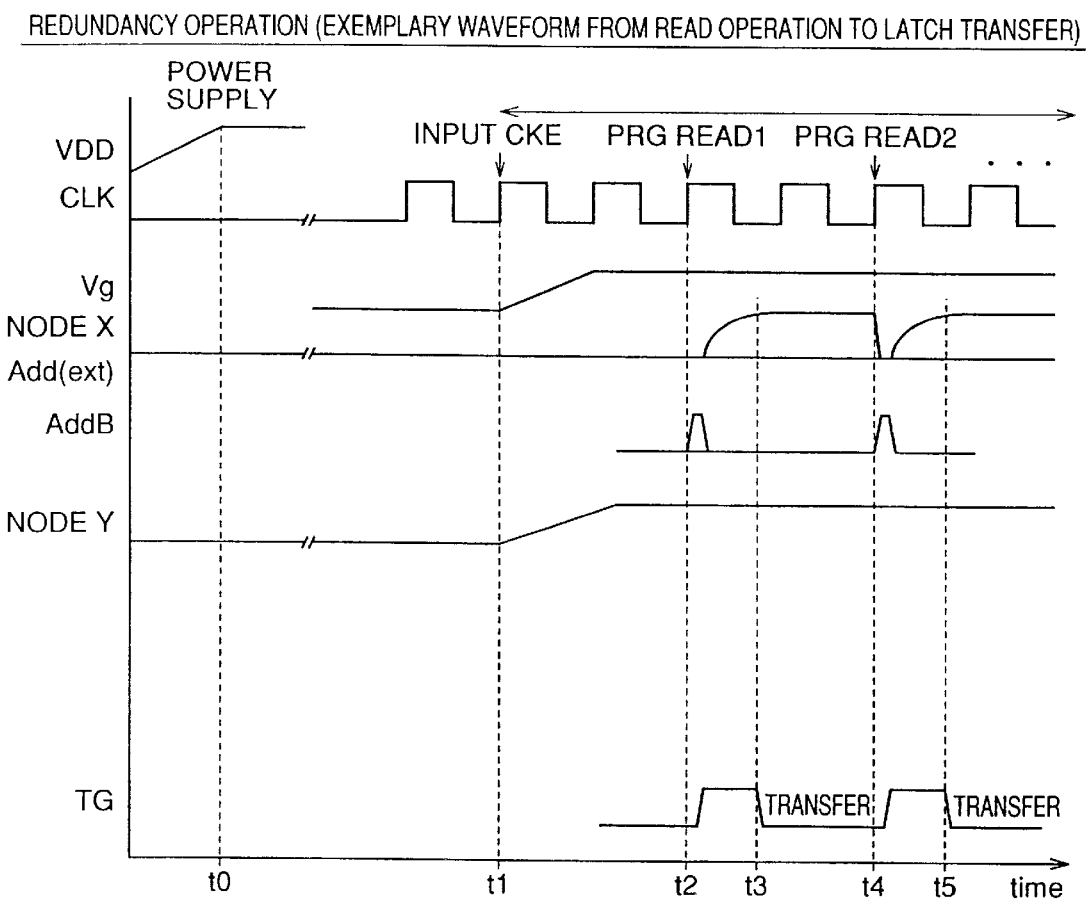
FIG. 11 is a timing chart for illustrating reading of a program state in the program part 20 and transfer to a latch.

FIG. 11 is a timing chart for illustrating reading of program information in the program part and transfer to the latch. The operation for reading the program information is executed once in chip enabling, bank activation or power supply. Referring to FIG. 11, the operation for reading the program information is executed after the clock enable signal CKE is input (activated to a high level). In the read operation, the program voltage Vg is increased. Then, the transfer signal TG is activated to transfer the program information to the latch.

When the read operation is terminated, the program voltage Vg is set low by the reset signal RST. Thus, the electric fuse 120 is prevented from application of stress.

Under control of the automatic program control part 40, the program information is dividedly read a plurality of times. In other words, the program information is not read from all of the plurality of program structure parts 22 but a prescribed number of program information (e.g., from a single program block) is read in a single read operation. Thus, influence exerted on the peripheral elements following generation of the high voltage is suppressed. If the number of spares is small, the program information may be simultaneously read. Referring to FIG. 11, the read operation is executed every second cycle.

Power is supplied at a time t0. The clock enable signal CKE is input at a time t1. At a time t2, a read operation (PRG READ1) for the program information is specified for one program block. At a time t4, a read operation (PRG READ2) for the program information is specified for one program block. After the time t1, an initialization cycle for a clock recovery circuit (not shown) or the like may be concurrently performed and there is a possibility that the internal clock signal is not yet completely waveform-shaped. In this case, therefore, the external clock signal CLK is employed as the clock signal. The external clock signal CLK is employed as the internal clock signal until the clock recovery circuit or the like is completely initialized, and an output clock from the clock recovery circuit is utilized as the internal clock signal when the clock recovery circuit is locked. In this case, the multiplexer switches the clock signal.

When the clock signal CKE is input, the program voltage Vg rises. In the read operation (times t2 and t4), the program address AddB is entirely set high to initialize the node X at a low level. When the electric fuse 120 is blown, the voltage of the node X rises from the low level to a high level. The transfer signal TG is activated for transferring the program information to the latch 118.

Figure 12:
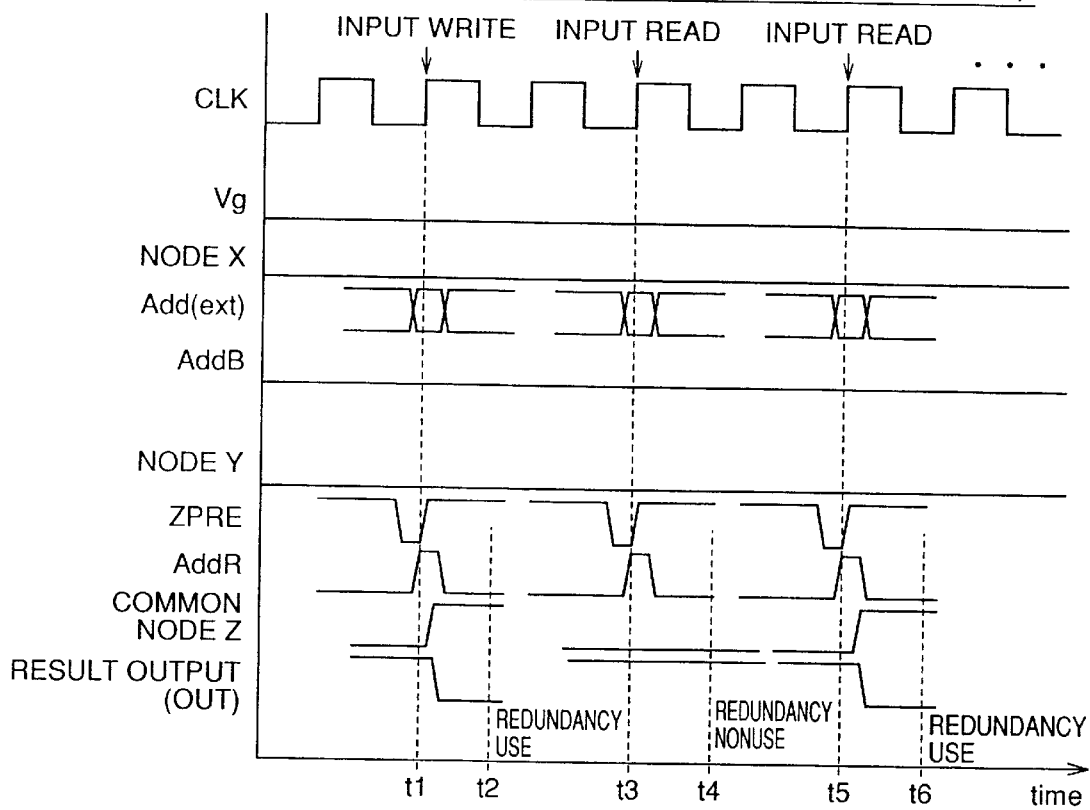
FIG. 12 is a timing chart for illustrating operations in access to a memory cell array.

FIG. 12 is a timing chart for illustrating operations in access to the memory cell array. With reference to FIG. 12, the case where commands such as a write command (WRITE) and a read command (READ) are input in response to leading edges of the clock signal CLK. Referring to FIG. 12, the write command WRITE is input at a time t1 and the read command READ is input at times t3 and t5.

In this case, the program address AddB and the program voltage Vg are set low. No electric stress is applied to the electric fuse 120 due to the low-level state of the program voltage Vg.

At the command input timing, the precharge signal ZPRE is set low and the common node Z is temporarily charged to a high level. Thereafter the input address AddR is compared with the program state. The spare determination result OUT changes in response to the result of the comparison. In this case, the input address AddR is based on the output of the logic circuit block 1001.

When programmed (redundancy use), the spare determination result OUT goes low. Otherwise (redundancy nonuse) the spare determination result OUT is at a high level.

Figure 13:
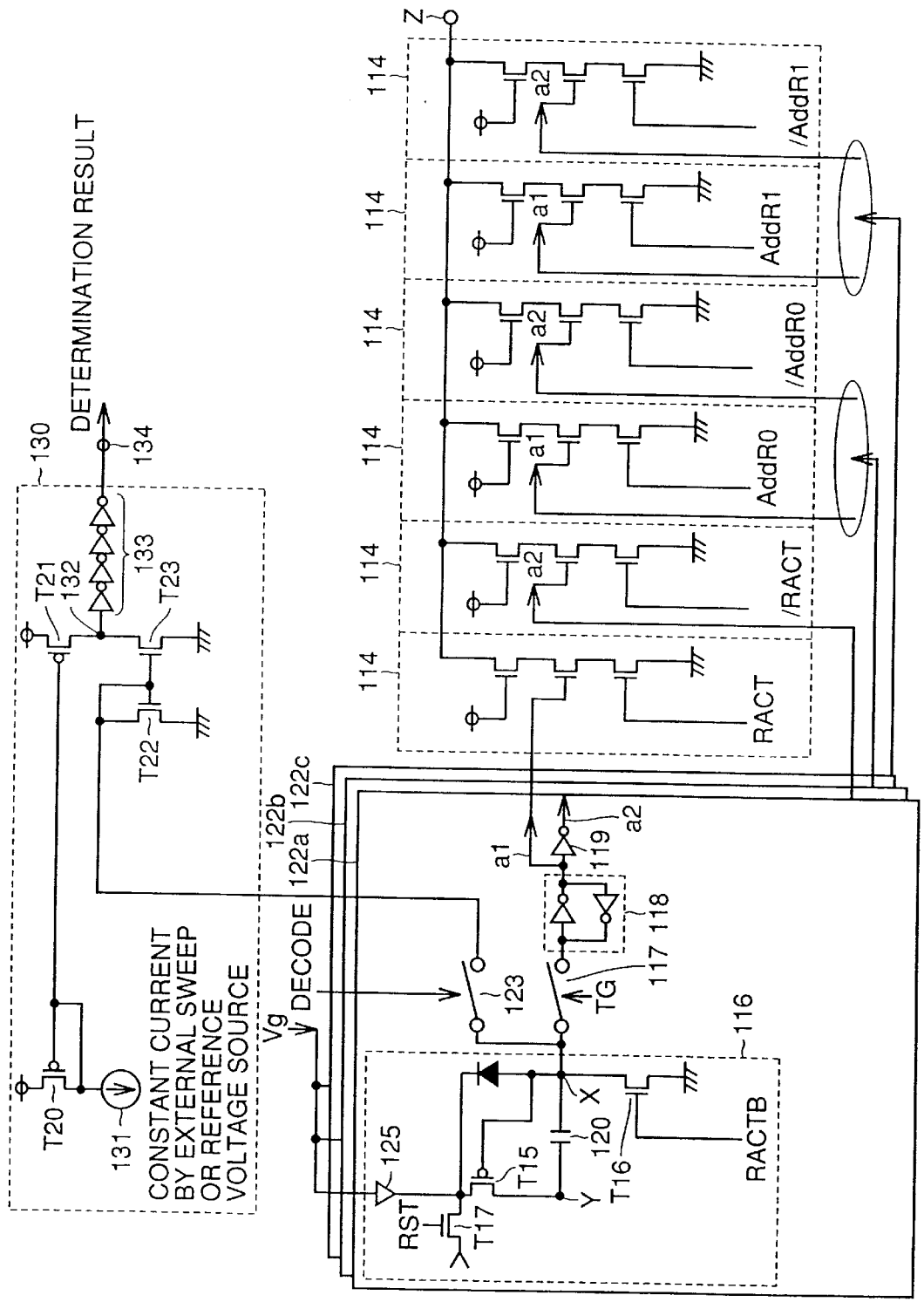
FIG. 13 is a diagram for illustrating an initial failure check circuit 130 for checking an initial failure of an electric fuse 120.

If the electric fuse 120 is faulty, programming cannot be performed and hence no normal operation is guaranteed. An initial failure check circuit checking an initial failure of the electric fuse 120 is described with reference to FIG. 13. Each of program/latch circuits 122a, 122b, 122c, . . . shown in FIG. 13 includes a switch 123 in addition to the circuit structure of the program/latch circuit 122. The program/latch circuits 122a, 122b, 122c, . . . are hereinafter generically referred to as program/latch circuits 122. The switch 123 is connected to the node X. The switch 123 receives a decode signal when checking the initial failure. The switch 123 is switched by this decode signal.

An initial failure check circuit 130 includes transistors T20, T21, T22 and T23, a constant current source 131 and an invertor 133. The transistors T22 and T23 are NMOS transistors forming a current mirror circuit. The transistors T20 and T21 are PMOS transistors. The transistor T20 is connected between the power supply potential and the constant current source 131. The transistor T21 is connected between the power supply potential and a node 132. Gate electrodes of the transistors T20 and T21 are connected with the constant current source 131.

The transistor T22 is connected between the switch 123 and the ground potential. The transistor T23 is connected between the node 132 and the ground potential. Gate electrodes of the transistors T22 and T23 are both connected with the switch 123. The constant current source 131 generates a constant current on the basis of a reference voltage source. The current may alternatively be supplied by external sweep.

The current mirror circuit formed by the transistors T22 and T23 compares the current of the constant current source 131 with the current of the node X received through the switch 123. The voltage level of the node 132 varies with the result of the comparison. An output node 134 of the initial failure check circuit 130 varies with the voltage of the node 132 through the invertor 133.

Before executing the program, the current quantity of the node X depends on whether the electric fuse 120 is faulty or normal. When closing the switch 123 in accordance with the decode signal, therefore, it follows that the output node 134 of the initial failure check circuit 130 changes its voltage level in response to the normal/faulty state of the electric fuse.

The initial failure check circuit 130 can also check whether or not the electric fuse 120 is normally blown. The constant current source 131 generates a small quantity of current for checking the initial failure, while the same sweeps a larger current for checking the blown state. For example, a switching circuit is provided so that a plurality of currents can be selectively switched and used.

The switching circuit is provided between the initial failure check circuit 130 and each program/latch circuit 122 for selectively connecting any program/latch circuit 122 with the initial failure check circuit 130. Thus, the plurality of program/latch circuits 122 can share the initial failure check circuit 130.

A structure for removing a faulty programming element detected by the initial failure check circuit 130 is now described with reference to FIGS. 14 and 15. Each of program units 101a, 101b, 101c and 101d shown in FIG. 14 has a circuit structure similar to that of the aforementioned program unit 101, and each corresponds to a set of program address.

Holding circuits 143a to 143d (hereinafter referred to as holding circuits 143) are arranged in correspondence to the program units 101a to 101d respectively. The holding circuits 143a to 143d precharge common nodes Za to Zd respectively. Each holding circuit 143 is formed by transistors T8 and T9 and an invertor 144.

The transistors T8 and T9 are connected between the power supply potential and the corresponding common node. The invertor 144 is connected with the common node. A gate electrode of the transistor T9 receives an output of the invertor 144. A gate electrode of the transistor T8 receives the precharge signal (ZPREa to ZPREd). The transistor T8 supplies a voltage to the corresponding common node in response to the precharge signal.

Figure 27:
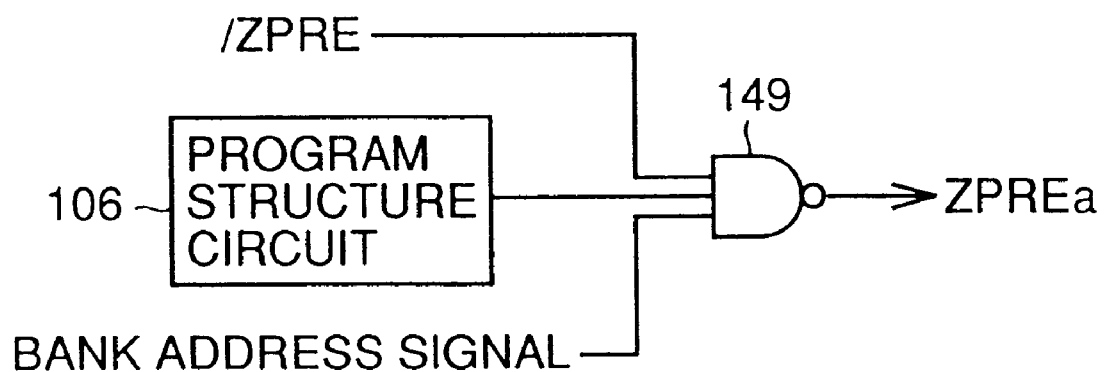
FIG. 27 is a diagram for illustrating an exemplary circuit of generating a precharge signal controlling a holding circuit 143.

An exemplary circuit generating the precharge signal controlling the holding circuit 143 is described with reference to FIG. 27. The circuit shown in FIG. 27 has the program structure circuit 106 and an AND circuit 149. The AND circuit 149 receives the bank address signal received by the corresponding program unit, the output of the program structure circuit 106 and the precharge signal /ZPRE, and outputs the precharge signal ZPREa. Thus, power is independently supplied to the common node every bank.

Figure 14:
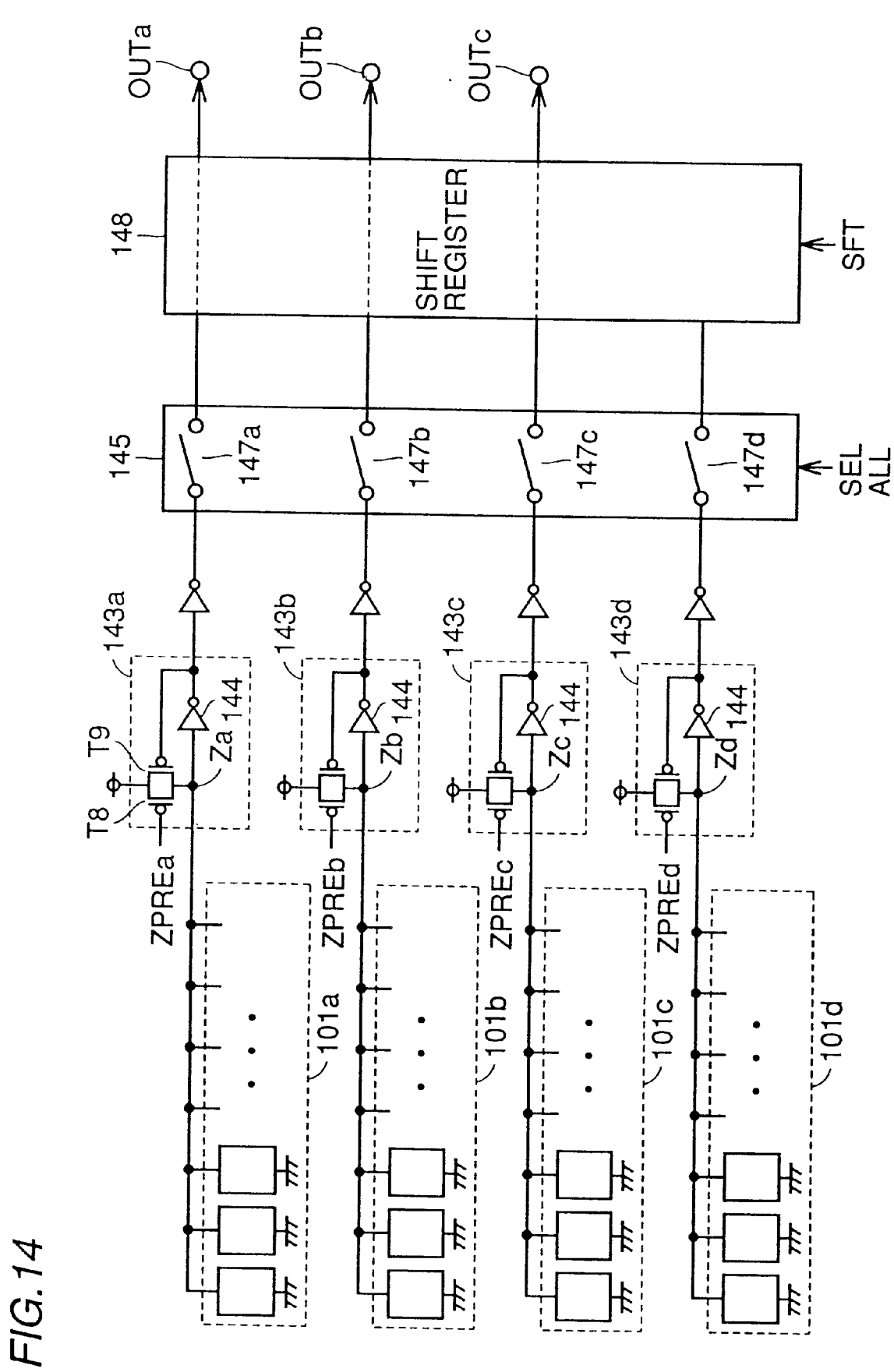
FIGS. 14 and 15 are diagrams for illustrating a circuit structure for removing a faulty programming element.
Figure 15:
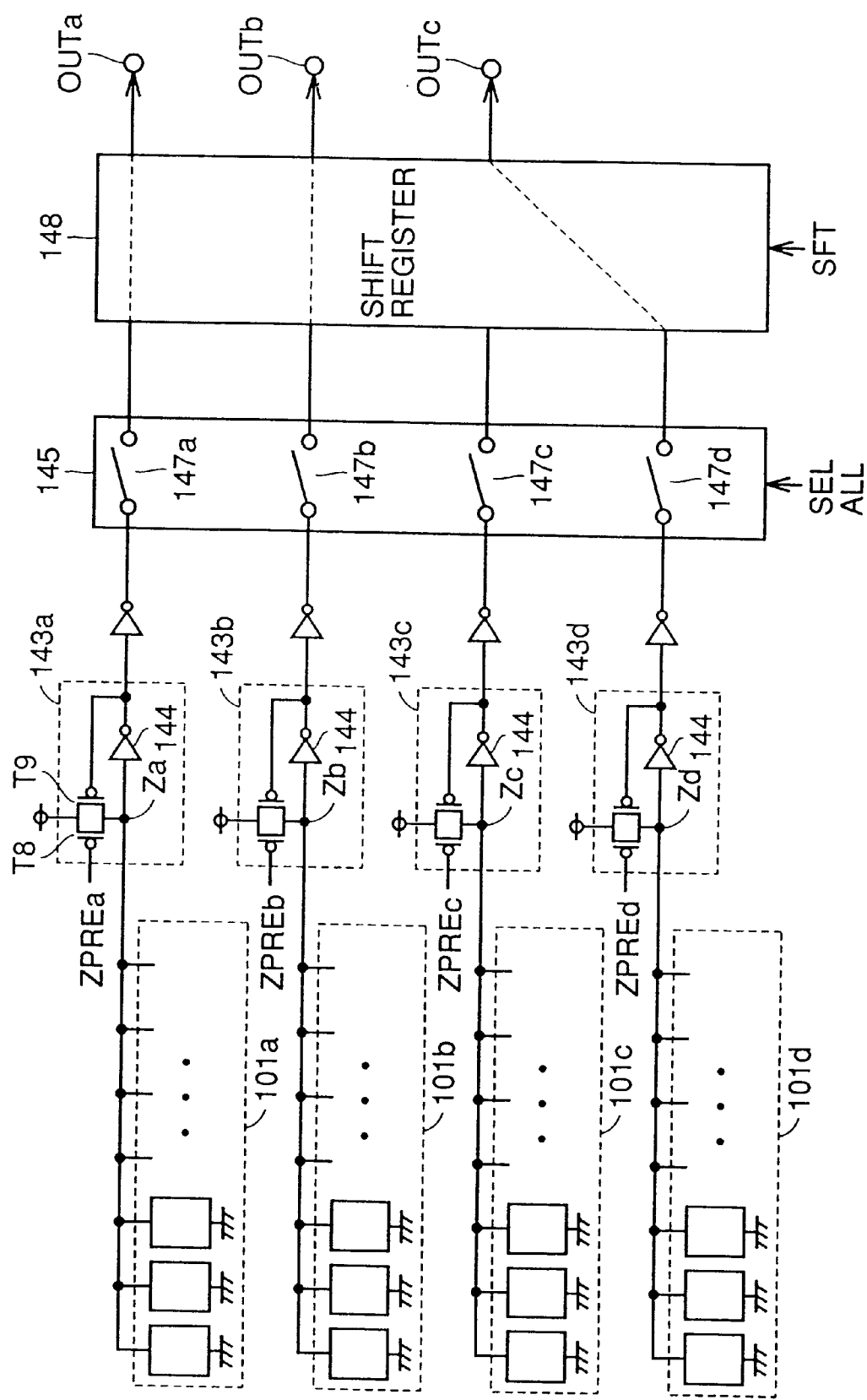

Referring to FIG. 14, a selection circuit 145 is arranged for the common nodes Za to Zd. The selection circuit 145 includes switches 147a, 147b, 147c and 147d. The selection circuit 145 receives a selection signal SEL or an all selection signal ALL. When the all selection signal ALL is input, all switches 147a to 147d are turned on. Thus, respective outputs from the common nodes Za to Zd are transmitted to a shift register 148 described later.

When the selection signal SEL is input, the corresponding one of the switches 147a to 147d is turned on. The voltage of the corresponding common node is transmitted to the shift register 148 described later through the ON-state switch.

The shift register 148 receives the output of the selection circuit 145. The shift register 148 transmits the input signal to output nodes OUTa, OUTb and OUTc in response to a shift signal SFT. Referring to FIG. 14, the switches 147a to 147c are connected with the output nodes OUTa to OUTc respectively.

The case where a failure of the programming element is detected in the program unit 101c shown in FIG. 14 is described with reference to FIG. 15. Referring to FIG. 15, the switches 147a, 147b and 147d excluding the switch 147c are turned on by the selection signal SEL. In response to the shift signal SFT, the shift register 148 connects the switch 147d with the output node OUTc in place of the switch 147c. Consequently, it follows that the program unit 101d operates in place of the program unit 101c. The shift register 148 may have a circuit structure similar to that described later with reference to FIG. 32 and others.

Figure 16:
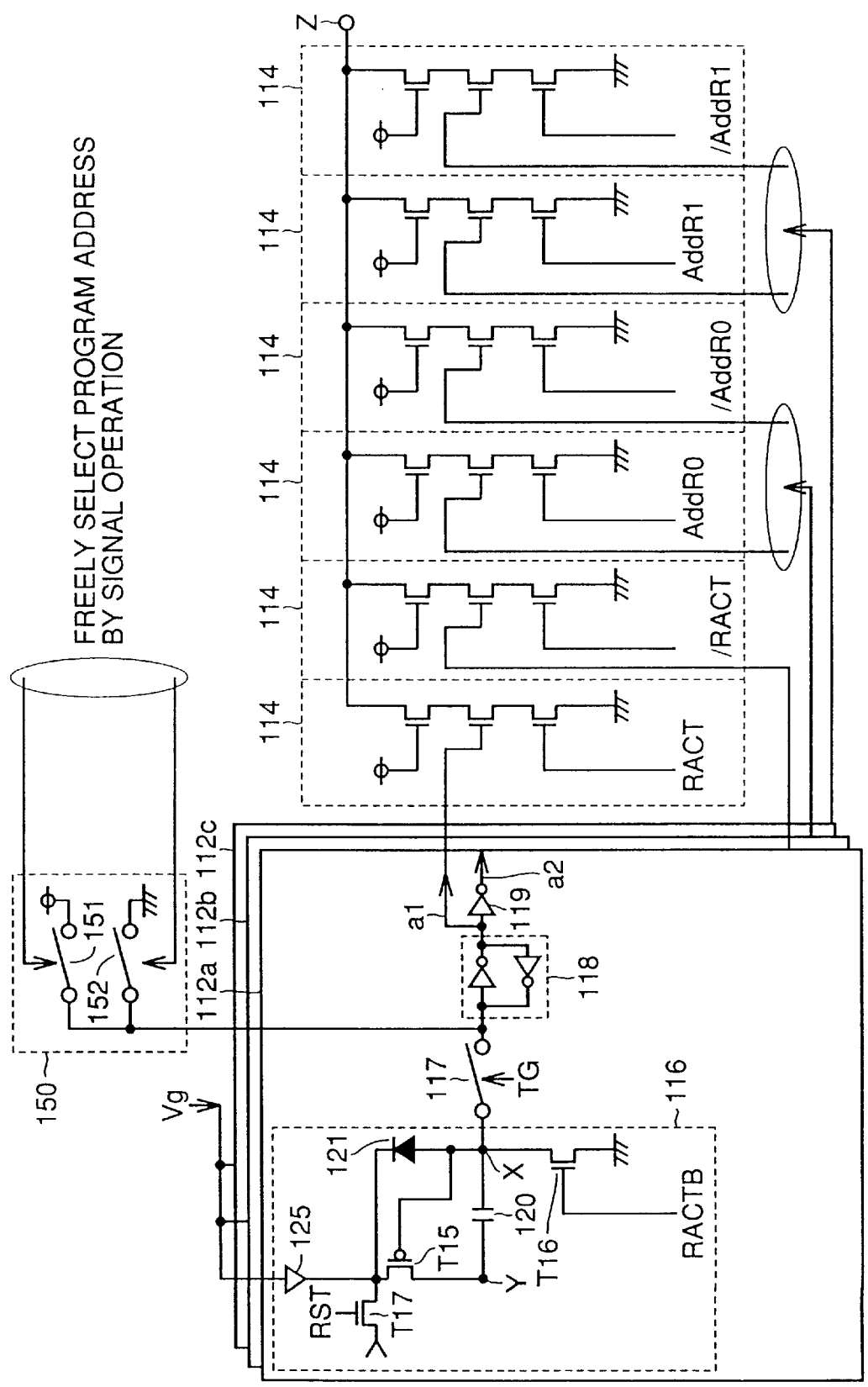
FIG. 16 is a diagram for illustrating the structure of a test circuit for testing spare memory cells.

A circuit structure for testing the spare memory cell is now described with reference to FIG. 16. Referring to FIG. 16, a test circuit 150 is provided for the switch 117. The test circuit 150 includes switches 151 and 152. The switch 151 has a first terminal connected to the node between the switch 117 and the latch 118 and a second terminal connected to the power supply potential. The switch 152 has a first terminal connected to the node between the switch 117 and the latch 118 and a second terminal connected to the ground potential.

The program information latched in the latch 118 can be forcibly rewritten (fixed) by turning on the switch 151 or 152. In other words, a program state can be arbitrarily created regardless of the program state of the electric fuse 120. In order to return the program structure circuit 116 to an unprogrammed state, for example, the switch 152 is turned on. Thus, the spare memory cell can be arbitrarily tested. As to the program recognition circuit 105 deciding precharging, a signal specifying a reset mode is further input in the NAND circuit N3 in order to attain complete nonuse of redundancy.

When the spare memory cell is not tested, both switches 151 and 152 are turned off. In this case, each of the program/latch circuits 112a, 112b, 112c, . . . operates as described above.

Another exemplary program structure circuit is now described with reference to FIG. 17. Each of program/latch circuits 155a, 155b and 155c shown in FIG. 17 includes a program structure circuit 157. The program structure circuit 157 includes a self boost circuit 156 in place of the diode 121.

The self boost circuit 156 includes transistors T25, T26, T27, T28 and T29 and an invertor 157. The transistors T25 and T26 are PMOS transistors, and the transistors T27 to T29 are NMOS transistors. A gate electrode of the transistor T27 and the invertor 157 receive the program address (the bank address signal RACTB or the row address signal AddR). A gate electrode of the transistor T28 receives an output of the invertor 157.

The transistor T25 has a first conducting terminal connected with the power supply voltage and a second conducting terminal connected with a first conducting terminal of the transistor T27 and a gate electrode of the transistor T26. A second conducting terminal of the transistor T27 is connected with the ground potential. The transistor T26 has a first conducting terminal connected with the power supply voltage and a second conducting terminal connected with first conducting terminals of the transistors T26 and T29 and a gate electrode of the transistor T25. The transistor T28 has a second conducting terminal connected with the ground terminal and a gate electrode receiving the output of the invertor 157.

In this case, an NMOS transistor T30 is connected between nodes 125 and Y in place of the transistor T15. The self boost circuit 156 completely transmits the externally input address signal to a gate electrode of the transistor T30.

Figure 17:
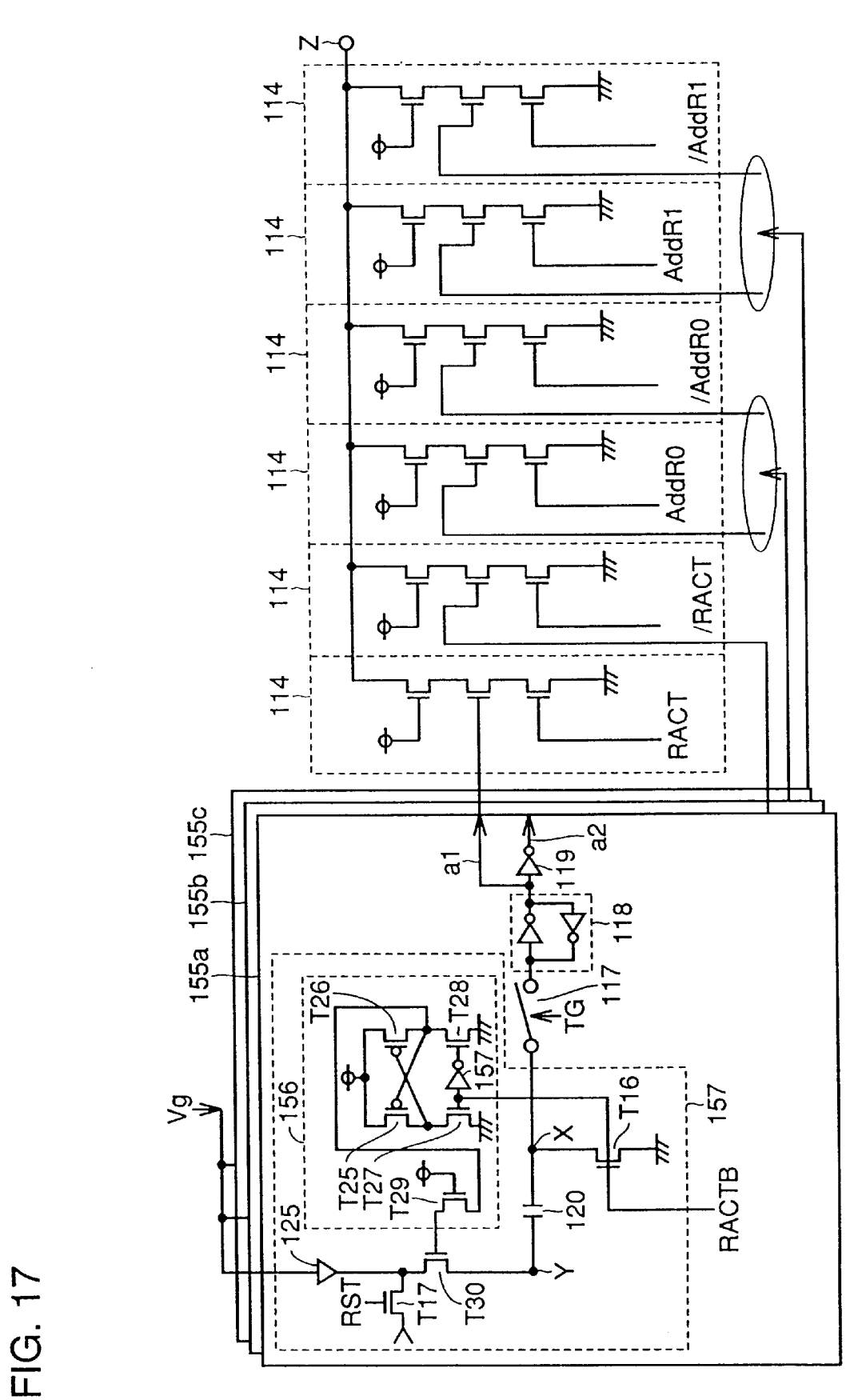
FIG. 17 is a diagram for illustrating an exemplary structure of a program structure circuit.
Figure 18:
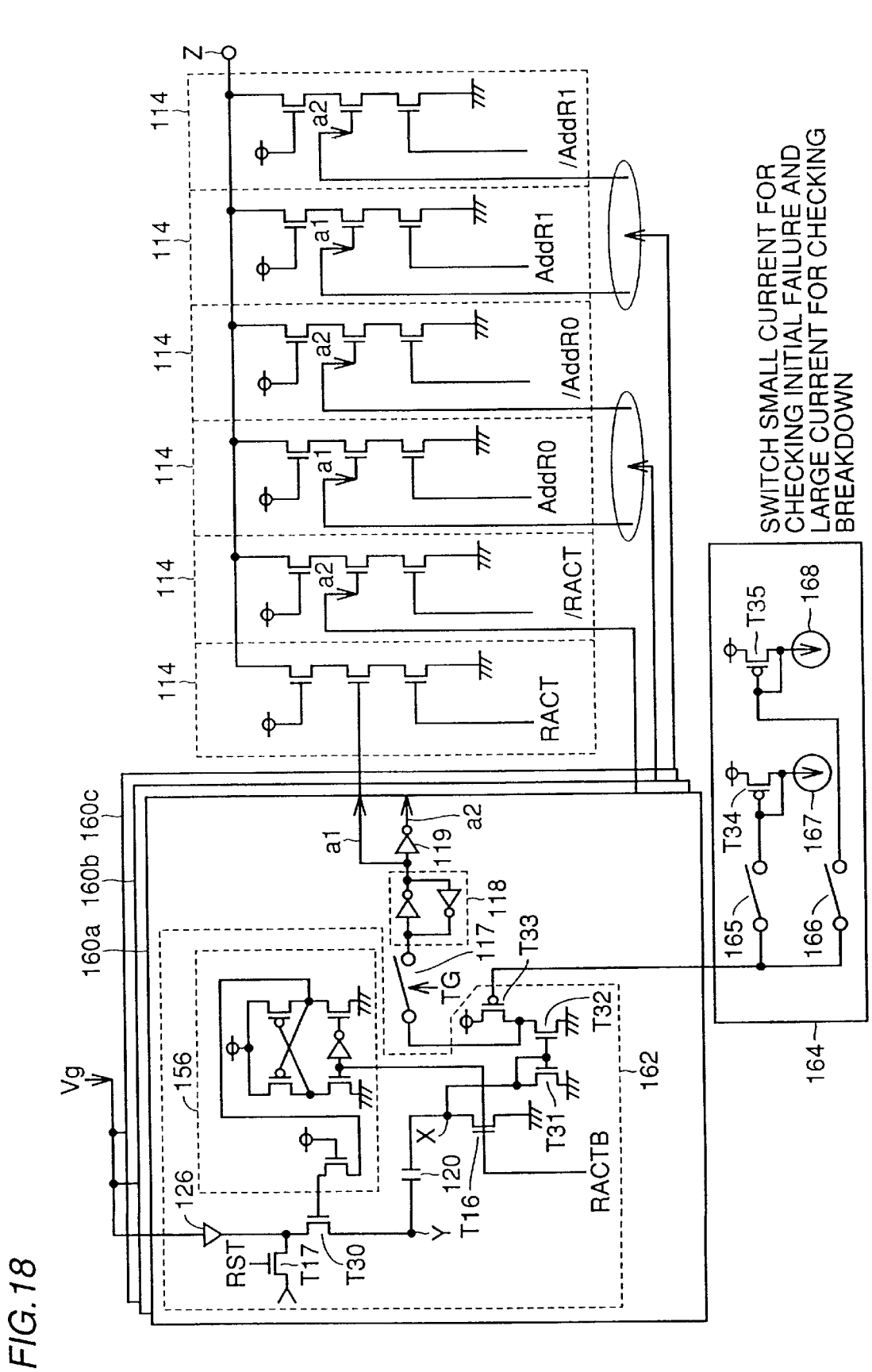
FIG. 18 is a diagram for illustrating a structure for improving detection accuracy for the program state for the structure shown in FIG. 17.

A structure for improving detection accuracy for the program state for the structure shown in FIG. 17 is now described with reference to FIG. 18. Referring to FIG. 18, each of program/latch circuits 160a, 160b and 106c includes a program structure circuit 162. The program structure circuit 162 further includes transistors T31, T32 and T33 in addition to the components of the aforementioned program structure circuit 157. The transistors T31 and T32 are NMOS transistors forming a current mirror circuit. The transistor T31 has a first conducting terminal connected with a node X and a second conducting terminal connected with the ground potential. The transistor T32 has a first conducting terminal connected with a switch 117 and a second conducting terminal connected with the ground potential. The transistor T33 is a PMOS transistor, which is connected between the first conducting terminal of the transistor T32 and the power supply potential. A reference current generation circuit 164 is connected to a gate electrode of the transistor T33.

The reference current generation circuit 164 includes switches 165 and 166, transistors T34 and T35 and constant current sources 167 and 168. The switch 165 is connected between gate electrodes of the transistors T33 and T34. The switch 166 is connected between the gate electrode of the transistor T33 and that of the transistor T35. The transistors T34 and T35 are PMOS transistors. The transistor T34 is connected between the power supply potential and the constant current source 167, and its gate electrode is connected with the constant current source 167. The transistor T35 is connected between the power supply potential and the constant current source 168, and its gate electrode is connected with the constant current source 168.

When turning on the switch 165, the transistor T33 is rendered conductive. Thus, the current (reference current) flowing through the transistor T33 is compared with the quantity of current at the node X. The potential of the node between the transistors T33 and T32 is decided in response to the result of the comparison. Consequently, change of the current at the node X can be detected in high accuracy. Referring to FIG. 18, one of the two constant current sources 167 and 168 supplies a small current for checking the initial failure while the other one supplies a large current for blow confirmation after termination of the program and the read operation. When providing difference between the reference current for blow confirmation and the reference current in the read operation (reference current for blow confirmation>reference current in read operation), a constant current source and a switch are further added to use three reference currents.

Second Embodiment

Figure 19:
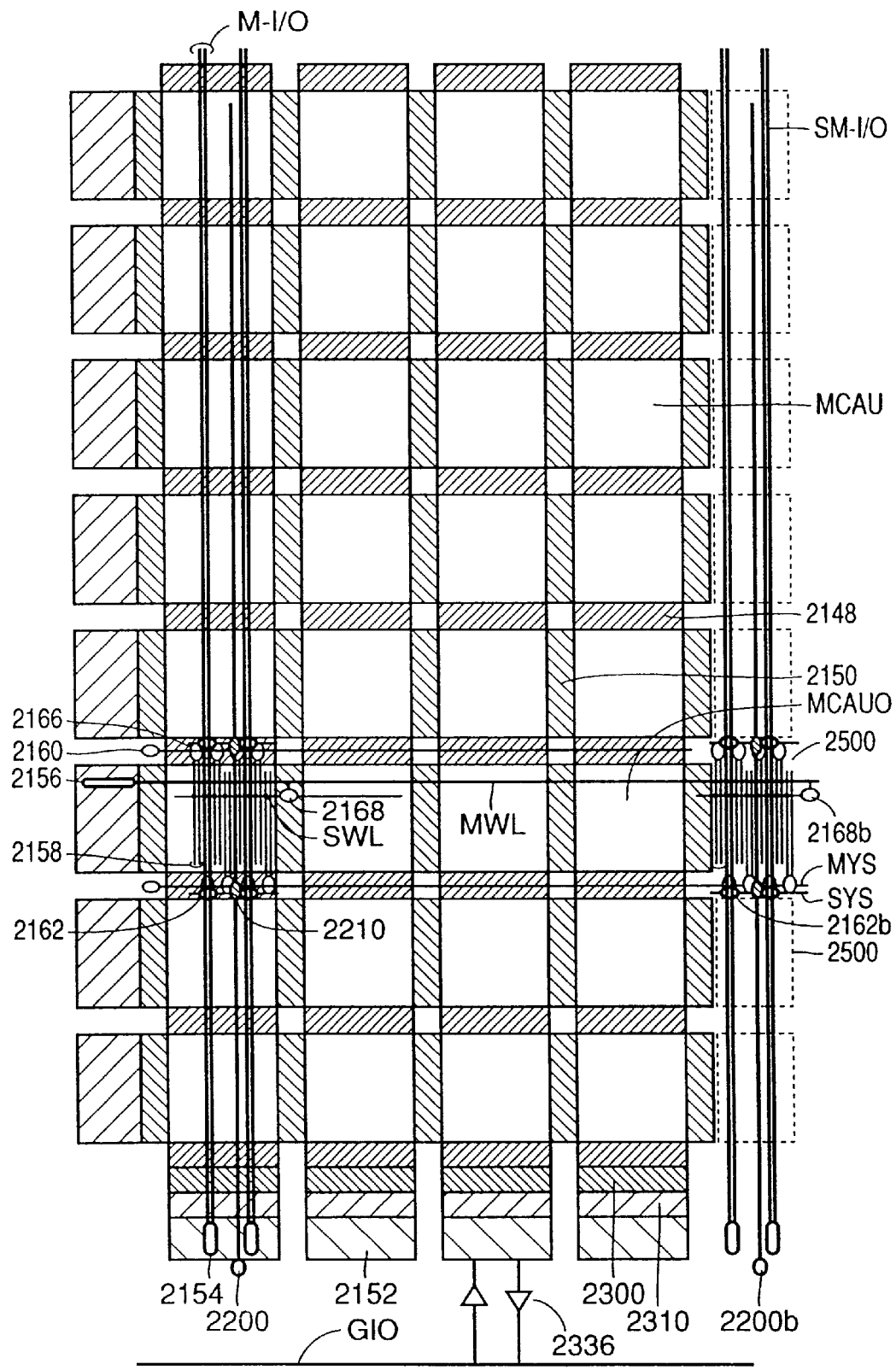
FIG. 19 is a diagram for illustrating an array structure in a second embodiment of the present invention.

An array structure according to a second embodiment of the present invention is now described with reference to FIG. 19. The overall structure of the second embodiment is basically identical to that shown in FIG. 1. A memory cell array shown in FIG. 19 is subdivided into memory cell array units (banks) enclosed with sense amplifier zones 2148 and sub word driver zones 2150. The memory cell array is activated every memory cell array unit. A main row decoder and a main word driver group are provided in correspondence to each row, and an I/O sector 2152 is provided in correspondence to each column.

A main word line MWL is provided over the memory cell array units and activates a corresponding sub word driver. In response to the activation of the sub word driver, a corresponding sub word line SWL is activated. Sense amplifiers are alternately arranged through the memory cell array units. A sense amplifier belonging to an area where a selection line of an activated area (bank) and a sense selection line intersect with each other is activated.

YS lines selecting a column have a hierarchical structure (a main YS line MYS and a sub YS line SYS). The main YS line MYS and the sub YS line SYS are arranged across the sense amplifier zones along the row direction of the memory cell array units.

The main YS line MYS arranged along the row direction and a sub YS decoder 2210 controlled in response to an output from a YS segment driver 2160 activate the sub YS line SYS. Consequently, a gate circuit 2162 selects the column direction, i.e., selectively connects a sense amplifier amplifying the potential levels of a pair of bit lines connected with a selected memory cell and a pair of main data lines M-I/O (I/O stands for input/output). A read line and a write line, which are isolated to be capable of independently transferring read data/write data, are generically referred to as a pair of data lines. The write/read data are sent/received through global data buss GIO (including GIO1 and GIO2) and an interface 2336.

The main YS line MYS and the sub YS line SYS are activated thereby activating an area (bank) where the YS lines MYS and SYS and an activated bank selection line intersect with each other. From the activated area (bank), single data is read every fourth sense amplifier, for example. This read data is transmitted to a read/write amplifier (hereinafter referred to as R/W amplifier) 2154 through the pair of main data lines M-I/O arranged on the memory cell array perpendicularly to word lines. Thereafter the read data is transmitted to the data input/output circuit 15 shown in FIG. 3, for example, through a peripheral circuit or a data bus area. Further, the read data is transmitted to the logic circuit block 1001 in the memory/logic system shown in FIG. 1.

Row system selection is now described. In response to a row address signal, a main word driver 2156 selectively activates the main word line MWL. Then, a sub word driver 2168 is activated. The sub word line SWL is responsively activated so that an access transistor connected to the selected memory cell is rendered conductive. Consequently, data is outputted to a pair of bit lines 2158 provided in correspondence to the selected memory cell row.

Column selection is now described. The segment YS driver 2160 activates the main YS line MYS. The sub YS decoder 2210 activates the sub YS line SYS. Consequently, the corresponding gate circuit 2162 is selectively activated to output read data through the pair of main data lines M-I/O.

A spare row part 2300 which is a row-direction spare structure is arranged on an area separate from the normal banks. The spare row part 2300 includes a spare memory cell row repairing a memory cell row including a faulty memory cell. The memory cell row including the faulty memory cell is repaired by selecting the spare memory cell row in response to program information in a program part 20.

In relation to the column direction, a spare structure is provided in a spare column part 2500 which is separate from the memory cell array units MCAU. The spare column part 2500 includes a spare memory cell column repairing a memory cell column including the faulty memory cell. The memory cell column including the faulty memory cell is repaired in response to the program information in the program part 20.

Referring to FIG. 19, the spare column part 2500 is shown on one side of a memory cell array unit MCAUO. Alternatively, the memory cell array units MCAU may be symmetrically arranged through the spare column part 2500.

In the spare column part 2500, the sub word line SWL is activated in response to a sub word driver 2168b activated in response to activation of the main word line MWL and a bank selection line. A spare YS driver 2200b and a spare sub YS line select the spare memory cell column. A gate circuit 2162b is activated by the spare sub YS line. The gate circuit 2162b selectively connects the spare memory cell column selected in the spare column part with a pair of spare I/O lines SM-I/O.

Read data output from the spare column part 2500 is selectively transmitted to the pair of spare I/O lines SM-I/O in accordance with activation of the gate circuit 2162b. The connection between the pair of main I/O lines, the pair of spare I/O lines and the global data buses is changed in response to a result of spare determination. Spare repair information (program information) for the column system can be stored in the program part 20 similarly to the row system, for example.

The spare sub YS line can be regularly activated regardless of a result of comparison of a repair address and an input address, whereby the speed for access in reading can be increased.

Figure 20:
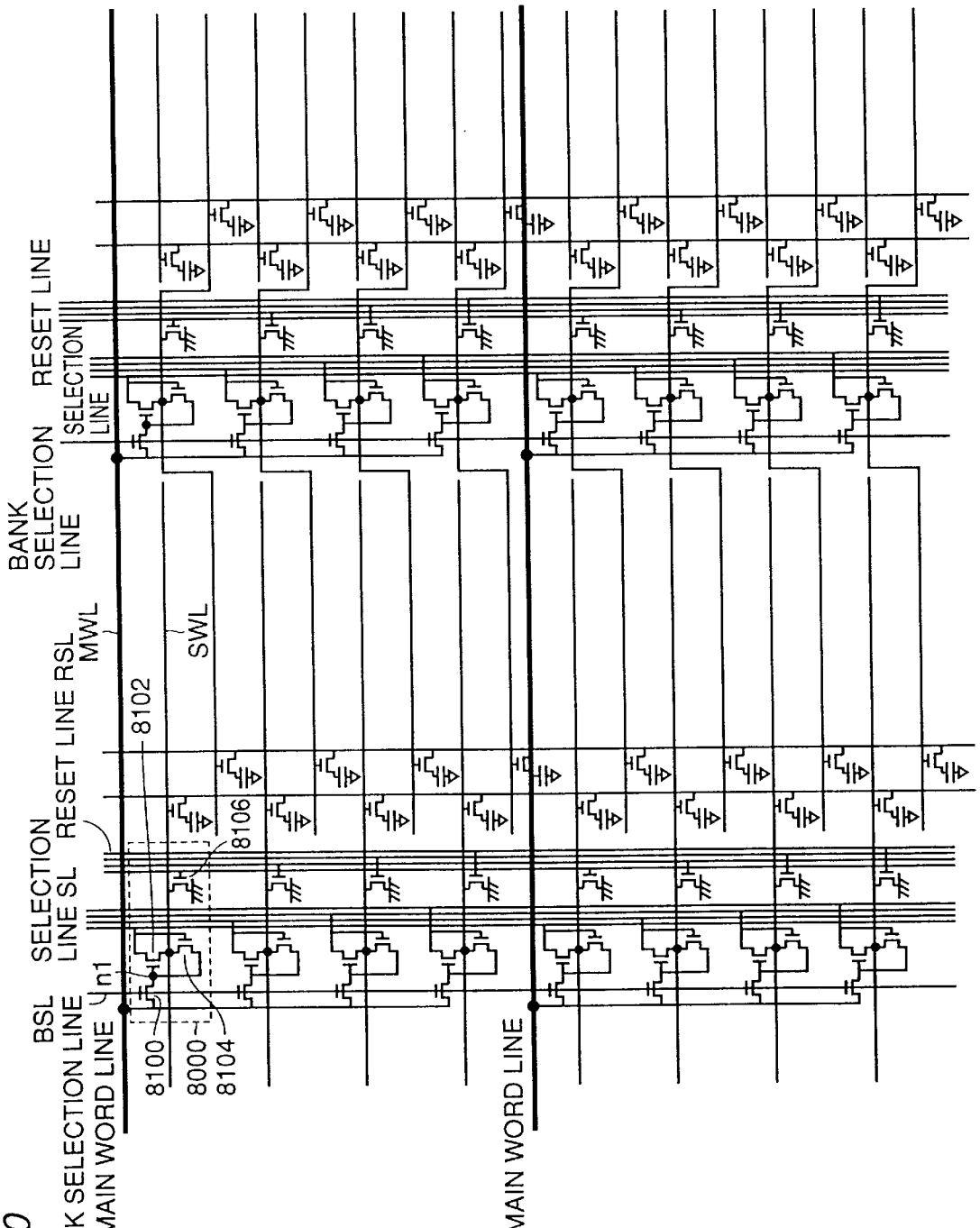
FIG. 20 is a diagram for illustrating a detailed structure of a sub word driver part of a memory cell array shown in FIG. 19.

A detailed structure of the sub word driver part of the memory cell array shown in FIG. 19 is now described with reference to FIG. 20. Referring to FIG. 20, a single main word line MWL controls four sub word lines in each bank. One of four selection lines SL is activated thereby selecting one of the four sub word lines SWL.

A sub word driver 8000 includes a selection transistor 8100 and transistors 8102, 8104 and 8106. The selection transistor 8100 is provided between the main word line MWL and an internal node n1. The transistor 8102, having a gate connected to the node n1, is connected between any one selection line SL and any one sub word line SWL. The transistor 8104 is provided between the sub word line SWL and the node n1, with a gate electrode connected to the selection line SL connected with the transistor 8102. The transistor 8106 is provided between the sub word line SWL and a ground potential, with a gate electrode connected to any one of reset lines RSL. Similar structures are provided for the remaining main word lines MWL and sub word lines.

When the main word line MWL and a bank selection line BSL as well as any one of the selection lines SL are activated, the corresponding sub word line SWL is activated (high potential VPP). When any one of the reset lines RSL is selectively activated, the corresponding sub word line SWL is discharged to the ground potential GND. The selection line SL and the reset line RSL are complementary to each other.

In a standby state, the bank selection line BSL and the selection line SL are at the ground potential GND while the reset line RSL is at a power supply potential VCC.

In activation, the corresponding reset line RSL is set at the ground potential GND for activating (step-up potential VPP) the bank selection line BSL corresponding to the sub word line SWL to be activated. Then, the main word line MWL is activated (VPP). The potential of any one of the selection lines SL is stepped up to the step-up potential level VPP. The voltage of the corresponding sub word line SWL changes to the step-up potential level VPP. After activation of the sub word line SWL, the bank selection line BSL reaches a ground potential VSS and latches the state.

In a reset operation, the bank selection line BSL is set at the power supply potential VCC, and the selection line SL is set at the ground potential GND. Further, the reset line RSL is set at the power supply potential VCC, thereby discharging charges stored in the sub word line SWL. Thus, the sub word driver 8000 can be formed by four transistors (NMOS transistors), for reducing the number of elements.

The main word line MWL is activated by a one-shot pulse signal. In other words, the active state of the main word line is temporarily held by the transistors 8102 and 8104 in the sub word driver 8000 corresponding to the selected word line, and thereafter the main word line is reset. In such a structure, the potential level of the main word line exerts no influence on the sub word driver 8000 unless the bank selection line BSL is activated, also when a plurality of banks are arranged along the main word line direction. Thus, two banks adjacent to each other along the row direction can operate independently of each other.

Figure 21:
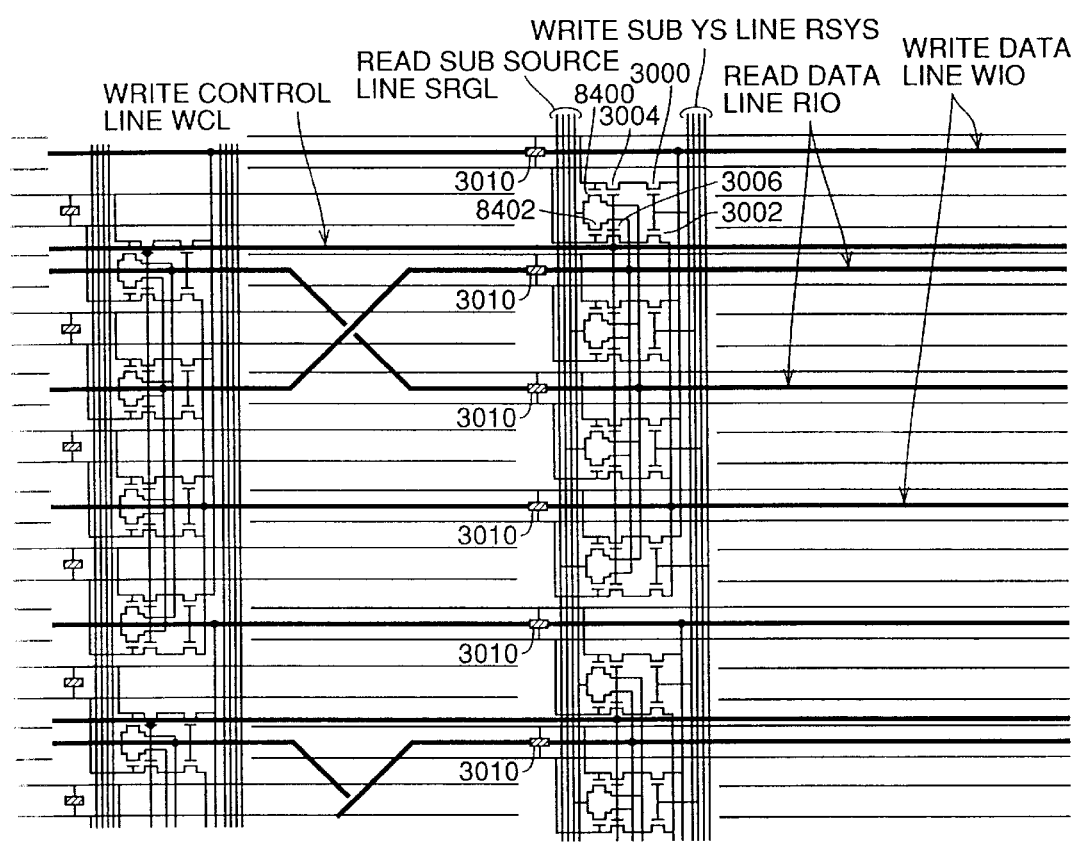
FIG. 21 is a diagram for illustrating an exemplary array structure of a column system in FIG. 19.

The details of the column-system array structure shown in FIG. 19 are now described with reference to FIG. 21. Referring to FIG. 21, data lines are formed by read data lines RIO and write data lines WIO. The read data lines RIO are twisted for reducing noise.

Each sense amplifier circuit part 3010 is selected by a bank address and a sub bank address. The sense amplifier circuit part 3010 is provided with a sense amplifier formed by a cross-coupled structure of a PMOS transistor and an NMOS transistor (not shown) and a equalized transistor equalizing a pair of bit lines.

Referring to FIG. 21, the sense amplifiers are located at central portions between the bit lines. Thus, a read time for reading data from a memory cell to a sense amplifier node is reduced and the speed for equalization can be increased. The sense amplifiers are located at the central portions between the bit lines, for reducing resistance between the sense amplifier nodes and ends of the bit lines.

An input/output node of the sense amplifier circuit part 3010 is connected with gate electrodes of read gate transistors 8400 and 8402 respectively. Sources of the transistors 8400 and 8402 are selectively set at the ground potential by a read sub source line SRGL. Drains of the transistors 8400 and 8402 are connected to the corresponding read data lines RIO respectively.

A read sub source line SRGL layering read source lines is employed for a read operation. The potential of the read sub source line SRGL is decided by AND logic of a selected column bank address and a main YS line deciding from which one of the four sense amplifier circuit parts 3010 to read data. If prescribed range specification is necessary, AND processing is performed inclusive of a signal indicating the range specification.

In this case, the sources of the transistors 8400 and 8402 are selectively set at the ground potential by the read sub source line SRGL. The sources of the transistors 8400 and 8402 are driven from a precharge level to the ground potential level, thereby taking a read gate structure transmitting data to the read data lines RIO.

A write sub YS line RSYS layering write YS lines is employed for a write operation. The potential of the write sub YS line RSYS is decided by AND logic of the selected column bank address and a main YS line deciding in which one of the four sense amplifiers to write data. If range specification is necessary, the potential level of the write sub YS line RSYS is decided by AND logic inclusive of a signal indicating the range specification.

Then, transistors 3000, 3002, 3004 and 3006 are operated. The transistors 3000 and 3002 are rendered conductive by the write sub YS line RSYS. First conducting terminals of the transistors 3000 and 3002 are connected with the corresponding write data line WIO respectively. Gate electrodes of the transistors 3004 and 3006 are connected with a write control line WCL. The transistor 3004 is connected between the sense amplifier circuit part 3010 and a second conducting terminal of the transistor 3000. The transistor 3006 is connected between the sense amplifier circuit part 3010 and a second conducting terminal of the transistor 3002.

When the transistors 3004 and 3006 are rendered conductive by the write control line WCL, it follows that data of the write data line WIO is transmitted to the sense amplifier circuit part 3010.

The transistors 3004 and 3006 are transfer gates for performing a write mask operation. In a normal state, the write control line WCL is precharged at a high level, thereby turning on the transistors 3004 and 3006. Thus, data is written in the selected sense amplifier circuit part 3010 in accordance with the write sub YS line RSYS. When performing the write mask operation terminating the data write operation in the sense amplifier circuit part 3010, the write control line WCL is changed to a low level. Thus, the aforementioned operation is forcibly stopped. The write mask operation and the write driver structure are described later in detail.

Contrarily to the aforementioned technique, it is also possible to terminate data writing in the sense amplifier 3010 regardless of the write sub YS line RSYS by precharging the write control line WCL to a low level (turning off the transistors 3004 and 3006) in a normal state and enable the write operation by changing the write control line WCL to a high level at a necessary timing.

Figure 22:
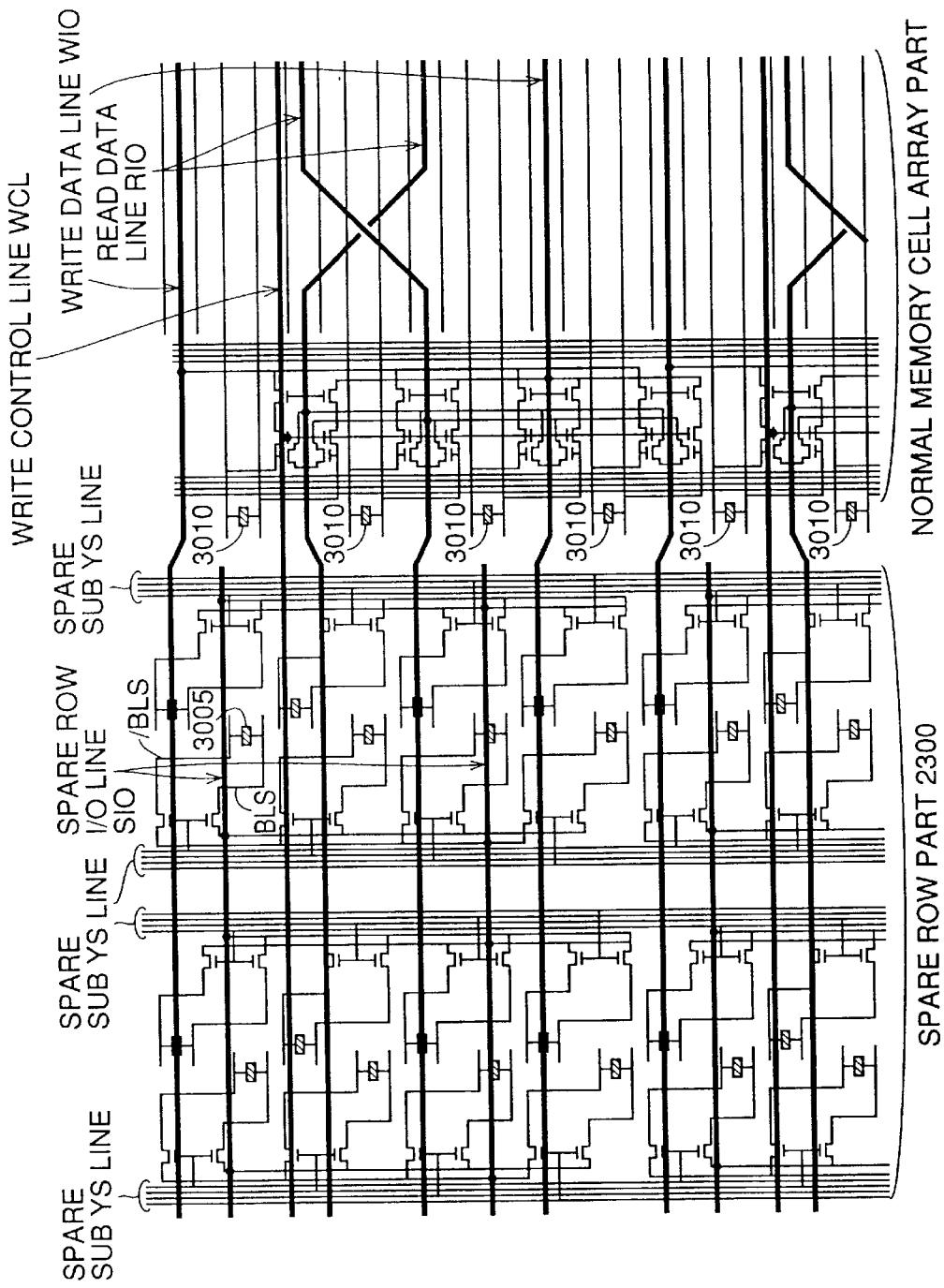
FIG. 22 is a diagram for illustrating the structure of a spare row part 2300 shown in FIG. 19.

The details of the structure of the spare row part 2300 shown in FIG. 19 are now described with reference to FIG. 22. In the structure shown in FIG. 22, a pair of read data lines RIO in a normal memory cell array part are repetitively twisted to reach an end portion of the array. A sense amplifier 3005 is arranged on the spare row part 2300 as a storage element. A pair of spare bit lines BLS and /BLS are provided for the sense amplifier 3005.

The sense amplifier 3005 is connected with a data I/O line SIO through a transistor turned on/off by the spare sub YS line. The pair of spare bit lines BLS and /BLS, which are short with extremely small resistance and capacitance, have relatively strong drivability for the sense amplifier 3005. Therefore, the spare row part 2300 takes not the aforementioned read gate structure but an I/O common structure using the data I/O line SIO for the read/write operation.

By forming data input/output lines independently of the normal memory cell array part, parasitic capacitance and parasitic resistance of the data input/output lines can be reduced thereby enabling control in a short time. Consequently, the drivability for the sense amplifier 3005 can be relatively strengthened.

Even in first reading after bank activation, for example, the sense amplifier 3005 can increase the potential difference between the pair of bit lines at a high speed due to the small bit line capacitance. Even if an input/output node of the sense amplifier is connected with the data I/O line SIO while the potential difference is not yet sufficiently increased, no influence is exerted on the potential of the input node of the sense amplifier due to the small parasitic capacitance of the data I/O line SIO. Also in relation to the write mask operation, it follows that the transfer gates controlled by the write control line WCL may not be serially connected but driving of the write driver on the array end portion may be terminated to bring the data I/O line SIO into a floating state.

In order to prevent the sense amplifier node from a malfunction in the write mask operation immediately after bank activation, the timing for activating the sub YS line in the spare row part 2300 is delayed as compared with that for activating the sub YS line in the normal memory cell array part. Also in this case, the timing margin is large due to the small parasitic capacitance of the data I/O line SIO.

Figure 23:
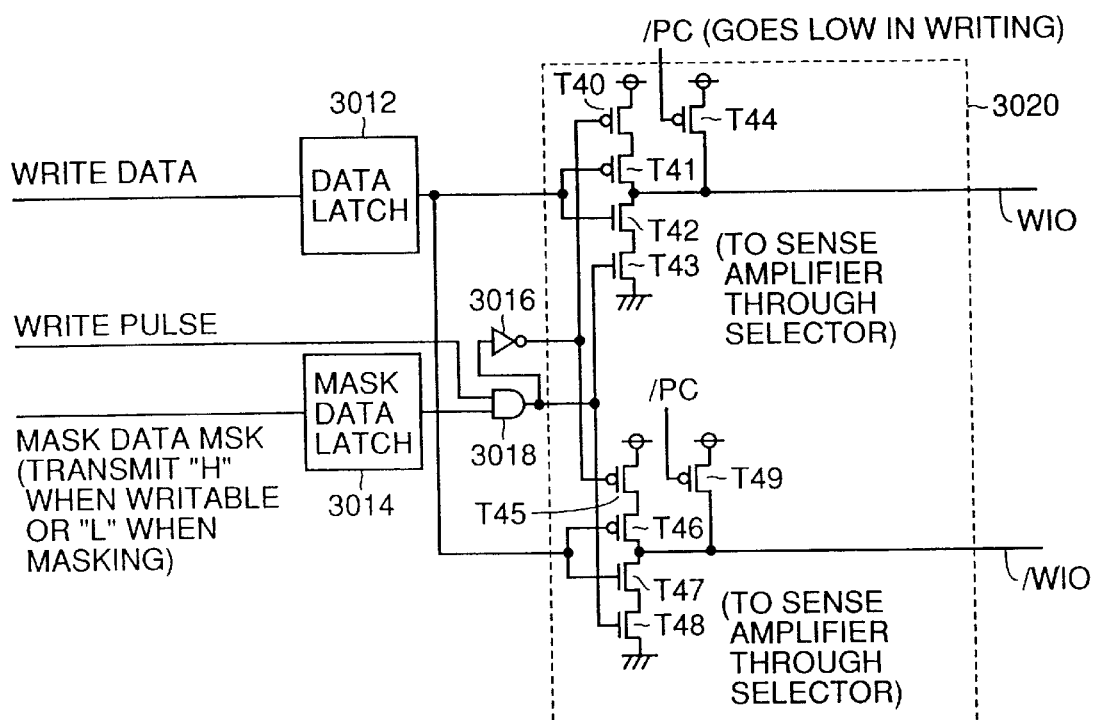
FIG. 23 is a diagram for illustrating a circuit structure for inactivating a write driver in a write mask operation.

A circuit structure for inactivating the write driver in the write mask operation is now described with reference to FIG. 23. The structure shown in FIG. 23 is arranged on the array end portion. Data transmitted from the write global data bus GIO2 is written in a pair of write data lines WIO and /WIO through a write driver 3020 shown in FIG. 23. The write data lines WIO and /WIO are connected to the sense amplifier through selectors (not shown) respectively.

A data latch 3012, a mask data latch 3014, an invertor 3016 and an AND circuit 3018 are arranged for the write driver 3020. The data latch 3012 latches write data transmitted from the global data bus GIO2. The mask data latch 3014 latches mask data MSK. The mask data MSK is set high when writable, or set low in the write mask operation. The AND circuit 3018 receives a write pulse and an output of the mask data latch 3014. The invertor 3016 inverts an output of the AND circuit 3018.

The write driver 3020 includes transistors T40 to T44 and T45 to T49. The transistors T40, T41, T44, T45, T46 and T49 are PMOS transistors. The transistors T42, T43, T47 and T48 are NMOS transistors.

The transistor T44 is connected between the power supply potential and the write data line WIO, with a gate electrode receiving a precharge signal /PC. The transistor T49 is connected between the power supply potential and the write data line /WIO, with a gate electrode receiving the precharge signal /PC. The precharge signal /PC is set low in the write operation. The precharge signal precharges the write data lines at the power supply potential.

The transistors T40 to T43 are serially connected between the power supply potential and the ground potential. Gate electrodes of the transistors T41 and T42 receive an output of the data latch 3012. The transistors T45 to T48 are serially connected between the power supply potential and the ground potential. Gate electrodes of the transistors T46 and T47 receive the output of the data latch 3012. The node between the transistors T41 and T42 is connected to the write data line WIO. The node between the transistors T46 and T47 is connected to the write data line /WIO.

Gate electrodes of the transistors T40 and T45 receive the output of the invertor 3016. Gate electrodes of the transistors T43 and T48 receive the output of the AND circuit 3018.

The write data and the mask data MSK are simultaneously held in the data latch 3012 and the mask data latch 3014 at the same timing respectively. The write pulse is transmitted in the same cycle as these data. The write driver 3020 is inactivated due to input of the write pulse. Thus, it follows that data writing in the pair of write data lines is forcibly terminated.

The write driver 3020 may be slightly activated due to racing between the write pulse and the mask data MSK. When completely inhibiting the write driver from activation, therefore, the write pulse is made to arrive after the mask data latch 3014 holds the mask data MSK.

Figure 24:
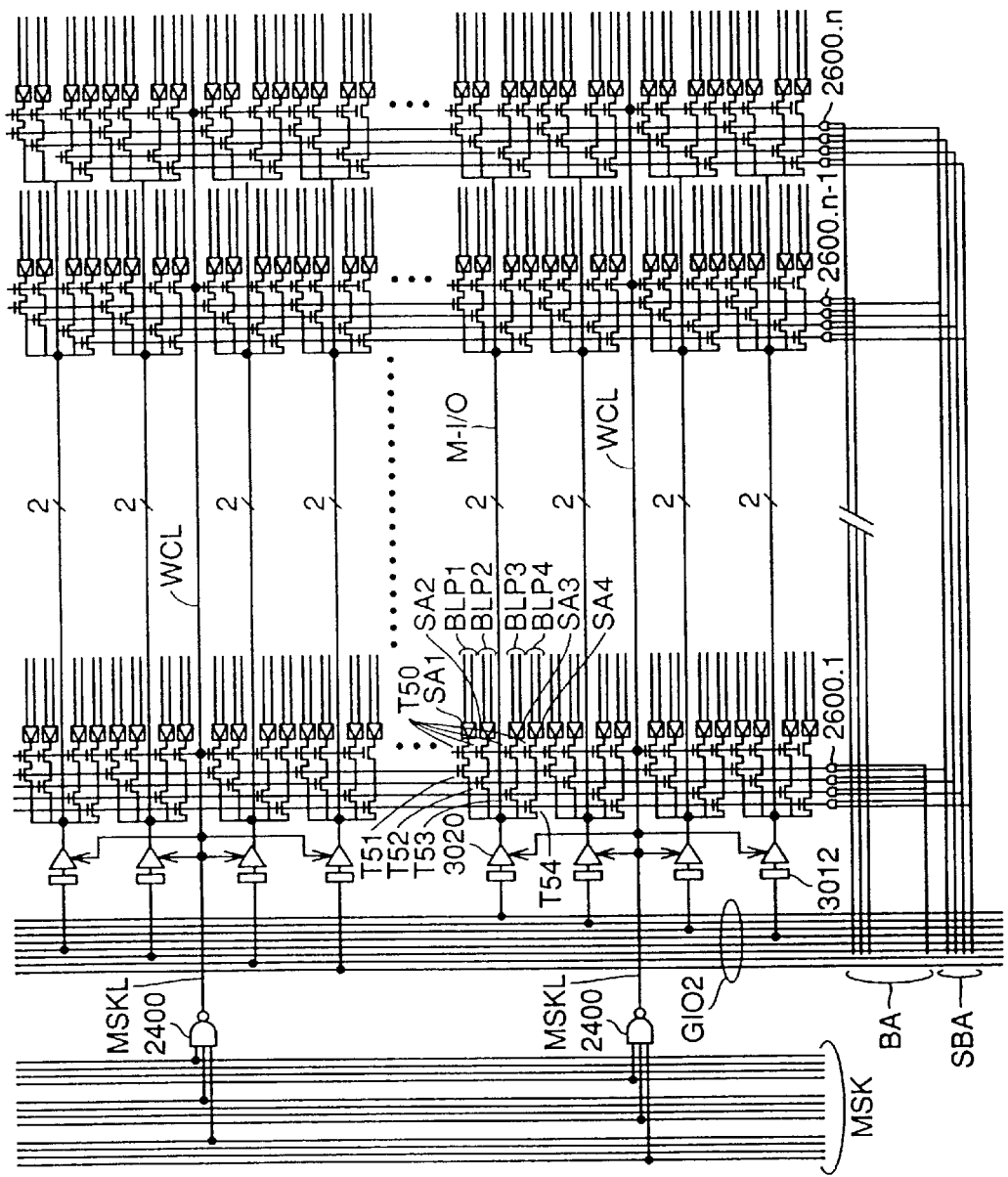
FIG. 24 is a diagram for illustrating the structure of a memory cell array end portion related to the write mask operation.

The structure of a memory cell array part related to the write mask operation is now described with reference to FIG. 24. FIG. 24 shows only a write system. No spare system is shown in FIG. 24 either.

Referring to FIG. 24, four pairs of bit lines BLP1 to BLP4 and sense amplifiers SA1 to SA4 connected with these pairs of bit lines respectively are arranged as a single repeating unit. The sense amplifier SA1 is connected with the write driver 3020 through transistors T50 and T51. The sense amplifiers SA2, SA3 and SA4 are connected with the write driver 3020 through the transistor T50 and a transistor T52, the transistor T50 and a transistor T53 and the transistor T50 and a transistor T54 respectively. The transistor T50 is turned on/off by the write pulse of a low level received from the write control line WCL.

As described above, the write driver 3020 is connected with the write global data bus GIO2 through the data latch 3012. Decoders 2600.1 to 2600.n (n: natural number) decode a bank address signal BA and a sub bank address signal SBA. Any one of the sense amplifiers SA1 to SA4 is connected with the write driver 3020 in response to decode signals from the decoders 2600.1 to 2600.n.

A NAND circuit 2400 receives the mask data MSK. The NAND circuit 2400 is connected with a write mask line MSKL. The write driver 3020 is inactivated by the voltage level (i.e., by the mask data) of the write mask line MSKL.

In the normal state, the state of the main I/O line M-I/O or the write data line changes on the basis of the write data latched in the data latch 3012. In the write mask operation, on the other hand, the write driver 3020 is inactivated in accordance with the write mask data MSK. At the same time, the aforementioned write control line WCL turns off the array side transfer gates.

The structure of electric fuses in the second embodiment of the present invention is now described. According to the second embodiment of the present invention, the electric fuses serving as programming elements have a memory cell structure.

Figure 46:
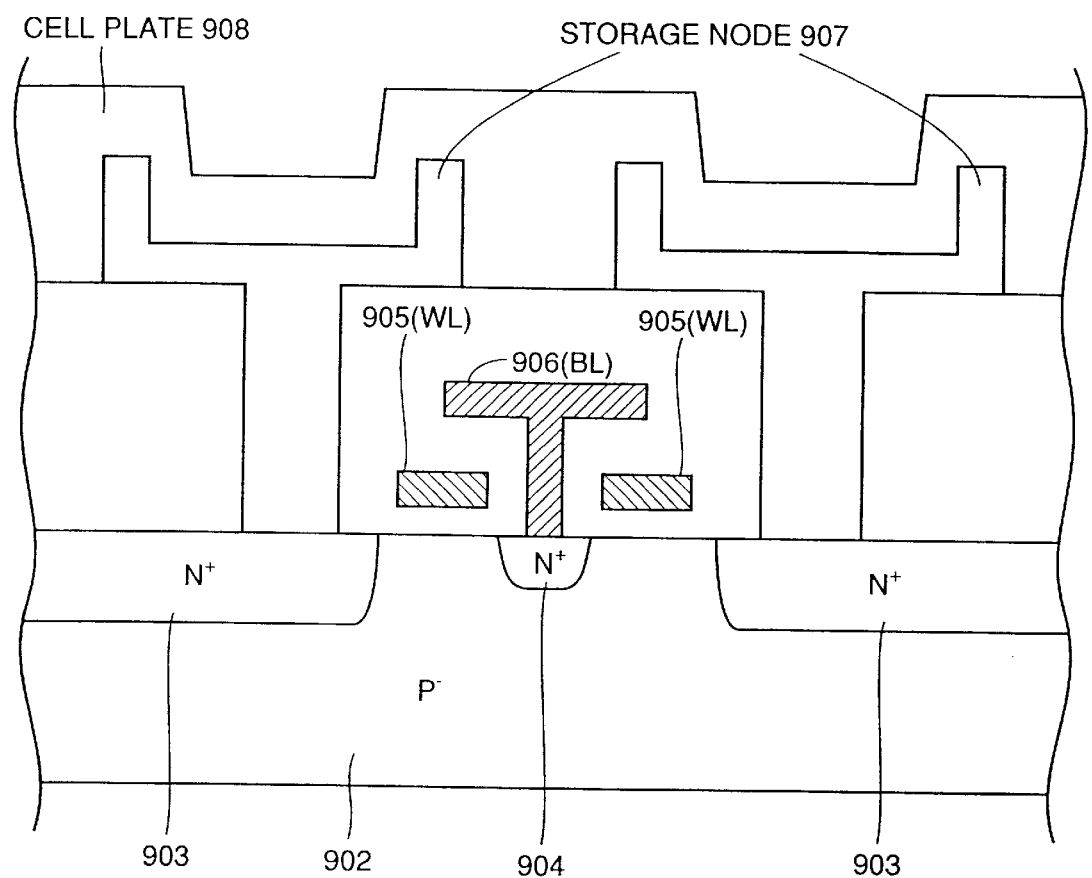
FIG. 46 is a sectional view for illustrating the memory cell structure.

The memory cell structure is now described with reference to FIG. 46. Referring to FIG. 46, a P well 902 is formed on a major surface of a substrate. N-type impurity regions 903 and 904 are formed on a major surface of the P well 902 at a prescribed interval. The N-type impurity regions 903 and 904 form a pair of source/drain regions in a memory cell transistor. A wire 906 (bit line BL) is formed to be electrically connected with the impurity region 904. Gate electrodes 905 (word lines WL) are formed above the impurity regions 903 and 904 through an insulator film. Each memory cell transistor 900 shown in FIG. 45 is formed by a pair of source/drain regions (the impurity regions 903 and 904) and the gate electrodes 905 formed above the pair of source/drain regions.

Storage nodes 907 are formed to be electrically connected to the impurity regions 903. A cell plate 908 is formed on the storage nodes 907 through a dielectric. Each memory cell capacitor 901 shown in FIG. 45 is formed by the pair of storage nodes 907, the cell plate 908 and the dielectric.

Figure 25:
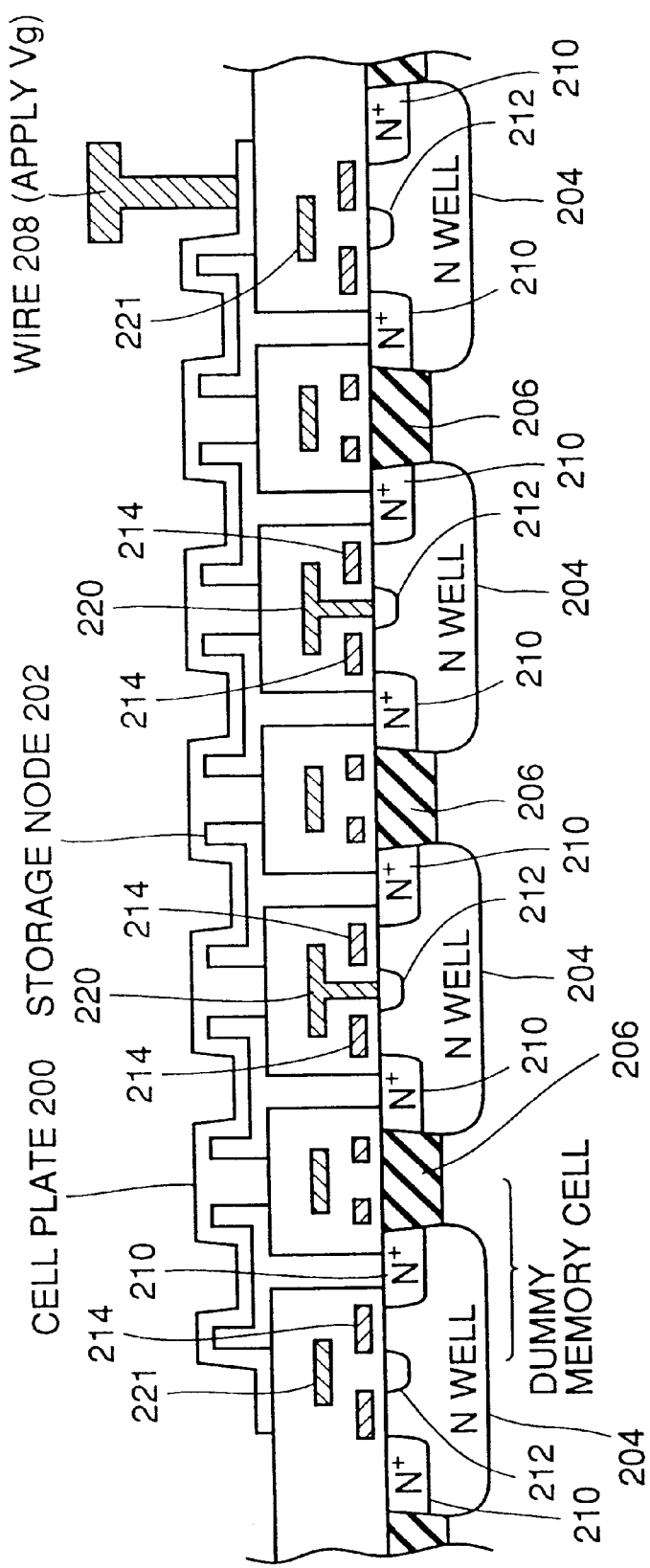
FIG. 25 is a sectional view for illustrating the structure of electric fuses in the second embodiment of the present invention.

The structure of the electric fuses according to the second embodiment of the present invention is now described with reference to FIG. 25. Referring to FIG. 25, N wells 204 are formed on a major surface of a substrate at prescribed intervals. Trench isolation members 206 are formed between the N wells 204. N-type impurity regions 210 and 212 are formed on major surfaces of the N wells 204 at prescribed intervals. The N-type impurity regions 210 and 212 correspond to pairs of source/drain regions in memory cells. The N wells 204 and the impurity regions 210 and 212 are at the same potential (in the case of memory cells, P wells 902 are formed in place of the N wells 204 as described above).

Wires (corresponding to bit lines) 220 are formed to be electrically connected with the impurity regions 212. Wires (corresponding to word lines) 214 are formed above the impurity regions 210 and 212 through an insulator film. Storage nodes 202 are formed to be electrically connected with the impurity regions 210. A cell plate 200 is formed on the storage nodes 202 through a dielectric.

The storage nodes 202 and the cell plate 200 correspond to memory cell capacitors. Programming elements formed by the storage nodes 202 and the cell plate 200 are used as the electric fuses. A wire 208 applies a program voltage Vg to the cell plate 200. The wire 208 is shared by a plurality of programming elements. For example, a low-level voltage is supplied to the wires 220 shown in FIG. 25, thereby setting the storage nodes 202 at a low potential. The wire 208 applies a high voltage to the cell plate 200. Thus, the electric fuses can be selectively blown (programmed).

Dummy memory cells are arranged at prescribed intervals, in order not to break the memory cell shape. Wires 221 for the dummy memory cells are not connected with the N-type impurity regions 212. In the dummy memory cells, the cell plate 200, the storage nodes 202 and the word lines 214 are at the same potential.

Another use of the memory cell capacitor structure is described with reference to FIG. 26. The memory cell structure, which is utilized as a power-to-GND decoupling capacitor in FIG. 26, can be freely utilized as a capacitor between arbitrary two nodes in practice. When utilized as the power-to-GND decoupling capacitor, two capacitors are serially connected to prevent end nodes of the memory cell capacitor structure part from application of an electric field exceeding the withstand voltage of the capacitor.

Figure 26:
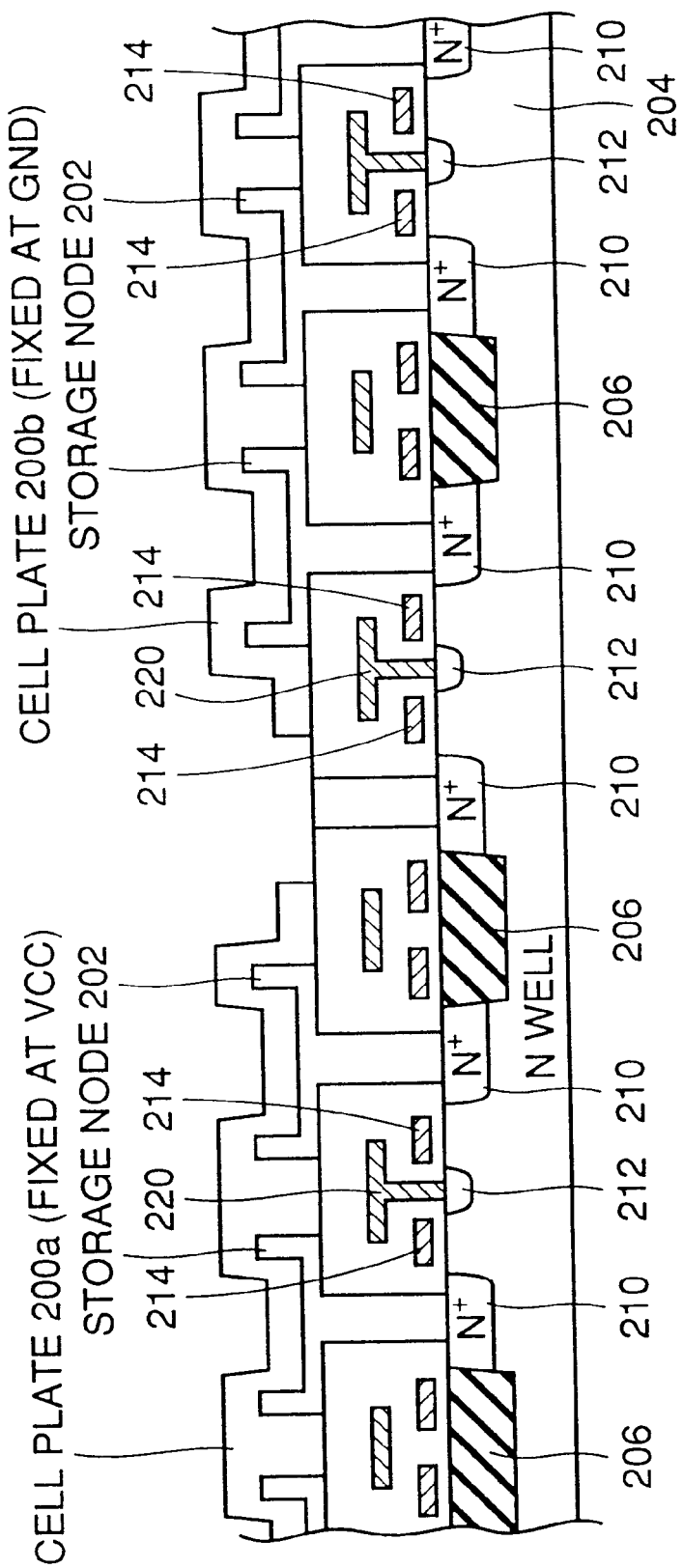
FIG. 26 is a sectional view for illustrating another exemplary use of a memory cell structure.

As shown in FIG. 26, a substrate for nodes (corresponding to the source/drain regions) on active layer sides of the capacitors is formed by the N well 204, and nodes 210 and 212 on the active layer sides and the N well 204 are electrically set at the same potential.

In the structure shown in FIG. 26, a plurality of memory cell capacitor structure parts sharing a cell plate 200a and a plurality of memory cell capacitor structure parts sharing a cell plate 200b are serially connected. The cell plate 200a is set at a power supply potential VCC. The cell plate 200b is set at the ground potential GND.

At this time, the N well 204 electrically reaches the intermediate potential between the power supply potential VCC and the ground potential GND. In order to prevent the memory cell capacitor structure parts from application of a high potential, the intermediate potential is supplied to the N well 204. For example, a voltage of ½VCC is supplied from wires 220 corresponding to bit lines. The intermediate potential may be ½VCC.

Wires corresponding to word lines are set at the power supply potential VCC, to be utilized as channel capacitors. Wires 214 serving as gate parts of NMOS transistors are provided on the N well, whereby efficiency of the capacitors can be improved.

Thus, it follows that two programming elements corresponding to memory cell capacitors are serially connected between the power supply potential VCC and the ground potential GND (decoupling capacitor). Thus, voltage resistance is improved as compared with a single memory cell capacitor.

The structure shown in FIG. 26 is usable also as programming elements. In this case, a high voltage is applied to the cell plate 200a. On the other hand, the cell plate 200b is supplied with the ground potential GND or brought into a floating state in accordance with a program address.

Each of the structures shown in FIGS. 25 and 26 can be readily embedded in an area having no transistors or under a wire. While no wires can be generally formed on laser-blown fuses, wires can be formed on electric fuses when employing the memory cell capacitor structure for the electric fuses.

While a general decoupling capacitor is formed by a MOS capacitor, the decoupling capacitance can be increased while reducing the area by forming the decoupling capacitor in the three-dimensional memory cell structure shown in FIG. 26.

Third Embodiment

Figure 28:
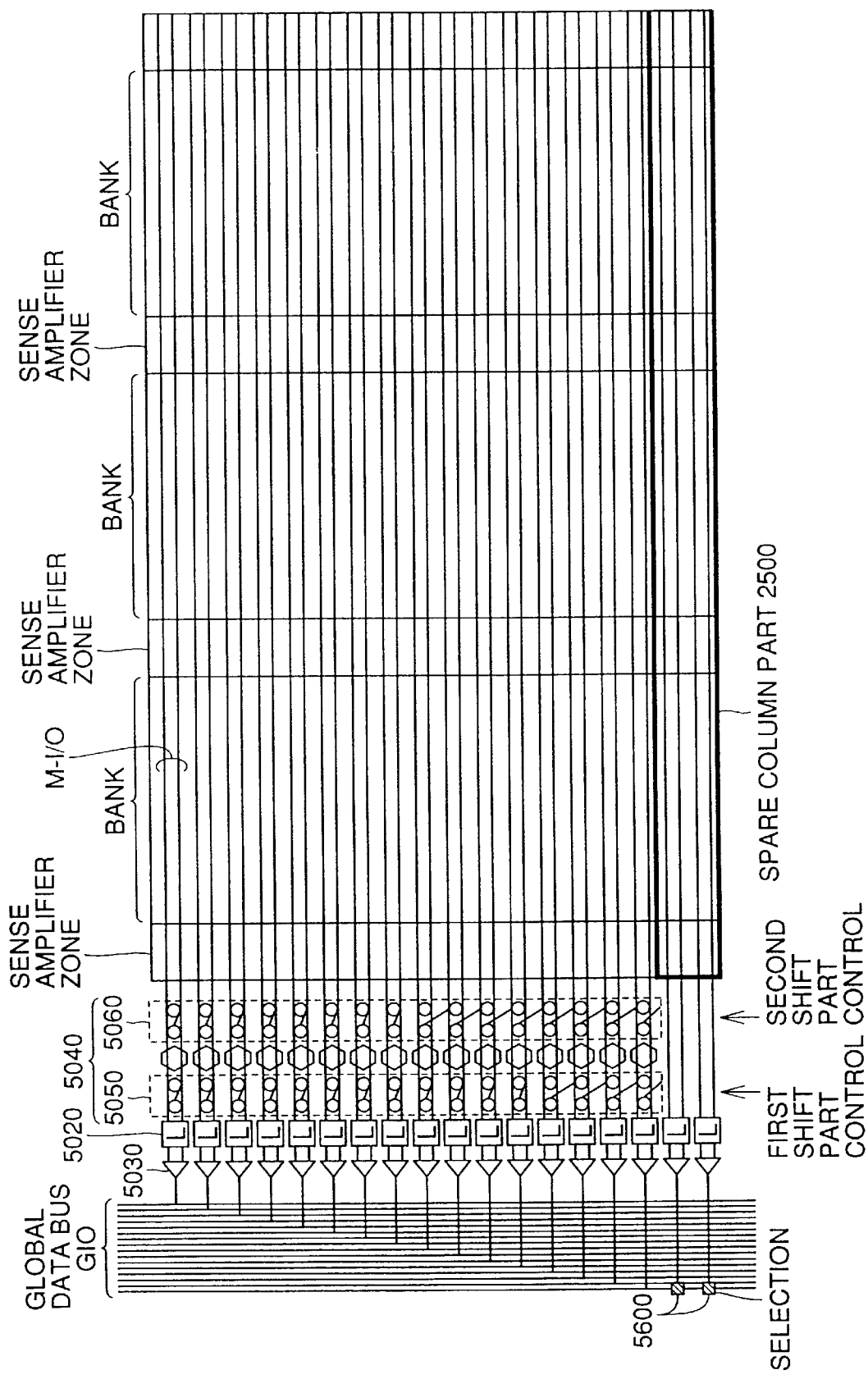
FIG. 28 is a diagram for illustrating column-system spares in a third embodiment of the present invention.

Column-system spares are described with reference to a third embodiment of the present invention. FIG. 28 is a diagram for illustrating the column-system spares according to the third embodiment of the present invention. Referring to FIG. 28, replacement in a column direction is performed by shift-setting data lines.

A first shift part 5050 and a second shift part 5060 are controlled independently of each other. The first shift part 5050 and the second shift part 5060 sequentially switch connection between pairs of main I/O lines M-I/O and global data buses GIO. In other words, this embodiment has a shift redundancy structure. Data read on the main I/O lines respectively are held in latches 5020 through a shift part 5040 (the first and second shift parts 5050 and 5060). The data of the latches 5020 are transmitted to any of the corresponding global data buses GIO by amplifiers 5030 provided in correspondence to the latches 5020 respectively.

Selection circuits 5600 selectively connect drivers 5030 corresponding to a spare column part 2500 to the global data buses GIO. In this structure, no shift operation is performed but the selection circuits 5600 are used with respect to spare I/O lines.

The shift part 5040 disconnects pairs of main I/O lines corresponding to a faulty memory cell column from the latches 5020. Spare I/O lines in the spare column part 2500 are connected to the global data buses GIO by the number of the pairs of main I/O lines corresponding to the faulty memory cell column.

Figure 29:
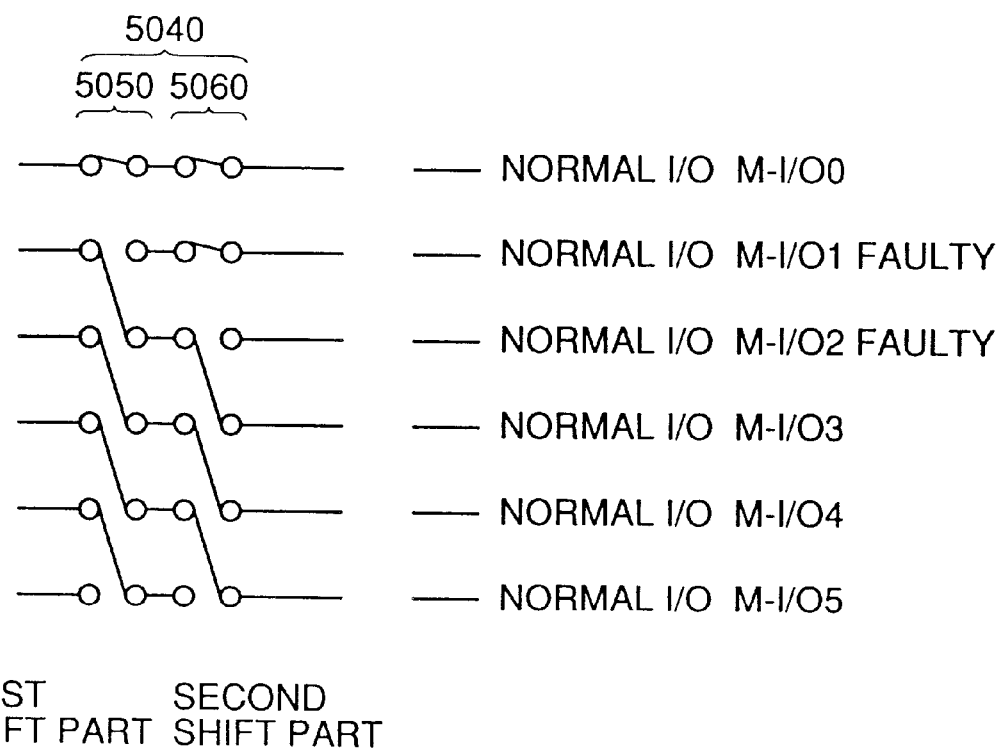
FIG. 29 is a conceptual diagram for illustrating operations performed when failures are detected in two portions of pairs of main I/O lines.

For example, operations in the case where failures are detected in two pairs of main I/O lines are described with reference to FIG. 29. In the example shown in FIG. 29, memory cells corresponding to pairs of main I/O lines M-I/O1 and M-I/O2 among pairs of normal main I/O lines M-I/O0 to M-I/O5 are faulty. In this case, the first shift part 5050 and the second shift part 5060 perform shift operations respectively, so that the two pairs of main I/O lines M-I/O1 and M-I/O2 are not connected to the global data buses GIO. In substitution, the pair of main I/O lines M-I/O3 are connected with the global data bus having been connected with the pair of main I/O lines M-I/O1. Further, the pair of main I/O lines M-I/O4 are connected with the global data bus having been connected with the pair of main I/O lines M-I/O2. Following this, the remaining pairs of main I/O lines are also sequentially shifted by the shift parts, to be connected with the global data buses. Thus, pairs of main I/O lines corresponding to faulty memory cells are not connected with the data buses but spare replacement can be performed. In this case, it follows that two spare I/O lines are connected to the global data buses.

Thus, data read from the faulty memory cells, for example, are not output to the data buses. On the other hand, it follows that data to be repaired by the spare column part 2500 are output to the global data buses GIO through the pair of spare I/O lines.

When YS lines (column selection lines) are in a hierarchical structure, spares can be efficiently used due to the aforementioned structure. Shift operations can be independently controlled every YS line of the hierarchical structure, whereby spare I/O lines can compensate for data in all hierarchical I/O lines (when shifting the whole, inconvenience may result in boundary portions between the hierarchical I/O lines).

Figure 30:
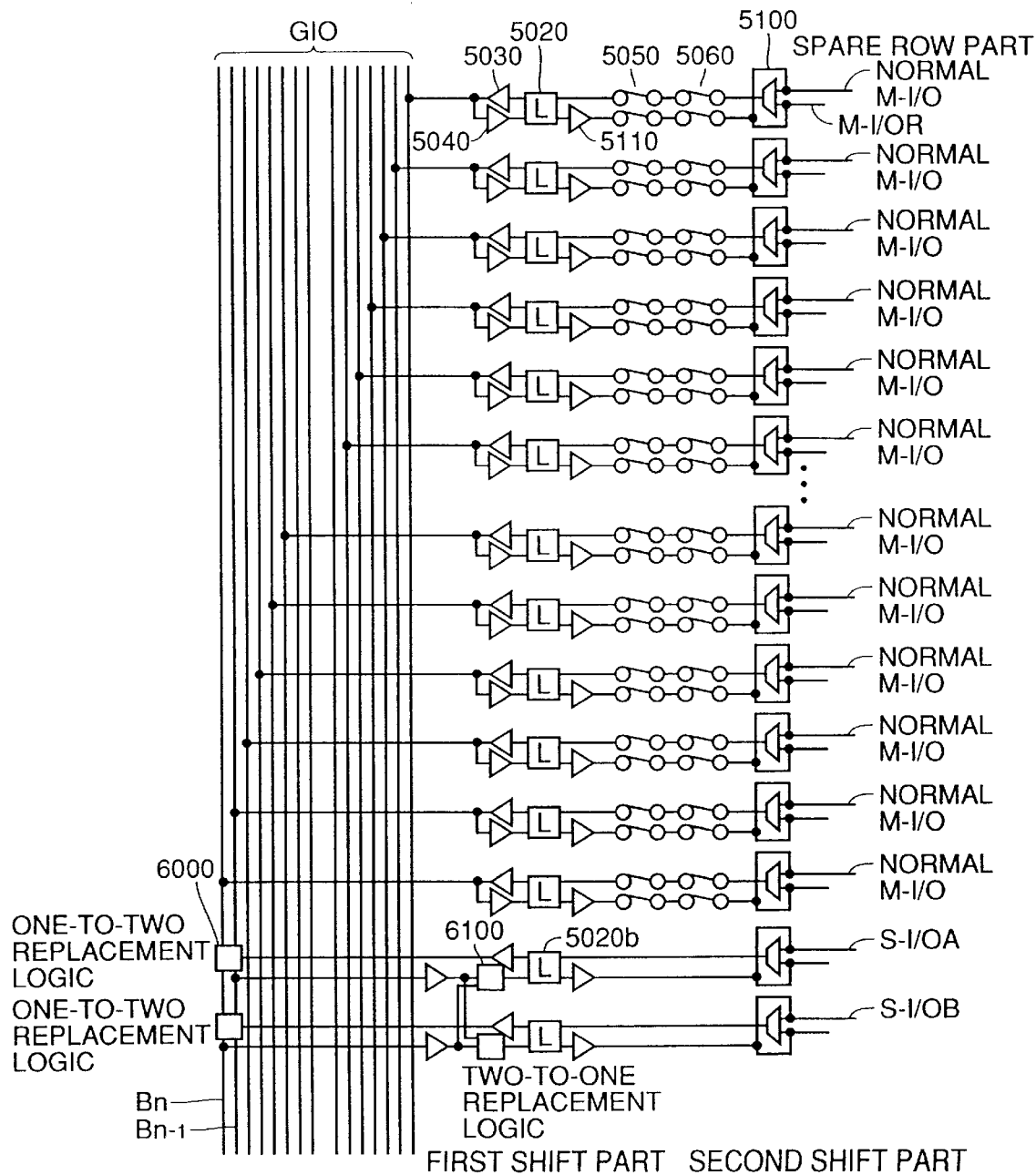
FIG. 30 illustrates another exemplary shift redundancy structure.

Another exemplary shift redundancy structure is described with reference to FIG. 30. The structure shown in FIG. 30 is different from that shown in FIG. 29 in the following points: First, multiplexers 5100 are arranged for pairs of normal main I/O lines M-I/O. Each multiplexer 5100 selectively supplies data from the pair of normal main I/O lines M-I/O or data from a pair of I/O lines M-I/OR in a spare row part 2300 to a latch 5020. An amplifier 5030 outputs the data fetched in the latch 5020 to a global data bus GIO.

Further, a multiplexer 5100 is arranged for each pair of spare I/O lines S-I/OA or S-I/OB in a spare column part 2500. The multiplexer 5100 selects data from the pair of spare I/O lines or the pair of I/O lines M-I/OR in the spare row part.

The multiplexer 5100 holds a spare determination result related to a row direction. If the spare determination result indicates normal use, the multiplexer 5100 recognizes the normal use when accessing a bank in column access, and selectively outputs the data of the pair of normal main I/O lines to the latch 5020. When the spare determination result indicates spare use, on the other hand, the multiplexer 5100 recognizes the spare use when accessing the bank in the column access, and selectively outputs the data read from the spare row part 2300 to the latch 5020.

As to the pair of normal main I/O lines, access is made regardless of the spare determination result in an initial stage of the access operation, while whether to continue or terminate the access is decided by output of the spare determination result.

In a write operation, an amplifier 5040 receives data of the global data bus GIO and thereafter the latch 5020 fetches the data. In response to the data fetched in the latch 5020, a write driver 5110 drives the pair of normal main I/O lines M-I/O. The write driver 5110 drives the pair of I/O lines M-I/OR in the spare row part at the same time.

On the basis of the spare determination result in the row direction held as a flag, whether to activate a YS line of a normal memory cell array part and write data or to stop activating the YS line of the normal memory cell array part and connect the same to a row of the spare row part for writing data is decided. As to the spare row and a pair of I/O lines on the spare row, if a flag for a bank subjected to column access indicates spare use, a sub YS line corresponding to the spare is activated in response to the flag holding the spare determination result for a row address and the bank in column access.

For the spare I/O lines, no shift parts are present but replacement logic circuits 6000 and 6100 for replacement of connection with the global data buses are provided. The normal main I/O lines are shifted by the shift redundancy structure (two-stage shifting), whereby lines located on endmost parts of the pairs of normal main I/O lines are disconnected from global data buses Bn and Bn-1. At this time, the replacement logic circuits 6000 and 6100 connect the pairs of spare I/O lines S-I/OA and S-I/OB serving as column direction spares to the global data buses Bn and Bn-1.

In a read operation, the two pairs of spare I/O lines transmit data to latches 5020b. The replacement logic circuits 6000 and 6100 decide whether or not to connect the corresponding latches 5020b to the global data buses on the basis of the spare determination result. When setting either pair of I/O lines to be already replaced with a pair of main I/O lines of another bank, replacement must be performed with the remaining pair of spare I/O lines. Thus, repair can be performed with the same spares between different banks, whereby the degree of freedom of repair with the spares is improved while reducing the number of spares arranged in the overall unit and the yield is improved.

The spare I/O lines can replace faulty portions in units of sub YS lines, whereby repair can be made in units of pairs of bit lines. Thus, the yield is improved While FIG. 30 shows two stages of shift parts, the shift parts may be provided in three stages, for example.

Figure 31:
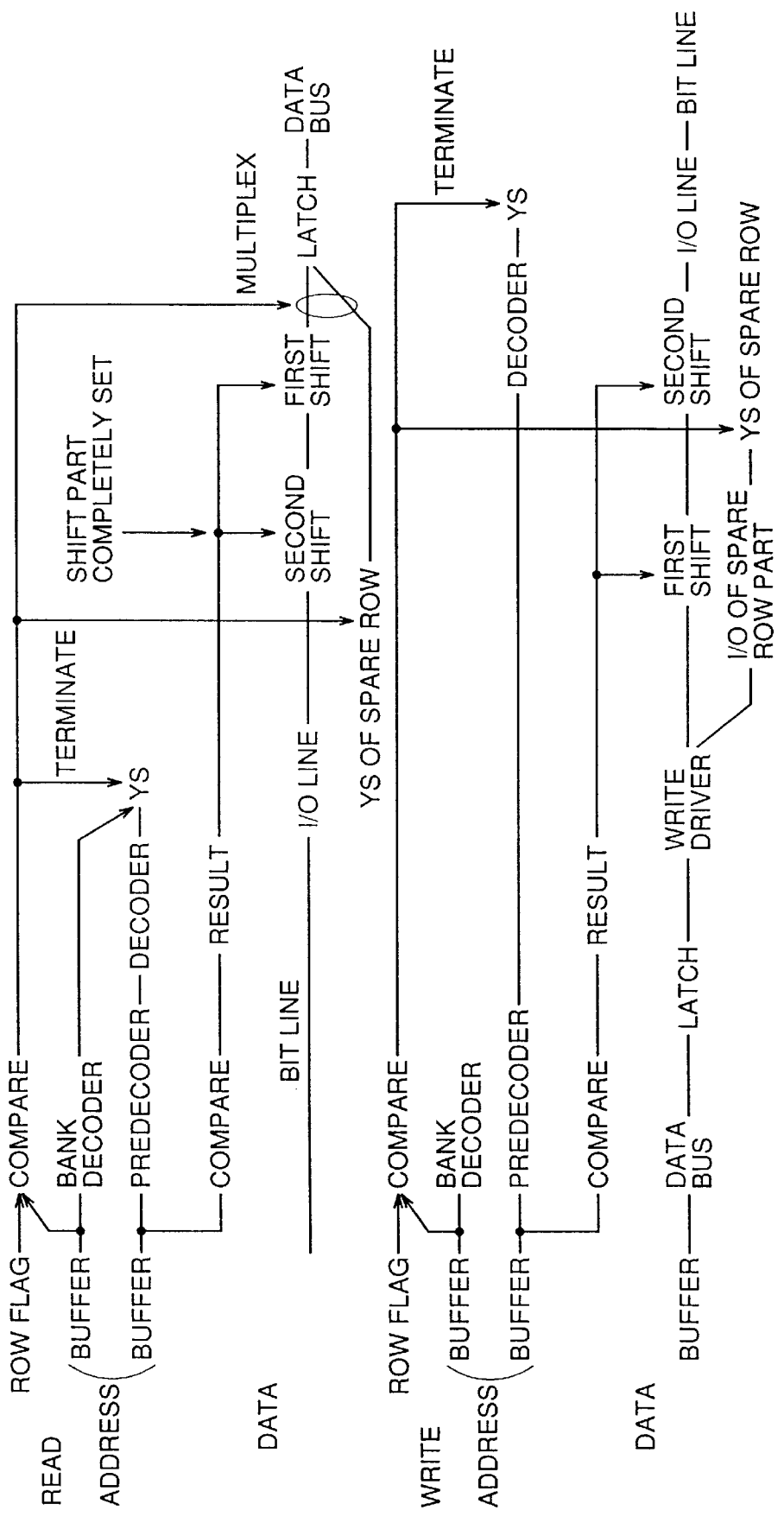
FIG. 31 is a flow chart for illustrating operations of a circuit shown in FIG. 30 in detail.

Operations of the circuit shown in FIG. 30 are now described in detail with reference to FIG. 31. Referring to FIG. 31, an input row address and a faulty row address (program address) are compared in the read operation. In parallel with this, a bank address and a row address are decoded. In the normal memory cell array part, a signal YS for column selection is generated on the basis of the results of the decoding.

On the other hand, an input column address and a faulty column address (program address) are compared. When a spare column I/O line corresponding to a spare column is selected in response to the result of the comparison, column selection in the normal memory cell array part with the signal YS is terminated. Further, the shift part is completely set so that the second shift part 5060 performs a shift operation and then the first shift part 5050 performs a shift operation.

Then, the multiplexer 5100 selectively supplies either data read from the spare row part 2300 or that fetched from a spare I/O to a data bus DBS.

In the write operation, a supplied row address is compared with a faulty row address. In parallel with this, a bank address and a column address are decoded. Further, a supplied column address is compared with a faulty column address. In parallel with this, write data is transmitted to the latch 5020 through the data bus DBS, and amplified by the write driver 5110. Thus, the write data is transmitted to the shift part 5040 and the pair of I/O lines in the spare row part.

When a spare row is selected in response to the comparison of the row address and the faulty row address, the column selection signal YS of the spare row part is activated and column selection for the normal memory cell array part is terminated.

When the pair of spare I/O lines are selected in response to the result of comparison of the column address and the faulty column address, on the other hand, the first shift part 5050 performs a shift operation and then the second shift part 5060 performs a shift operation. Thus, data is written in the normal memory cell array part by the pair of normal main I/O lines M-I/O and data is written in the spare column part 2500 by the pair of spare I/O lines S-I/O.

Figure 32:
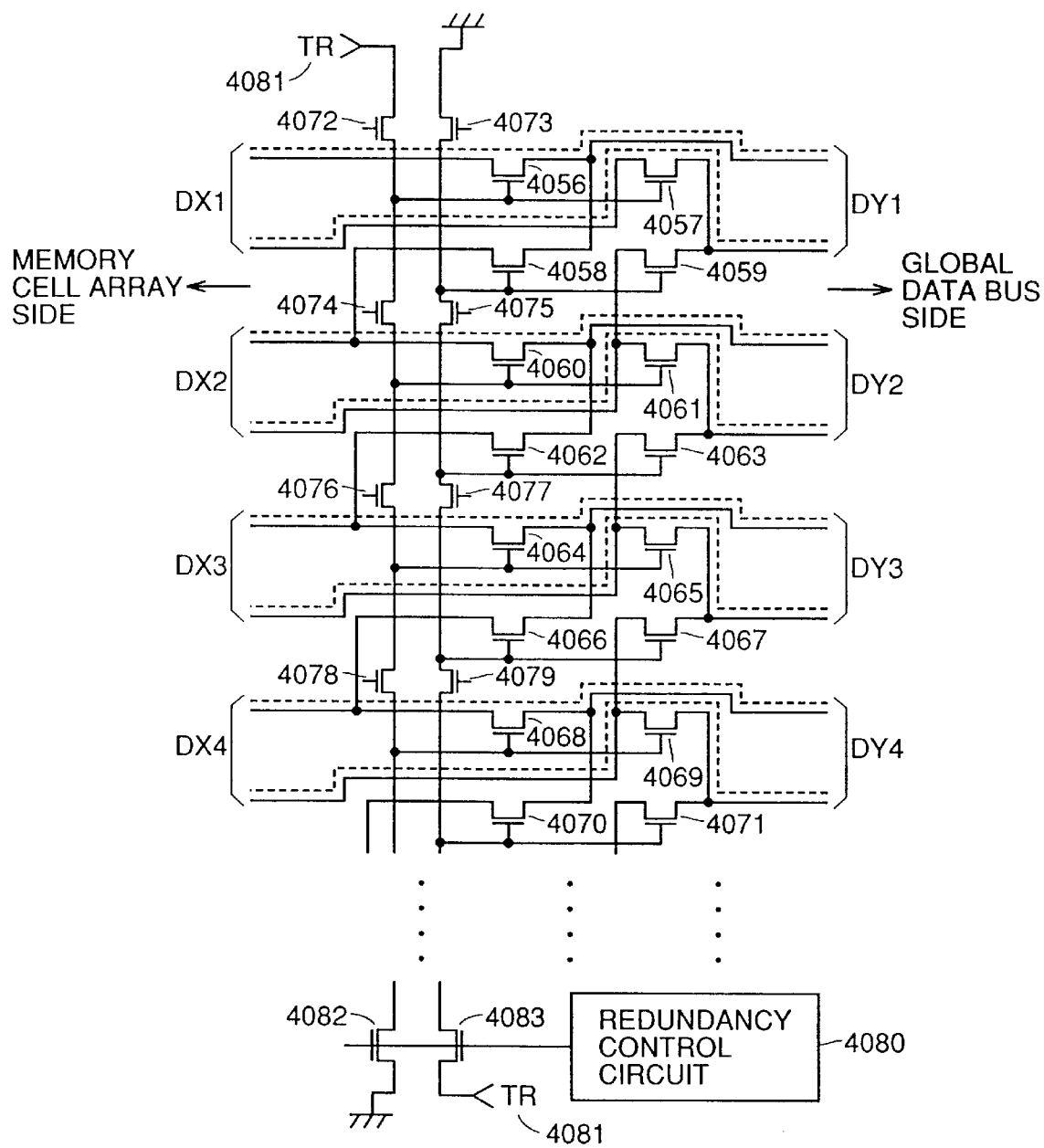
FIG. 32 illustrates an exemplary structure of a shift part 5040.

Exemplary structures of the shift part are now described with reference to FIGS. 32 to 35. FIG. 32 illustrates an exemplary structure of the shift part 5040. In order to simplify the illustration, it is assumed that electric fuses are formed by NMOS transistors, and a shift operation between pairs of complementary data lines DX1 to DX4 (generically referred to as pairs of data lines DX) on a memory cell array side and pairs of complementary data lines DY1 to DY4 (generically referred to as pairs of data lines DY) on a global data bus side is described.

Before repair, or there is no need for repair, initial connection (the pairs of data lines DX and the pairs of data lines DY are connected in one-to-one correspondence) is maintained. Electric fuses 4072, 4074, 4076 and 4078 are serially connected between a node 4081 receiving a signal TR and a ground potential. Electric fuses 4073, 4075, 4077 and 4079 are serially connected between a node 4081 receiving the signal TR and a power supply potential.

In shifting by redundancy, the signal TR goes high and a current flows through transistors 4082 and 4083 controlled by a redundancy control circuit 4080. The redundancy control circuit 4080 outputs a signal for turning on/off the electric fuses 4072 to 4079 on the basis of the spare determination result in the program part 20, the repair address and the bank address.

When the electric fuses are in ON states (not disconnected), a wire connecting the electric fuses 4072, 4074, 4076 and 4078 is at the ground potential GND and a wire connecting the electric fuses 4073, 4075, 4077 and 4079 goes high. Thus, the connection state shown in FIG. 32 is maintained in response to the states of transistors 4056 to 4071. For example, the transistors 4056 and 4057 are turned on to connect the pair of data lines DX1 on the memory cell array side and the pair of data lines DY1 on the global data bus side. The transistors 4058 and 4059 are in OFF states to cut off connection between the pair of data lines DX2 and the pair of data lines DY1.

Figure 33:
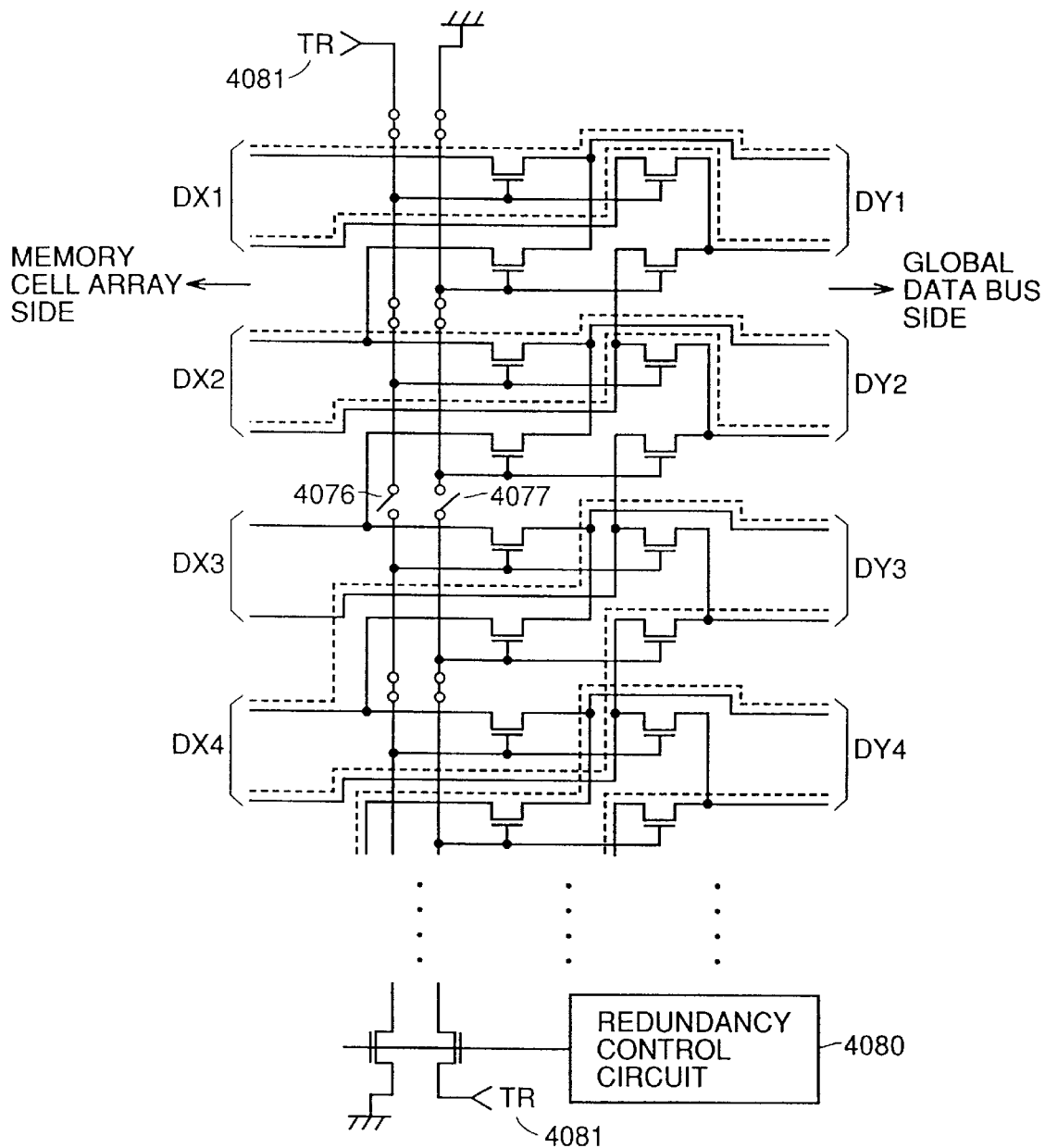
FIG. 33 illustrates a structure for repairing a faulty memory cell column.

FIG. 33 is a diagram showing a structure for performing repair in the case where a faulty memory cell column is present. FIG. 33 shows electric fuses in the form of switches, for the purpose of simplification. For the faulty memory cell column, a pair of data lines DX2 corresponding to the faulty portion are disconnected from a pair of data lines DY. In this case, electric fuses 4076 and 4077 are turned off. Thus, data lines DX3 are electrically disconnected from every pair of data lines DY. In substitution, structure change shifting the connection upward by one stage is performed. In other words, a pair of data lines DX4 are connected with a pair of data lines DY3.

Figure 34:
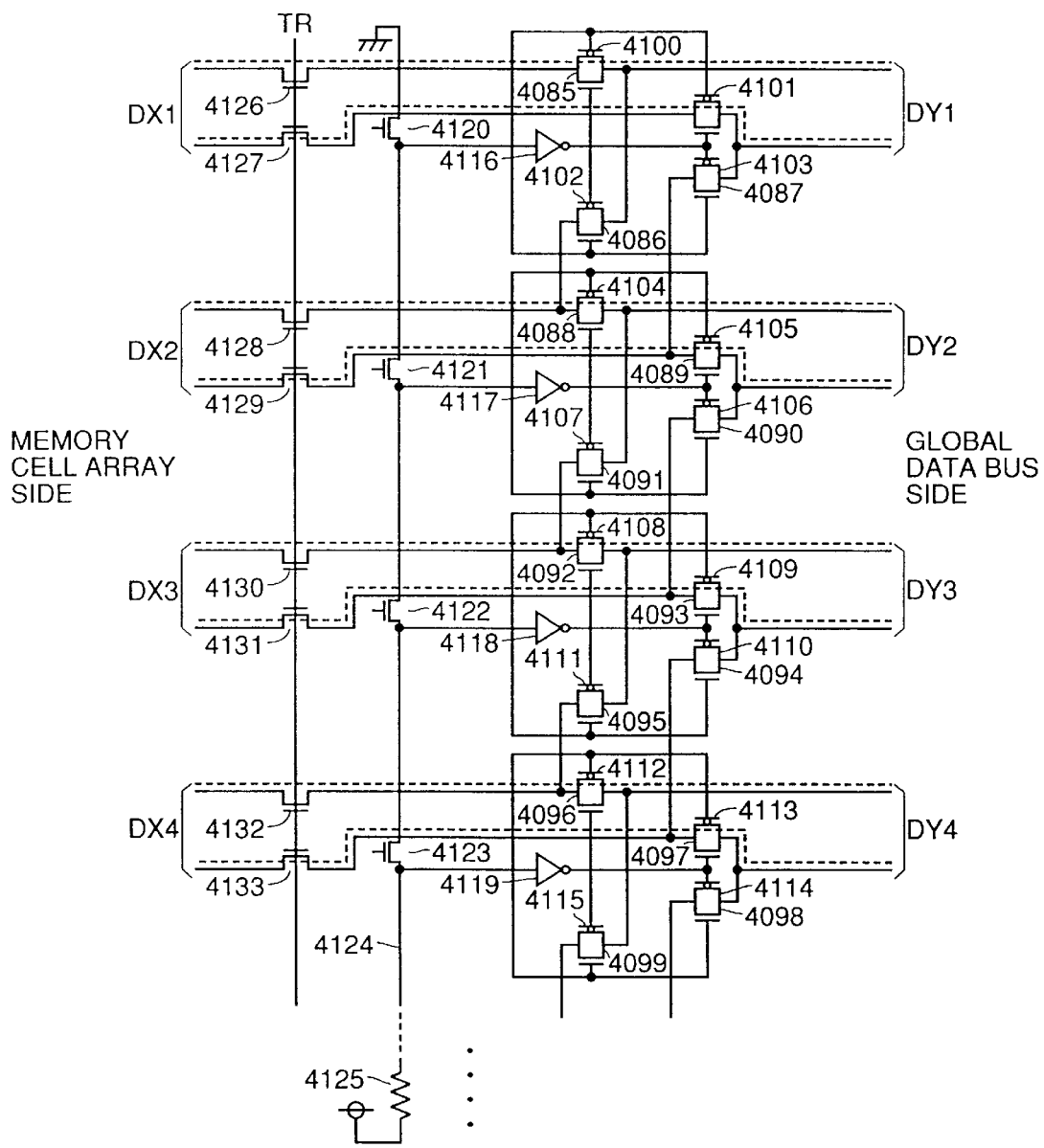
FIG. 34 illustrates another exemplary structure of the shift part 5040.

FIG. 34 shows another exemplary structure of the shift part 5040. Referring to FIG. 34, transfer gates connecting pairs of data lines are formed by pairs of NMOS transistors and PMOS transistors, thereby aligning electric fuses 4120, 4121, 4122 and 4123 with each other. A redundancy control circuit 4080 (not shown) controls ON/OFF states of the electric fuses 4120 to 4123.

As shown in FIG. 34, a resistive element 4125 is arranged in place of the redundancy control circuit 4080 for performing current limitation. Further, transfer gates 4085 to 4115 of a connection part are formed by CMOS transistors, thereby reducing resistance of the pairs of data lines.

Figure 35:
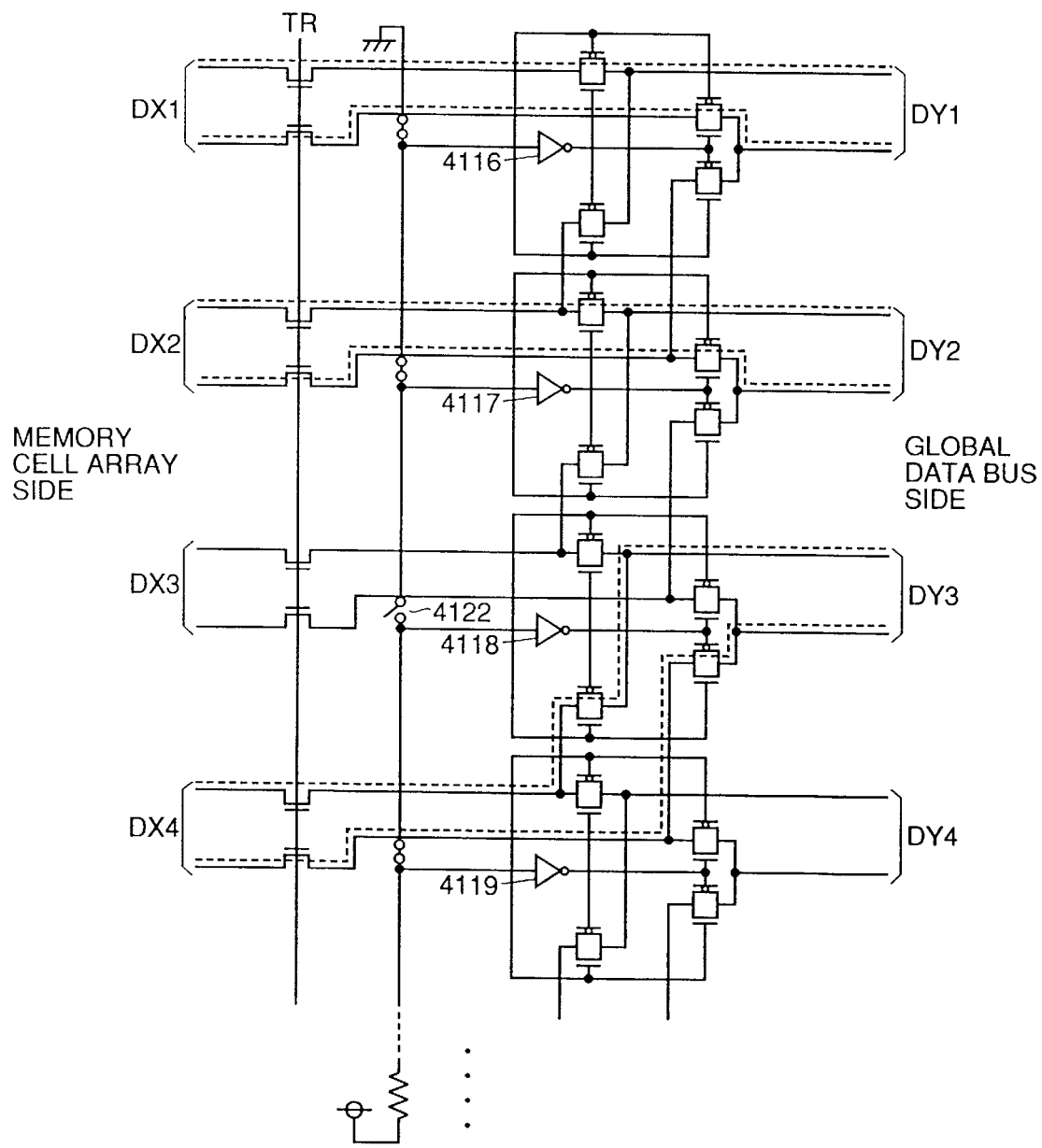
FIG. 35 illustrates a state turning off an electric fuse 4122 in FIG. 34.

FIG. 35 shows such a state that the electric fuse 4122 is turned off in FIG. 34. FIG. 35 shows the electric fuses in the form of switches, for the purpose of simplification. Thus, the data lines DX3 are electrically disconnected from every pair of data lines DY. In substitution, structure change shifting the connection upward by one stage is performed. In other words, the pair of data lines DX4 are connected with the pair of data lines DY3.

The structures shown in FIGS. 32 to 35 are also applicable to the shift register 148 described with reference to the first embodiment.

Figure 36:
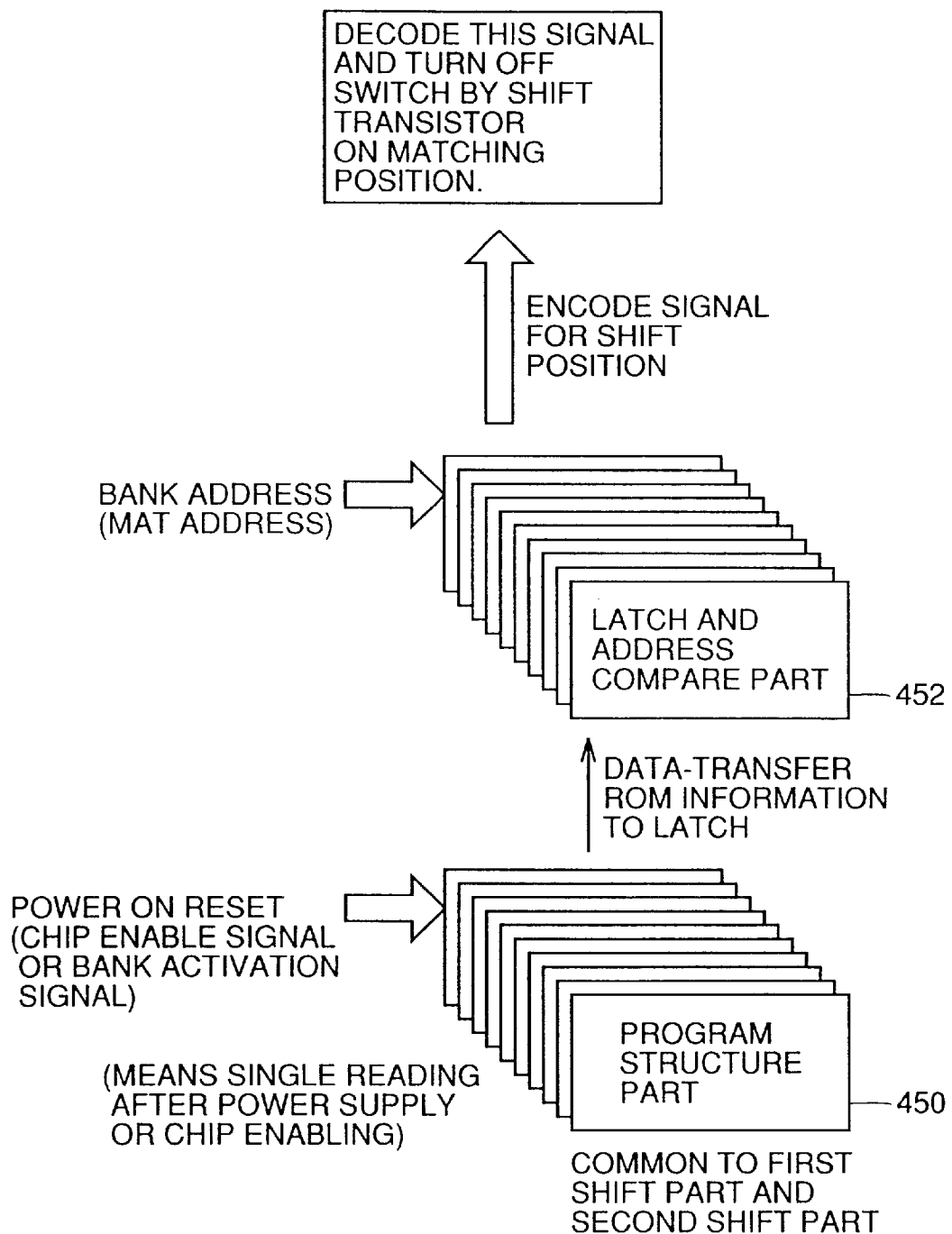
FIG. 36 is a diagram for illustrating control of shift parts in a multi-bank structure.

Control for dynamically changing connection in a multibank structure is described with reference to FIG. 36. FIG. 36 is a diagram for illustrating control of a shift part in the multi-bank structure. In the case of the multi-bank (multimat) structure, I/O lines are arranged over other banks (mats). When repaired I/O lines vary with the banks (mats), therefore, shift relation (connection mode) in the shift part must be changed. In accordance with an input bank address (mat address), therefore, shift information for a first shift part and that for a second shift part are changed.

The shift information (program information) for the first shift part and the second shift part is stored in a common program structure part 450. The program structure part 450 may be identical in basic structure to the program structure part 22. The shift information is read after power supply or chip enabling, and transferred to and latched in a latch and address compare part 452. The information is transferred between a point when power on reset (a chip enable signal or a bank activation signal) is generated and a column operation requiring comparison. The latch and address compare part 452 may be basically identical in structure to the latch part 24 and the address compare part 26.

As described above, the programming element programming the repair address may have any structure such as that of a nonvolatile memory employing a ferroelectric film or a nonvolatile RAM structure with a flash ROM or the like.

The information may be transferred to the latch part in parallel or serially transferred through a shift register.

When transferring the information through the shift register, the latch part of the address compare part is also included in the shift register. Thus, the transfer operation is simplified. A transfer clock may be internally generated from a ring oscillator having a proper cycle, or may be generated on the basis of an external clock.

The address compare part compares the bank address (mat address) with transferred ROM information, and outputs repair information in accordance with a result of match/mismatch. The repair information is output as an encode signal prepared by encoding a shift portion, and this signal is further decoded to change the shift state. At this time, electric fuses in the shift part are formed by MOS transistors as described above. The decode signal ON-OFF controls the MOS transistors which are switches.

While the above description has been made with reference to the first shift part, the second shift part basically has the same structure. The difference resides in a point that the spare I/O part is switchable upward as well as downward. In order to satisfy this, if all encode signals of shift portions above spare I/O lines S-I/OA are at low levels, immediate leftward connection is maintained while the connection is shifted also downward. When all encode signals of shift portions under the spare I/O lines S-I/OB are at low levels, immediate leftward connection is maintained while the connection is shifted also upward.

Fourth Embodiment

In relation to a fourth embodiment of the present invention, an exemplary improvement of a program part is described. Depending on the layout, positions of a program structure part 22, a latch part 24 and an address compare part 26 may be separated from that of a redundancy control part (e.g., a redundancy control circuit 4080) controlling replacement by spare determination. Further, the position of the program structure part 22 may be separated from those of the latch part 24, the address compare part 26 and the redundancy control part. In any case, the number of wires increases if a plurality of spares are present, leading to reduction of processing efficiency. Exemplary structures for solving this problem are described with reference to FIGS. 37 to 39.

Figure 37:
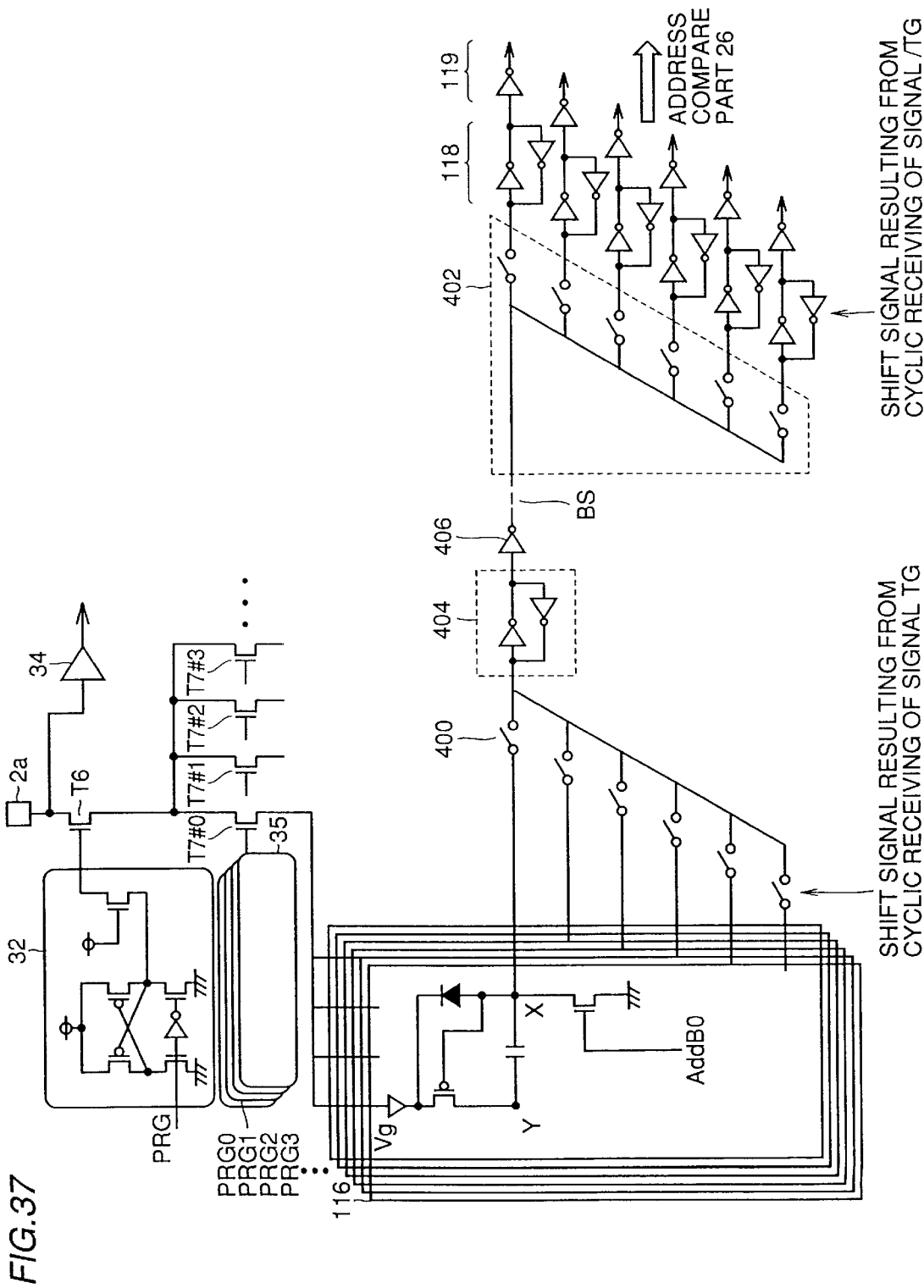
FIG. 37 is a diagram for illustrating an exemplary structure of a program part in a fourth embodiment of the present invention.

An exemplary structure for the program structure part 22 and the latch part 24 physically separated from each other is described with reference to FIG. 37. In this case, multiplexers are arranged thereby reducing the number of wires connecting program structure parts and latch parts. Referring to FIG. 37, switches 400 are arranged in correspondence to program structure circuits 116 respectively. The switches 400 sequentially open/close in accordance with a transfer signal TG. The switches 400 serve as the multiplexers. The switches 400 are connected with a latch 404. An output of the latch 404 is transferred to a bus BS through an invertor 406.

Switches 402, latches 118 and invertors 119 corresponding to the program structure circuits 116 respectively are arranged on the end point of the bus BS. The switches 402 sequentially open/close in accordance with a transfer signal /TG. The transfer signals /TG and TG are out of phase to each other (i.e., when one of the signals /TG and TG goes high, the other one goes low). Each latch 118 (forming a latch part 24) receives program information from the switch 402. An address compare part 26 (not shown) receives an output of the latch 118 through the invertor 119.

When the transfer signal TG goes high, the respective switches 400 on the sending end are sequentially turned on. Thus, read program information is sequentially latched in the latches 404. The program information is sequentially sent to the receiving end through the bus BS. When the transfer signal TG goes low (the transfer signal /TG goes high), the respective switches 402 on the receiving end are sequentially turned on. Thus, the program information is latched in the corresponding latches 118. On the basis of this, address comparison is performed.

Figure 38:
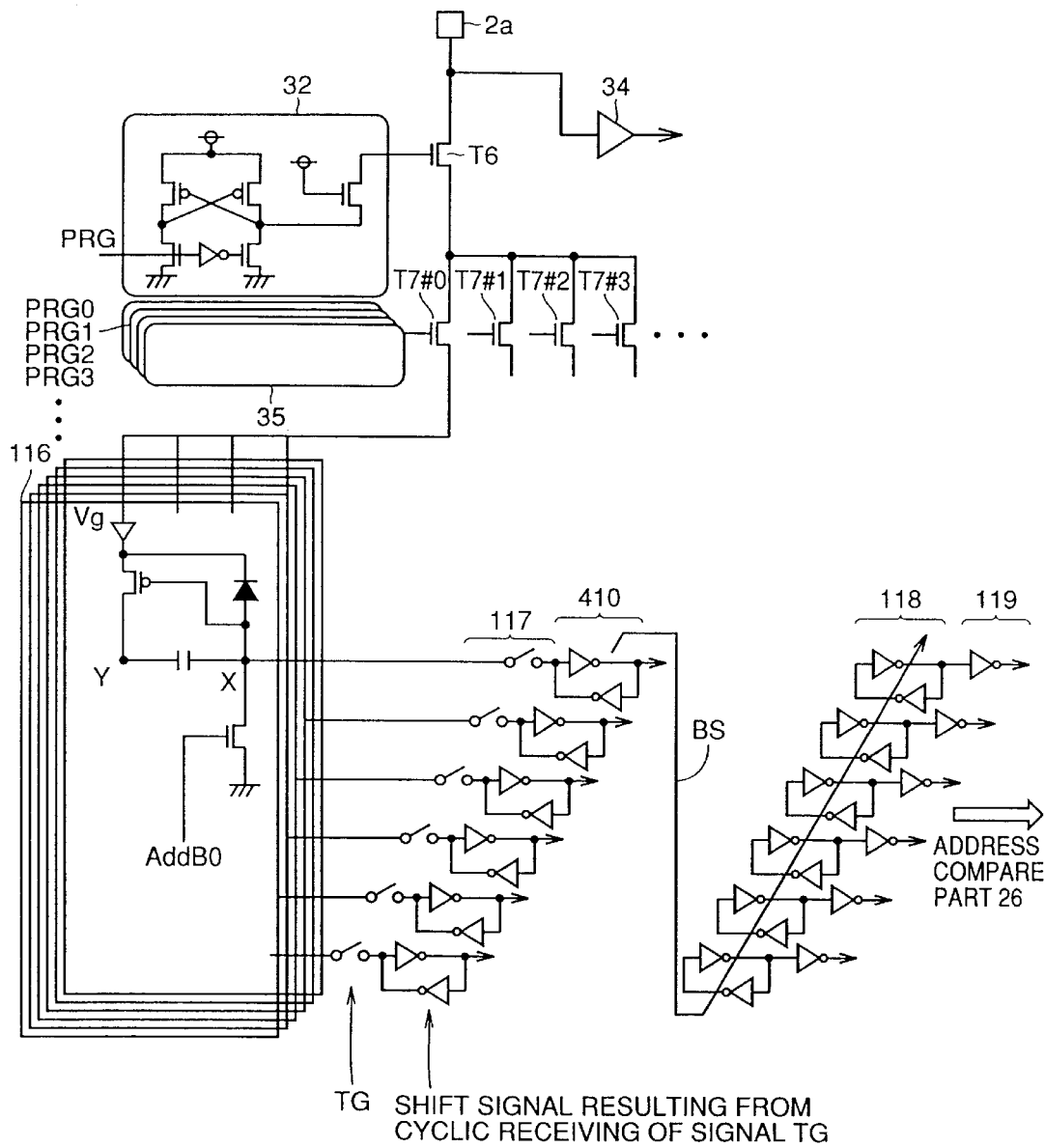
FIGS. 38 and 39 are diagrams for illustrating exemplary structures of the program part in the fourth embodiment of the present invention.

Another exemplary structure for the program structure part 22 and the latch part 24 physically separated from each other is described with reference to FIG. 38. In this case, a shift register is arranged thereby reducing the number of wires connecting the program structure part 22 and the latch part 24. Referring to FIG. 38, latches 410 are provided for switches 117 arranged for program structure circuits 116 respectively. The switches 117 open/close in accordance with a transfer signal TG. The respective latches 410 sequentially latches outputs of the corresponding switches 117 in accordance with the transfer signal TG.

Latches 118 and invertors 119 are arranged on the end point of a bus BS in correspondence to the program structure circuits 116 respectively. An address compare part 26 (not shown) receives outputs of the latches 118 through the invertors 119.

When the transfer signal TG goes high, the respective switches 117 on the sending end are turned on. Read program information is sequentially latched in the latches 410. The program information is sequentially sent to the receiving end through the bus. Thus, the program information is latched in the latches 118 respectively. Address comparison is performed on the basis of this.

Referring to FIG. 38, a latch train formed by the latches 410 and that formed by the latches 118 form shift registers (not shown) in the direction of the bus BS.

Figure 39:
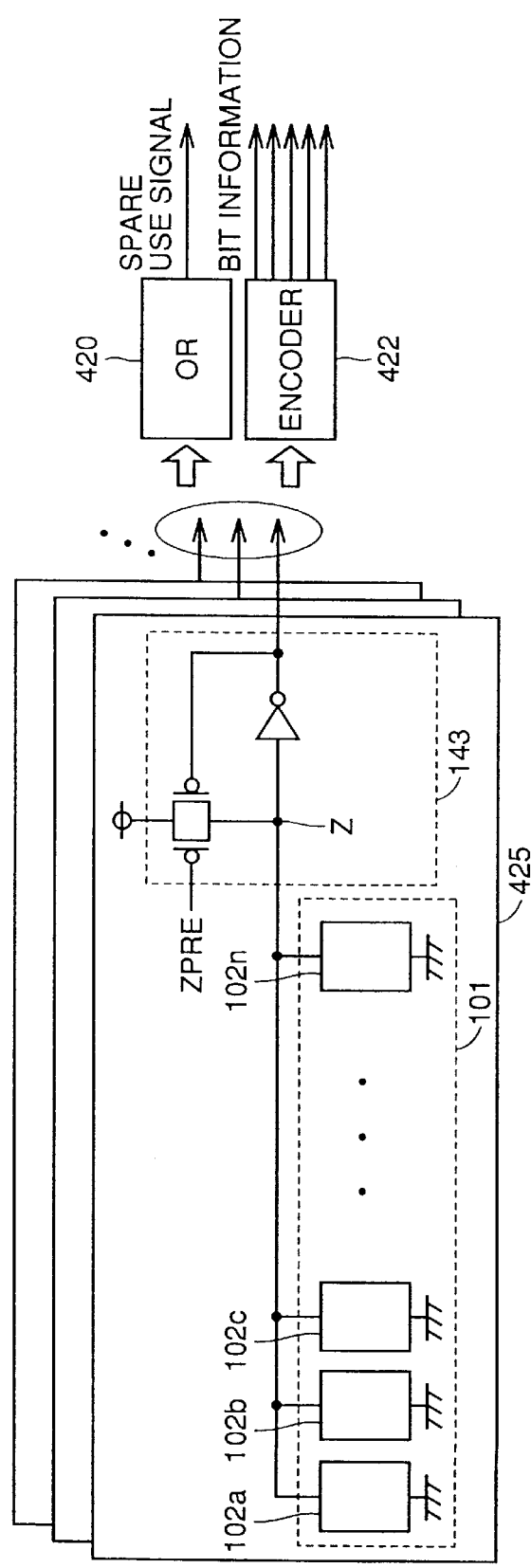

An exemplary structure for the address compare part 26 and the redundancy control part receiving the spare determination result physically separated from each other is described with reference to FIG. 39. The following description is made with reference to program blocks 425 formed by program units 101 and holding circuits 125.

It is assumed that the number of the program blocks is the N-th power of two. An OR circuit 420 receives a spare determination result output from each program block. The OR circuit 420 outputs a spare use signal. The spare use signal is activated when receiving at least one spare determination result of an active state. The spare use signal is transmitted to a redundancy control circuit through a single signal line.

An encoder 422 converts spare position information to bit information (N bits). Exemplary spare position information is switching information (information related to the ON/OFF state of each electric fuse) in the aforementioned shift part. The bit information is transmitted to the redundancy control circuit through N signal lines. The redundancy control circuit receiving comparison results decodes the bit information.

Thus, it follows that spare information is transmitted through (N+1) signal lines. The structures shown in FIGS. 37 to 39 are also applicable to column direction spares.

Fifth Embodiment

Figure 40:
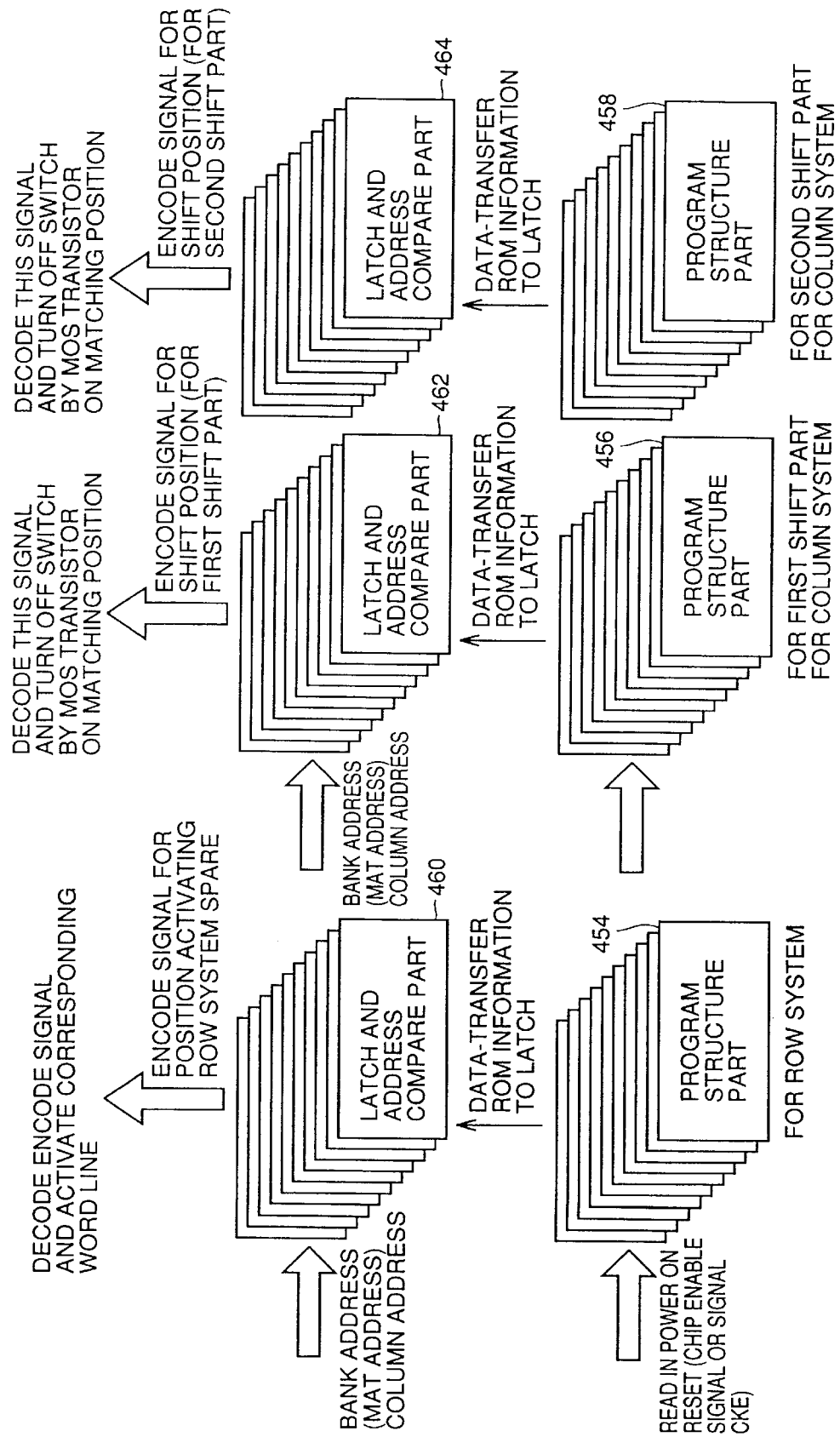
FIG. 40 is a diagram for illustrating an exemplary set path for spare replacement information in a fifth embodiment of the present invention.

In a fifth embodiment of the present invention, set paths for spare information of a row system and a column system are described with reference to FIG. 40. The basic structure is identical to that described with reference to the first embodiment. FIG. 40 shows the relation between replacement by a spare row part and replacement of the column system through a shift part.

A program structure part 454 stores program information for the row system as ROM information. The program structure part 454 may be basically identical in structure to the program structure part 22. More specifically, an electric fuse of the program structure part 454 is blown on the basis of a repair row address of the row system (the ROM information may be stored by laser blowing).

Similarly, a program structure part 456 stores program information for the column system, i.e., shift information for a first shift part as ROM information, and a program structure part 458 stores shift information for a second shift part as ROM information. The program structure parts 456 and 458 may be basically identical in structure to the program structure part 22. More specifically, electric fuses of the program structure parts 456 and 458 are blown on the basis of the shift information (repair column address) (the ROM information may be stored by laser blowing).

The row-system ROM information in the program structure part 454 is read before a row cycle. More specifically, the row-system ROM information in the program structure part 454 is read in power on reset (when a chip enable signal or a clock enable signal CKE is activated to a high level or the like) and transferred to a corresponding latch and address compare part 460. At this time, program information stored in all program structure parts 454 is transferred.

The latch and address compare part 460 compares the transferred ROM information with a bank address (or a mat address) and a row address, and encodes and outputs a result of match/mismatch. The latch and address compare part 460 may be basically identical in structure to the latch part 24 and the address compare part 26. The encode signal is decoded. A corresponding spare word line is activated on the basis of the decode signal.

On the other hand, the ROM information (shift information) for the column system in the program structure parts 456 and 458 is read when the row cycle is started and transferred to the latch and address compare parts 462 and 464 corresponding to the column system. The corresponding latch and address compare parts 462 and 464 compare the bank address (or the mat address) and a column address with the transferred ROM information and encode and output results of match/mismatch. The encode signals for the first shift part and the second shift part are decoded respectively. The corresponding switch is turned off on the basis of the decode signals. By reading the program information related to the row system and thereafter reading the program information related to the column system, current consumption can be reduced. The latch and address compare parts 462 and 464 may be basically identical in structure to the latch part 24 and the address compare part 26.

Figure 41:
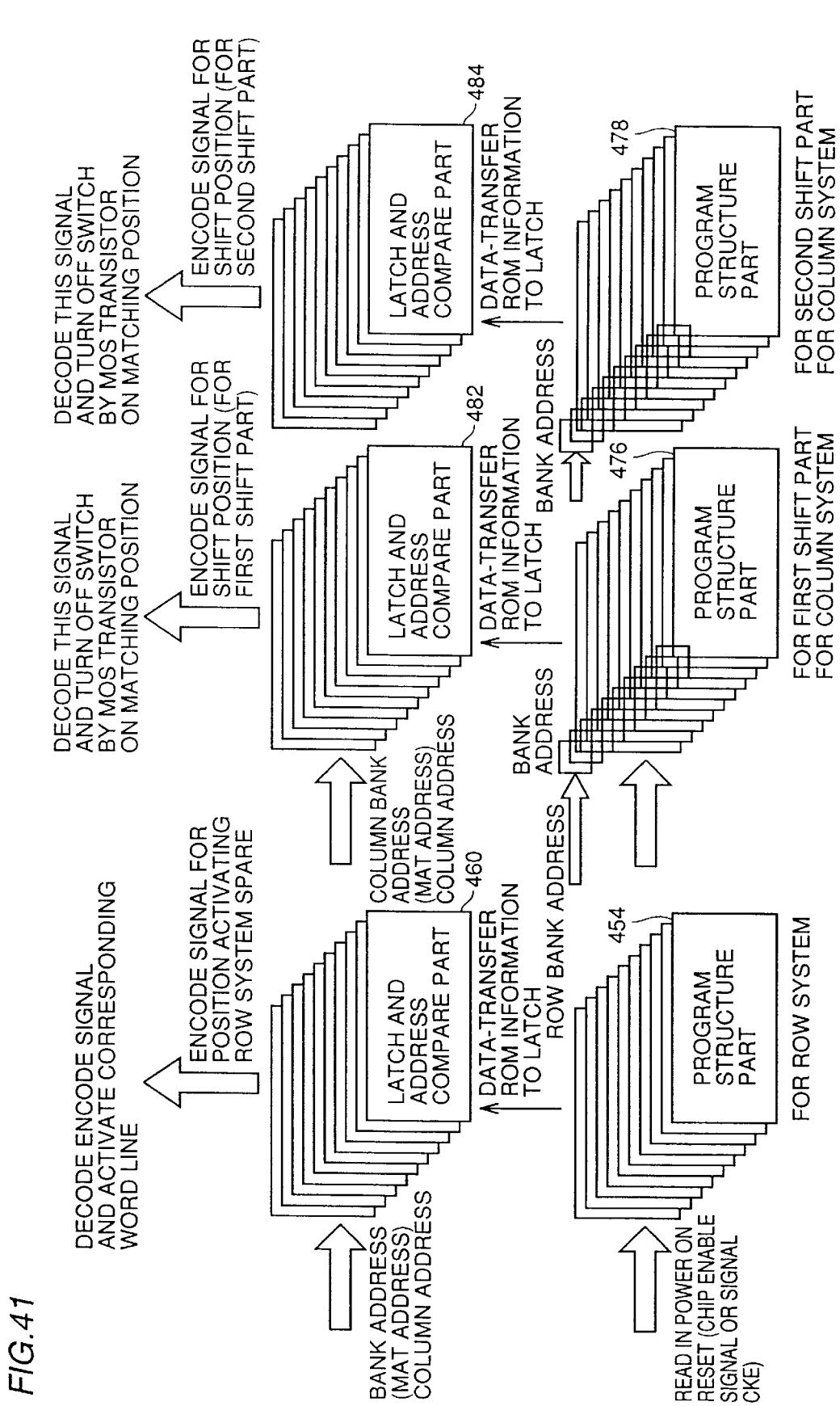
FIG. 41 is a diagram for illustrating another exemplary set path for spare replacement information in the fifth embodiment of the present invention.

Another exemplary setting of spare replacement information according to the fifth embodiment of the present invention is now described with reference to FIG. 41. The example shown in FIG. 41 is different from that shown in FIG. 40 in a point that a program structure part 476 stores shift information for a first shift part as ROM information and a program structure part 478 stores shift information for a second shift part as ROM information. The program structure part 476 has a part (corresponding to the program structure part 22) storing the shift information for the first shift part and a part storing a flag indicating a bank. The program structure part 478 has a part (corresponding to the program structure part 22) storing the shift information for the second shift part and a part storing the flag indicating the bank.

Thus, in bank activation, only program information for an activated bank is read from the program structure part 476 and transferred to a corresponding latch and address compare part 482 while only the program information for the activated bank is read from the program structure part 487 and transferred to a corresponding latch and address compare part 484.

ROM information for a row system stored in a program structure part 454 is read in power on reset and transferred to a corresponding latch and address compare part 460. As described above, the address compare part 460 corresponding to the row system performs comparison and encodes and outputs a result of match/mismatch. The encode signal is decoded. A corresponding spare word line is activated on the basis of the decode signal.

On the other hand, ROM information (shift information) for a column system stored in the program structure parts 476 and 478 is read on the basis of an activated bank address (row bank address) in the row direction when a row cycle is started. The read ROM information is transferred to the latch and address compare parts 482 and 484 corresponding to the column system. The latch and address compare part 482 compares a bank address (or a mat address) in the column direction and a column address with the transferred ROM information, and encodes and outputs a result of match/mismatch. The latch and address compare part 484 compares the bank address (or the mat address) in the column direction and the column address with the transferred ROM information, and encodes and outputs the result of match/mismatch. The encode signals for the first shift part and the second shift part are decoded respectively. The corresponding switch is turned off on the basis of the decode signals.

By employing the aforementioned structure, unnecessary program information may not be read in both of the row system and the column system but a current and a processing time can be reduced. In particular, structures (including the latch and address compare parts 482 and 484) following the latch and address compare parts 482 and 484 may be shared by a plurality of banks, whereby the structures following the latch parts 482 and 484 can be reduced with respect to the number of the program structure parts 476 and 478.

Sixth Embodiment

An exemplary improvement as to comparison of a repair address and an input address according to a sixth embodiment of the present invention is described. When a time related to column access is reduced, the ratio of an address comparison determination time occupying the column access time increases. An exemplary improvement of address comparison determination is described with reference to FIGS. 42 and 43.

Figure 42:
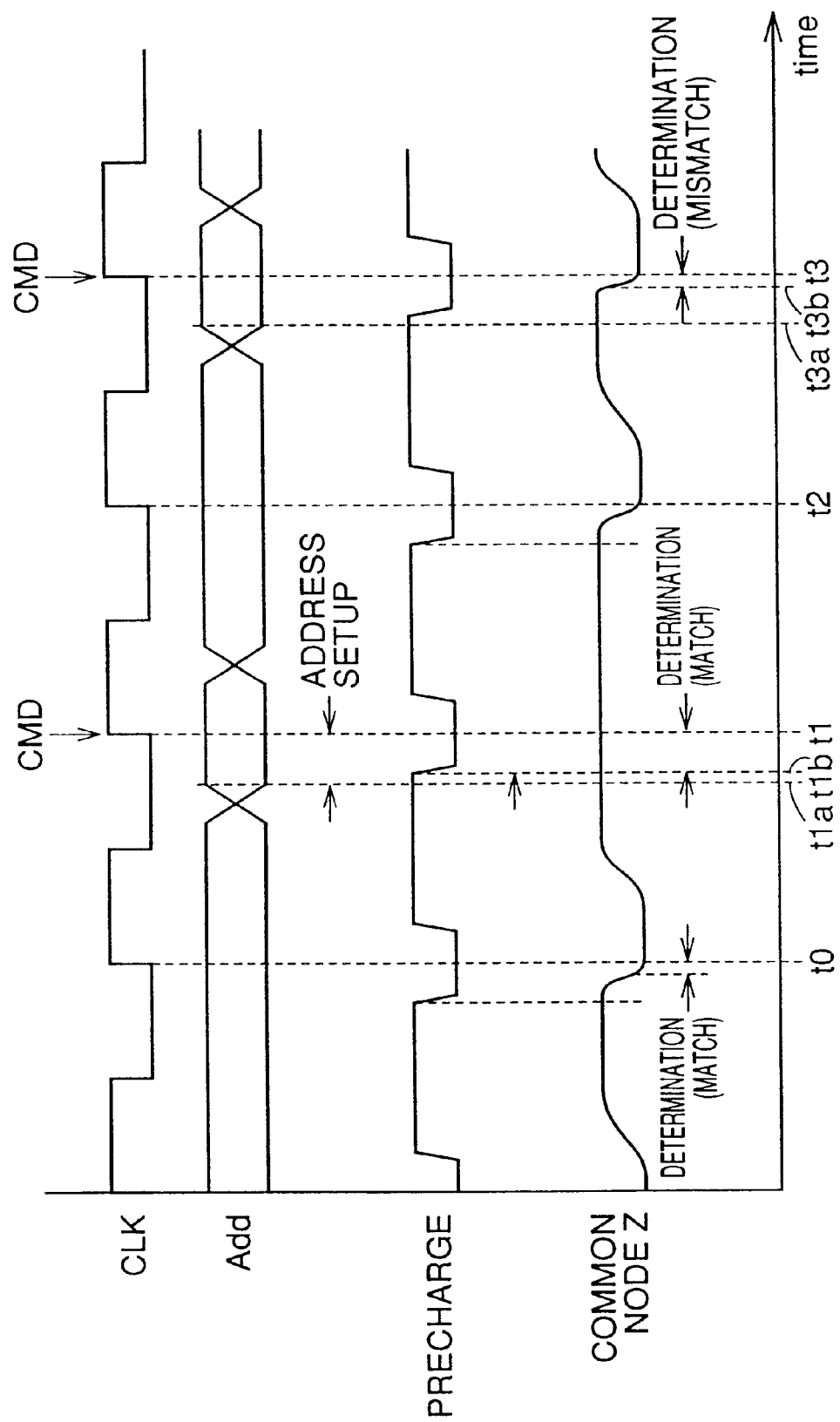
FIG. 42 is a flow chart for illustrating exemplary operations of address compare determination in a sixth embodiment of the present invention.

Referring to FIG. 42, a clock signal CLK is input at times t0, t1, t2 and t3. A common node Z in a program part is precharged at the input timings of the clock signal CLK. Addresses are compared/determined in address setup periods. For example, an address signal Add is input at a time t1a (t1a<t1). Address comparison determination (match) is made in a period t1b to t1 (t1a<t1b<t1) of the address setup period (t1a to t1). Similarly, the address signal Add is input at a time t3a (t3a<t3). Address comparison determination (match) is made at a time t3b to t3 (t3a<t3b<t3) in the address setup period (t3a to t3). Referring to FIG. 42, a command CMD is fetched every second cycle (times t1 and t3). An address comparison determination result at the point when the command CMD is input is regarded as effective, and subsequent operations are performed in response to the address comparison determination result. Therefore, spare determination results at the times t1 and t3 are regarded as effective, while that at the time t0 is regarded as invalid.

Figure 43:
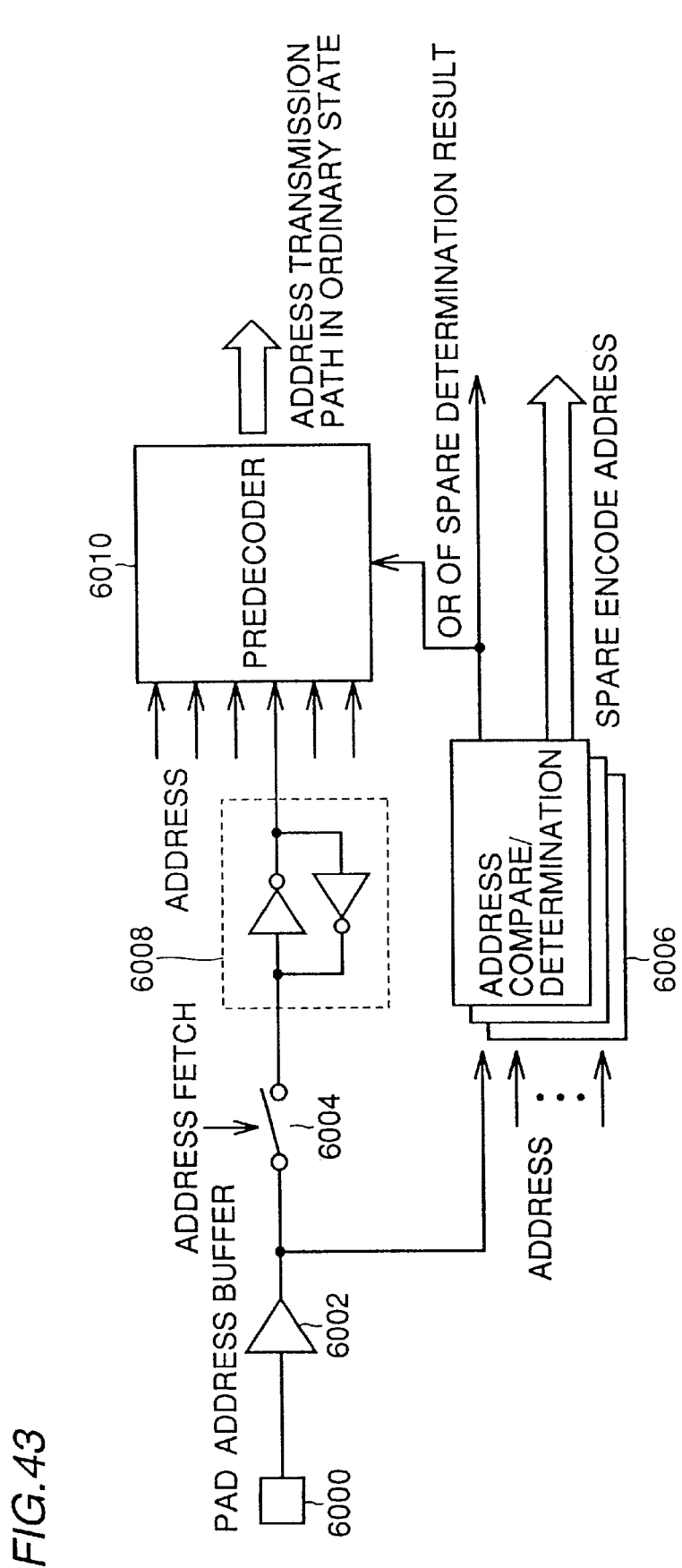
FIG. 43 is a block diagram corresponding to FIG. 42.

Referring to FIG. 43, the input address Add received in a pad 6000 is transmitted to an address fetch switch 6002 and a program part 6006 through an address buffer 6002. The program part 6006 compares/determines the address. The aforementioned OR circuit 420 outputs the OR (spare use signal) of the spare determination result. An encoder 422 outputs a corresponding spare encode address on the basis of the spare determination result.

A switch 6004 is closed so that a latch 6008 latches the fetched input address. A predecoder 6010 decodes the latched input address. The predecoder 6010 stops its operation on the basis of the OR of the spare determination result.

Specifically, the program part 6006 has a similar structure to the program part 20 including the program structure part 22, the latch part 24 and the address compare part 26. In this case, the predecoder 6010 is similar in structure to the predecoders 9, 10 and 11 of the first embodiment, and connected to decoders 13 and 14 similarly to the first embodiment.

When a repair address matches with the input address Add, the predecoder 6010 stops its operation. On the basis of a spare encode address, a spare address corresponding to the input address is transmitted to an array part. When the repair address mismatches with the input address Add, on the other hand, the output of the predecoder 6010 is transmitted through a general address transmission path. In other words, the input address is transmitted to the array part.

Figure 44:
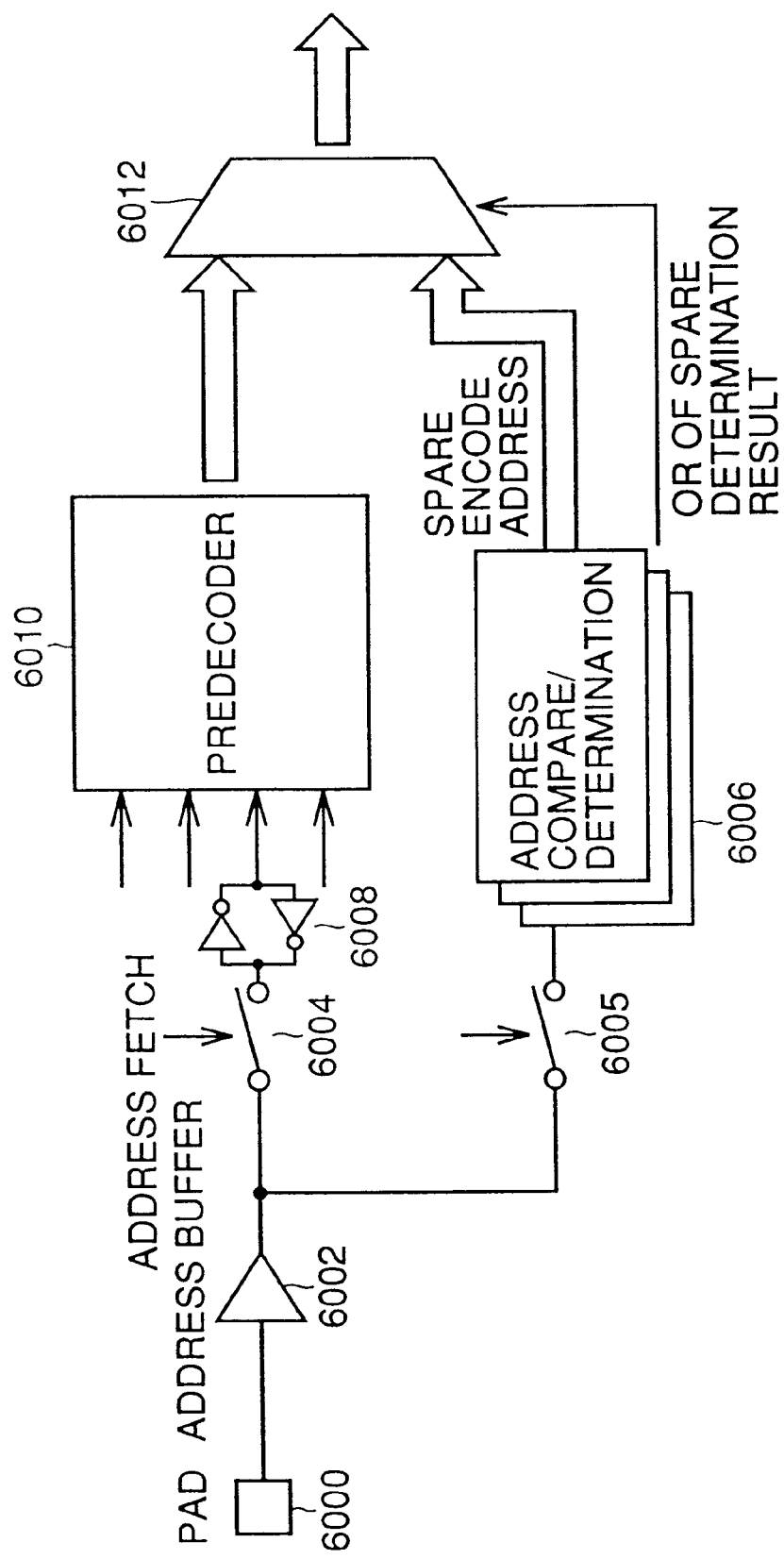
FIG. 44 is a diagram for illustrating a structure for address compare determination in the sixth embodiment of the present invention.

Another exemplary improvement of address comparison determination is described with reference to FIG. 44. A general address input system and a spare determination system are arranged in parallel. Referring to FIG. 44, an input address received in a pad 6000 is transmitted to address fetch switches 6004 and 6005 through an address buffer 6002. A program part 6006 receives the input address through the switch 6005 and compares/determines the address. The aforementioned OR circuit 420 outputs the OR of the spare determination result. The aforementioned encoder 422 outputs a corresponding spare encode address on the basis of the spare determination result.

The switch 6004 is so closed that a latch 6008 latches the fetched input address. A predecoder 6010 decodes the input address latched in the latch 6008.

An address transmission part 6012 selectively outputs an output of the predecoder 6010 or the spare encode address on the basis of the OR of the spare determination result. In the case of spare use (repair), a spare address corresponding to the input address is transmitted to an array part on the basis of the spare encode address. In the case of normal use, on the other hand, the output of the predecoder 6010 is transmitted through a general address transmission path. In other words, the input address is transmitted to the array part.

The array part causes no overhead of the access time since spare control is executed in the rear half of a read cycle in a read operation. In the case of a write operation, overhead is hidden by performing delayed writing.

Thus, spare determination is performed in parallel with a general address set operation, thereby guaranteeing a high-speed operation.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a program circuit for programming an internal state;
   a latch circuit for latching an output from said program circuit;
   a transfer gate provided between said program circuit and said latch circuit for transferring an output from said program circuit; and
   an internal circuit for performing an operation on an output from said latch circuit.
2. The semiconductor device according to claim 1, wherein
   said transfer gate is temporarily turned off in response to an transfer pulse.
3. The semiconductor device according to claim 2, wherein
   said transfer gate is turned off in synchronization with an input clock.
4. The semiconductor device according to claim 1, wherein
   said internal circuit determines match/mismatch of an input address and said output from said latch circuit.
5. The semiconductor device according to claim 1, comprising
   a plurality of said program circuits, and
   a plurality of said latch circuits, said plurality of latch circuits provided in correspondence with said plurality of program circuits, respectively, and
   said transfer gate sequentially transfers the outputs from said plurality of program circuits to said plurality of latch circuits.
6. The semiconductor device according to claim 5, wherein
   said transfer gate includes a plurality of first gates provided in correspondence with said plurality of program circuits and sequentially transferring the outputs from said plurality of program circuits.
7. The semiconductor device according to claim 6, further comprising a data bus receiving the outputs from said plurality of first gates, where
   said transfer gate further includes a plurality of second gates provided in correspondence with sail plurality of program circuits, respectively, and sequentially transferring a signal on said data bus to said plurality of said latch circuits.
8. The semiconductor device according to claim 1, comprising a plurality of said latch circuits performing a shift operation and sequentially transferring said output from said program circuit.
9. The semiconductor device according to claim 8, wherein said shift operation is performed in synchronization with an input clock.
10. The semiconductor device according to claim 9, further comprising a plurality of other latch circuits provided in correspondence with said plurality of latch circuits, respectively, and latching data of said plurality of latch circuits, wherein
    said internal circuit receives said the outputs from said plurality of other latch circuits for said operation.
11. The semiconductor device according to claim 9, wherein
    said internal circuit determines match/mismatch of an input address and said output from said latch circuit.
12. The semiconductor device according to claim 1, further comprising a fix circuit for selectively rewriting said output from said latch circuit.
13. The semiconductor device according to claim 12, wherein said fix circuit includes:
    a switch circuit connecting an output node of said latch circuit to a power supply voltage node or a ground voltage node.

* * * * *